(12) United States Patent
Nakagawa et al.

(10) Patent No.: US 10,804,388 B2
(45) Date of Patent: Oct. 13, 2020

(54) SEMICONDUCTOR DEVICE

(71) Applicant: ROHM CO., LTD., Kyoto-shi, Kyoto (JP)

(72) Inventors: Minoru Nakagawa, Kyoto (JP); Seigo Mori, Kyoto (JP); Takui Sakaguchi, Kyoto (JP); Masatoshi Aketa, Kyoto (JP); Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 181 days.

(21) Appl. No.: 16/071,322

(22) PCT Filed: Jan. 16, 2017

(86) PCT No.: PCT/JP2017/001245
§ 371 (c)(1),
(2) Date: Jul. 19, 2018

(87) PCT Pub. No.: WO2017/126472
PCT Pub. Date: Jul. 27, 2017

(65) Prior Publication Data
US 2020/0098910 A1     Mar. 26, 2020

(30) Foreign Application Priority Data

Jan. 20, 2016  (JP) .................................. 2016-008834

(51) Int. Cl.
*H01L 29/78* (2006.01)
*H01L 29/16* (2006.01)
(Continued)

(52) U.S. Cl.
CPC ...... *H01L 29/7813* (2013.01); *H01L 29/1608* (2013.01); *H01L 29/401* (2013.01); *H01L 29/4236* (2013.01); *H01L 29/66734* (2013.01)

(58) Field of Classification Search
CPC ............... H01L 27/085; H01L 29/1095; H01L 29/1608; H01L 29/401; H01L 29/407;
(Continued)

(56) References Cited

U.S. PATENT DOCUMENTS 5,689,128 A * 11/1997 Hshieh ................ H01L 29/0878
257/331
6,445,037 B1 * 9/2002 Hshieh ................ H01L 29/0847
257/330
(Continued)

FOREIGN PATENT DOCUMENTS

JP    H07131004 A    5/1995
JP    2006086549 A   3/2006
(Continued)

OTHER PUBLICATIONS

International Search Report issued for International Patent Application No. PCT/JP2017/001245, dated Mar. 7, 2017, 5 pages including English translation.
(Continued)

*Primary Examiner* — Duy T Nguyen
(74) *Attorney, Agent, or Firm* — Hamre, Schumann, Mueller & Larson, P.C.

(57) ABSTRACT

A semiconductor device 1 includes a trench gate structure 6 formed in a surface layer portion of a first principal surface of a semiconductor layer. A source region 10 and a well region 11 are formed in a surface layer portion of the first principal surface of the semiconductor layer at a side of the trench gate structure 6. The well region 11 is formed in a region at a side of the second principal surface of the semiconductor layer with respect to the source region 10. A channel is formed along the trench gate structure 6 in a portion of the well region 11. A multilayer region 22 is formed in a region between the trench gate structure 6 and the source region 10 in the semiconductor layer. The mul-
(Continued)

tilayer region 22 has a p type impurity region 20 formed in the surface layer portion of the first principal surface of the semiconductor layer and an n type impurity region 21 formed in a side of the second principal surface of the semiconductor layer with respect to the second conductivity type impurity region 20.

17 Claims, 52 Drawing Sheets

(51) Int. Cl.
*H01L 29/40* (2006.01)
*H01L 29/423* (2006.01)
*H01L 29/66* (2006.01)

(58) Field of Classification Search
CPC ........... H01L 29/4236; H01L 29/66734; H01L 29/7395; H01L 29/7397; H01L 29/7802; H01L 29/7813; H01L 29/7832
USPC ........................................................ 257/288
See application file for complete search history.

(56) References Cited

U.S. PATENT DOCUMENTS

| | | | |
|---|---|---|---|
| 2004/0113202 A1* | 6/2004 | Kocon | H01L 29/407 257/330 |
| 2007/0108469 A1* | 5/2007 | Nakano | H01L 29/063 257/139 |
| 2011/0291110 A1* | 12/2011 | Suzuki | H01L 29/0878 257/77 |
| 2013/0334597 A1* | 12/2013 | Yamashita | H01L 29/42376 257/334 |
| 2016/0351665 A1 | 12/2016 | Sugimoto et al. | |

FOREIGN PATENT DOCUMENTS

| | | |
|---|---|---|
| JP | 2011159797 A | 8/2011 |
| JP | 2015095467 A | 5/2015 |
| JP | 2016225343 A | 12/2016 |

OTHER PUBLICATIONS

International Preliminary Report on Patentabilty issued for International Patent Application No. PCT/JP2017/001245, dated Aug. 2, 2018, 15 pages including English translation.

* cited by examiner

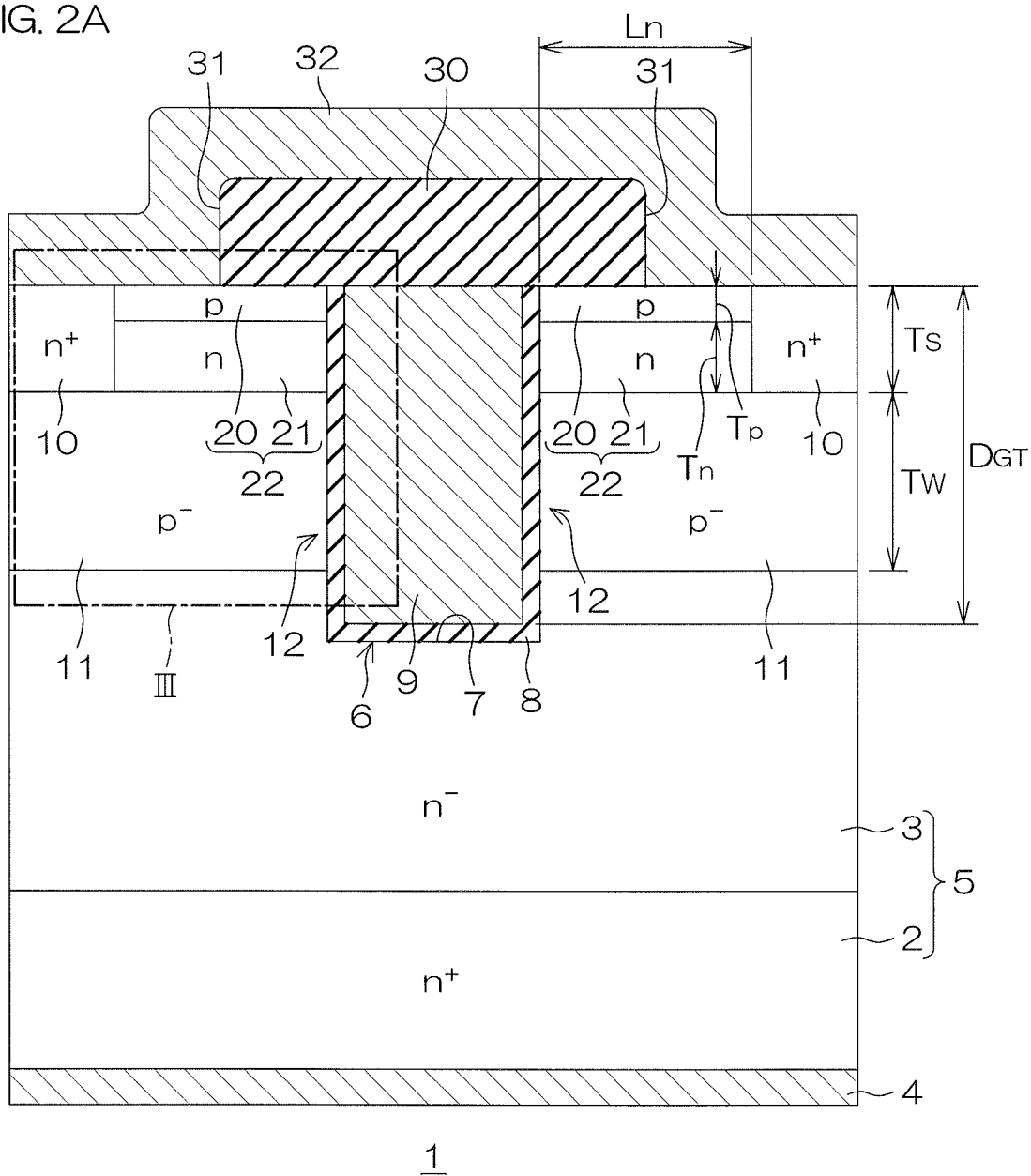

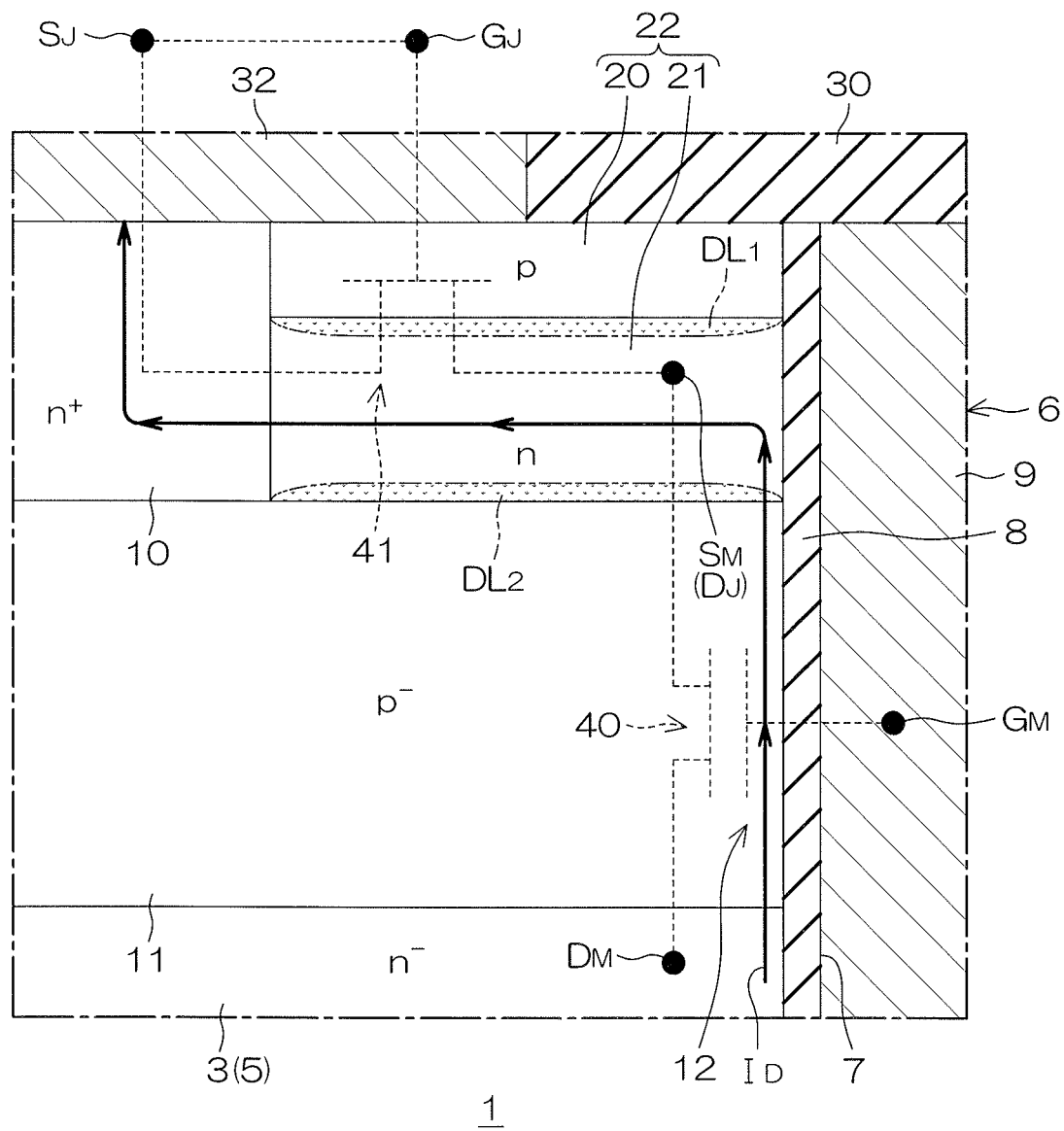

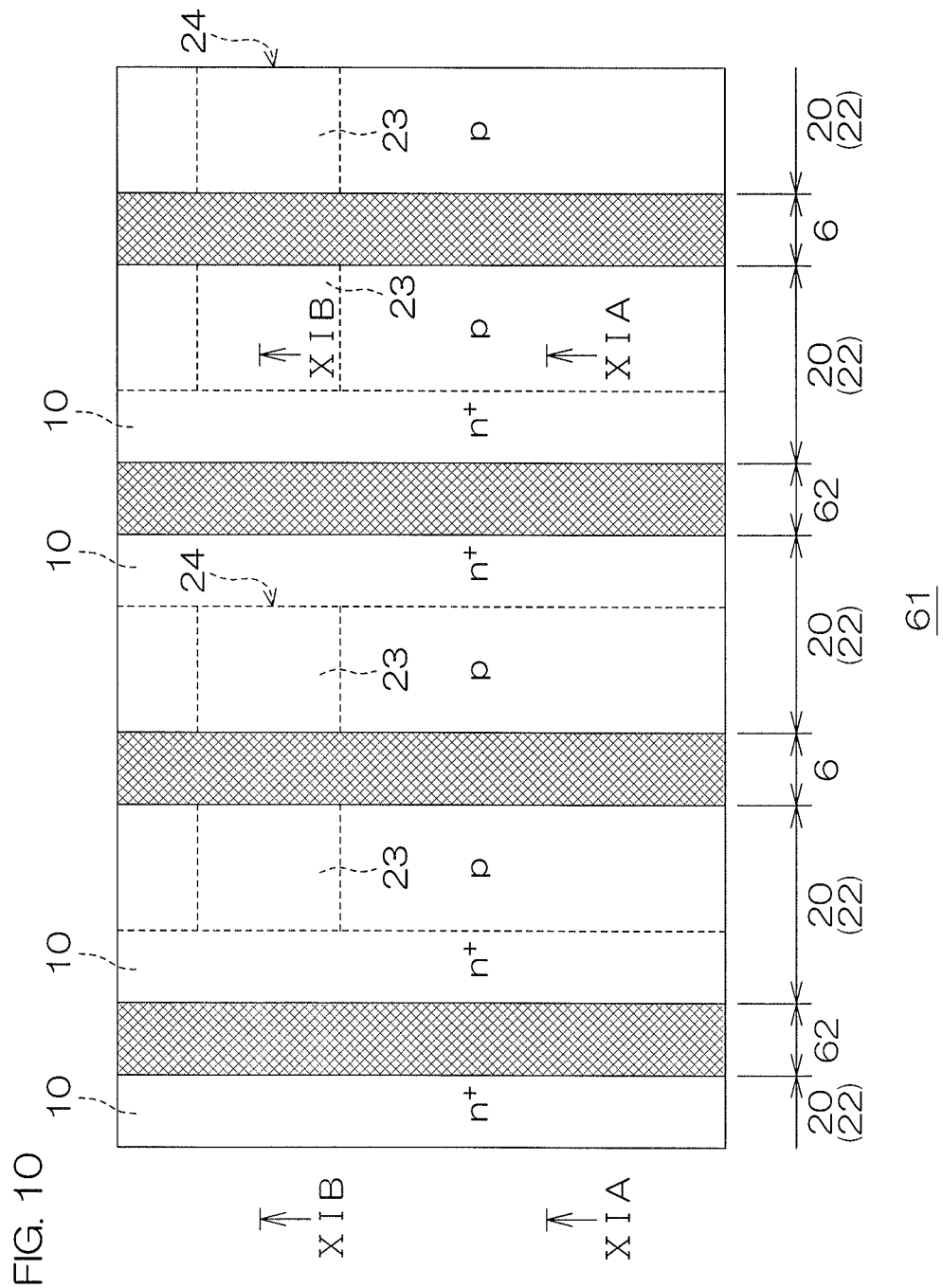

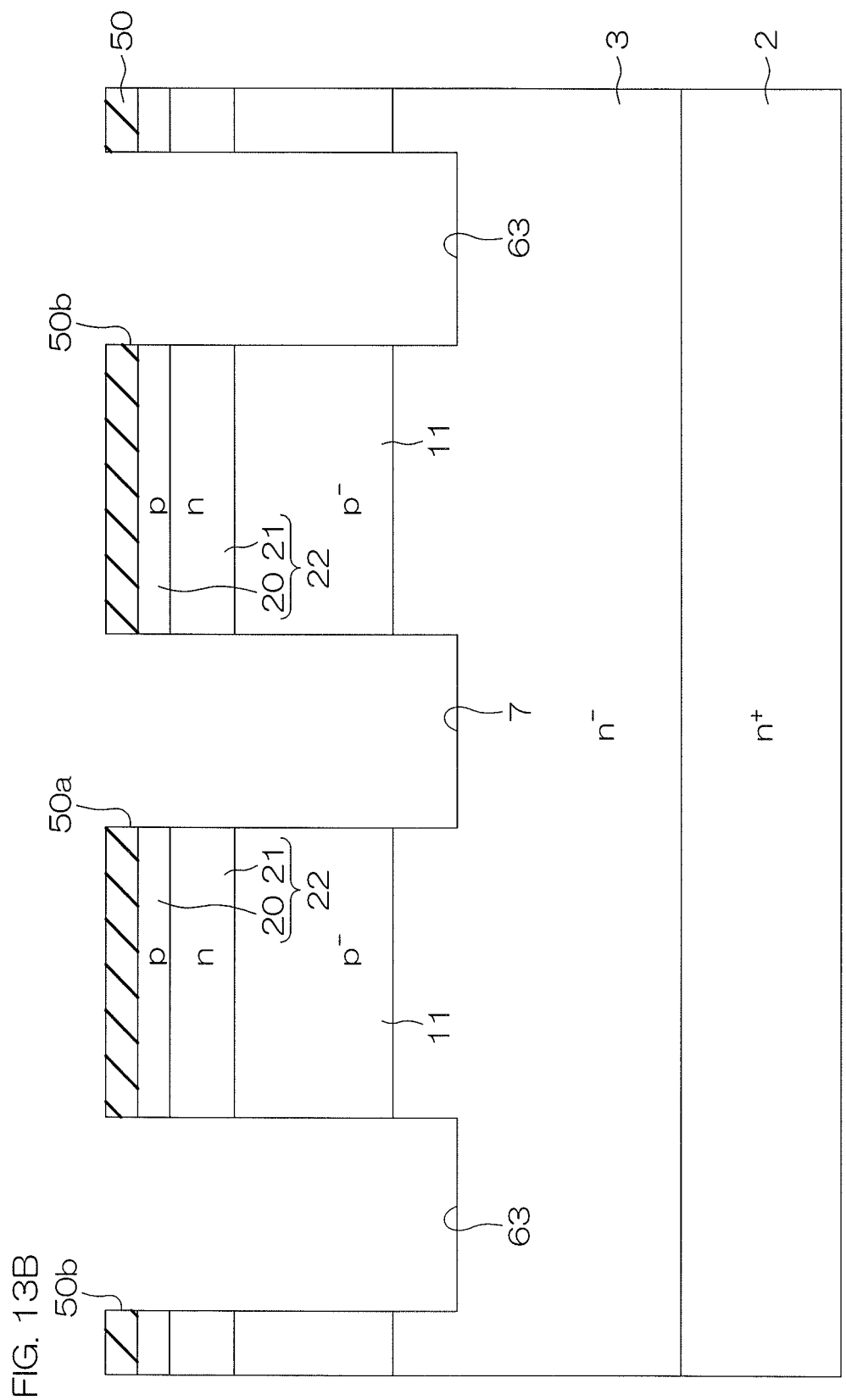

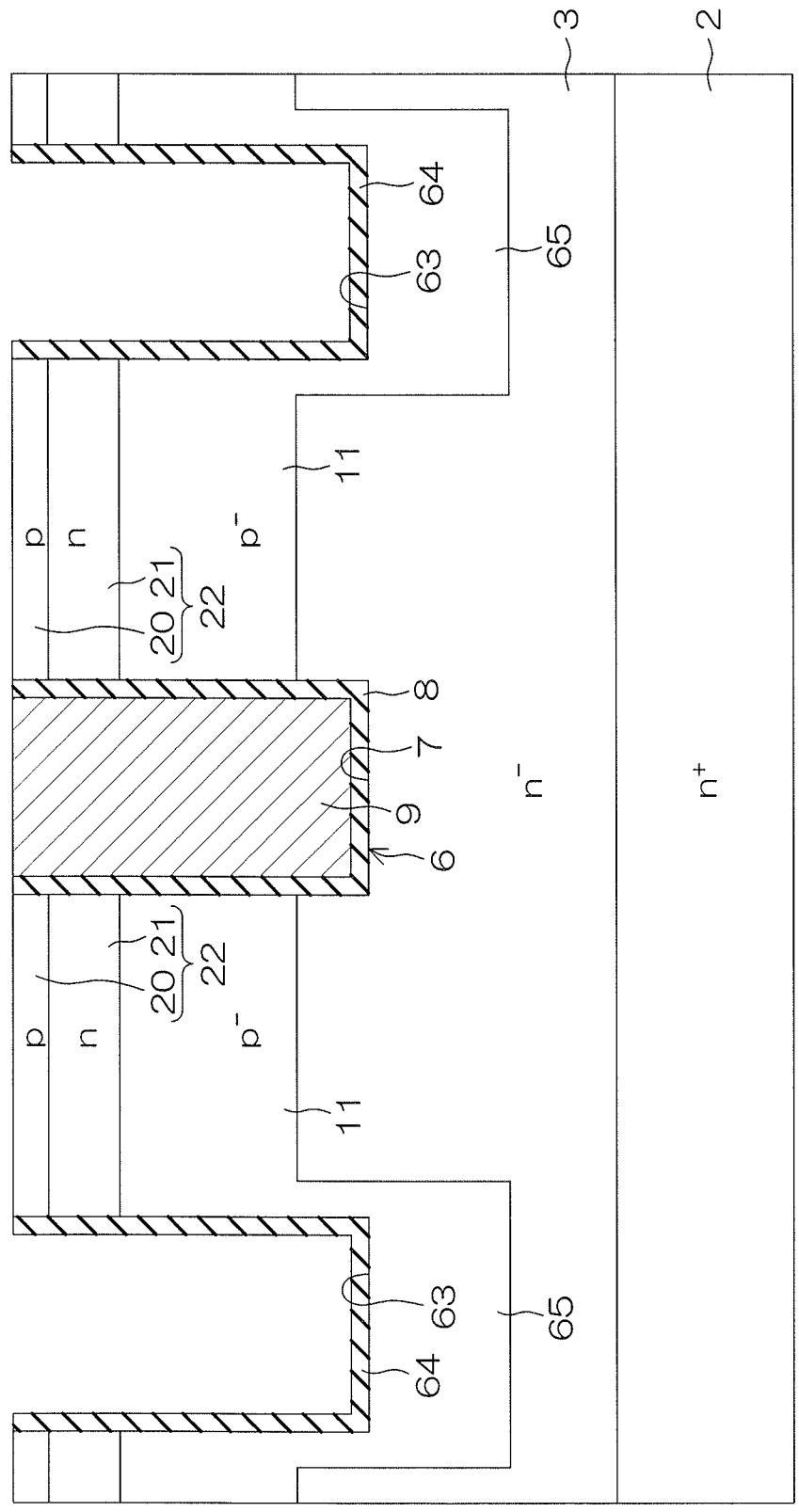

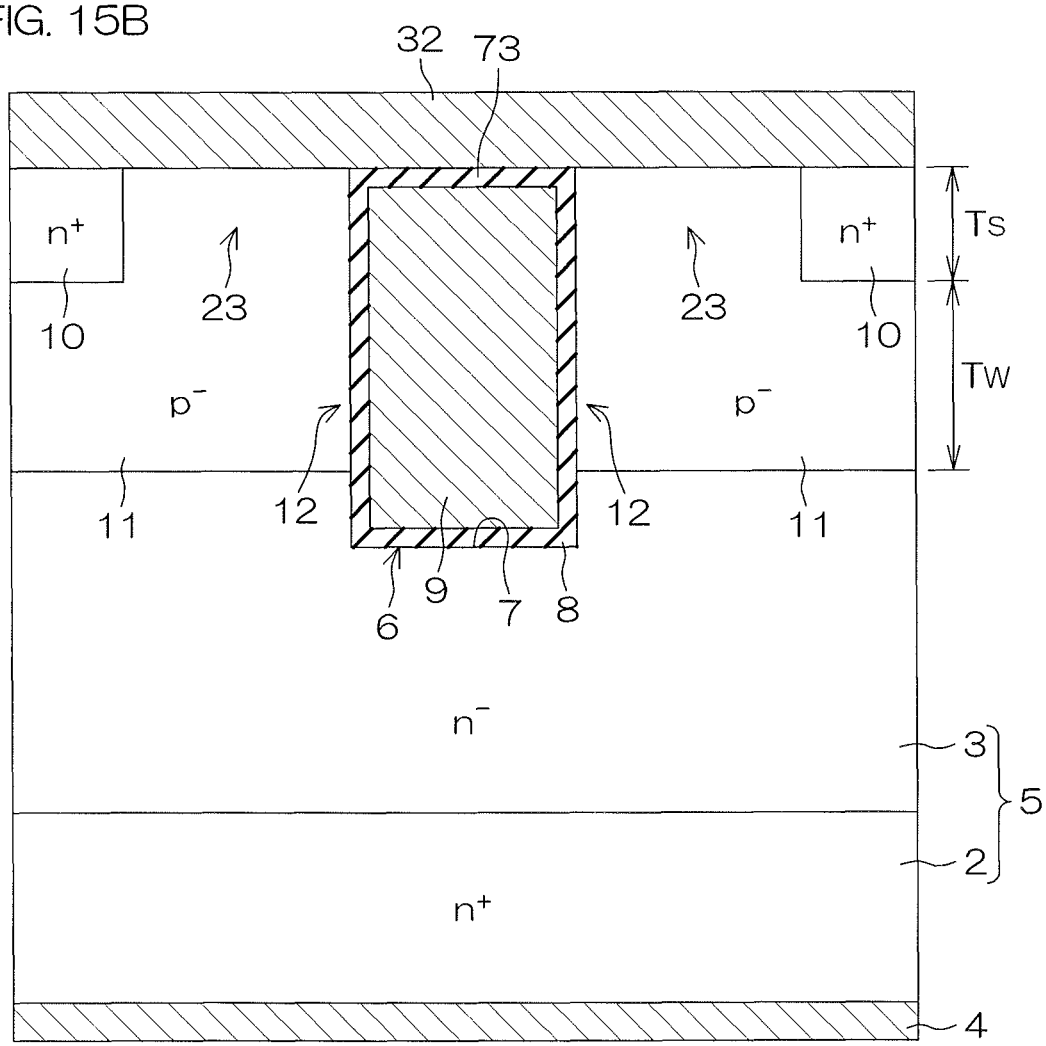

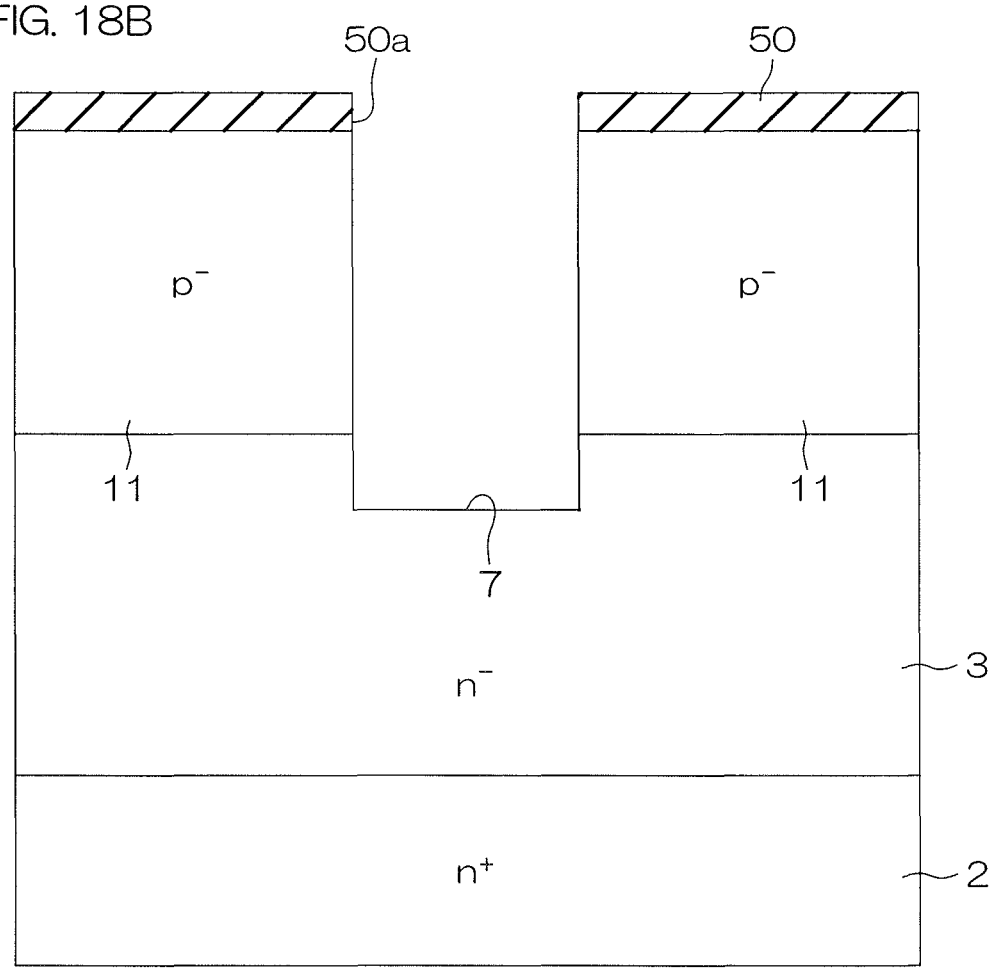

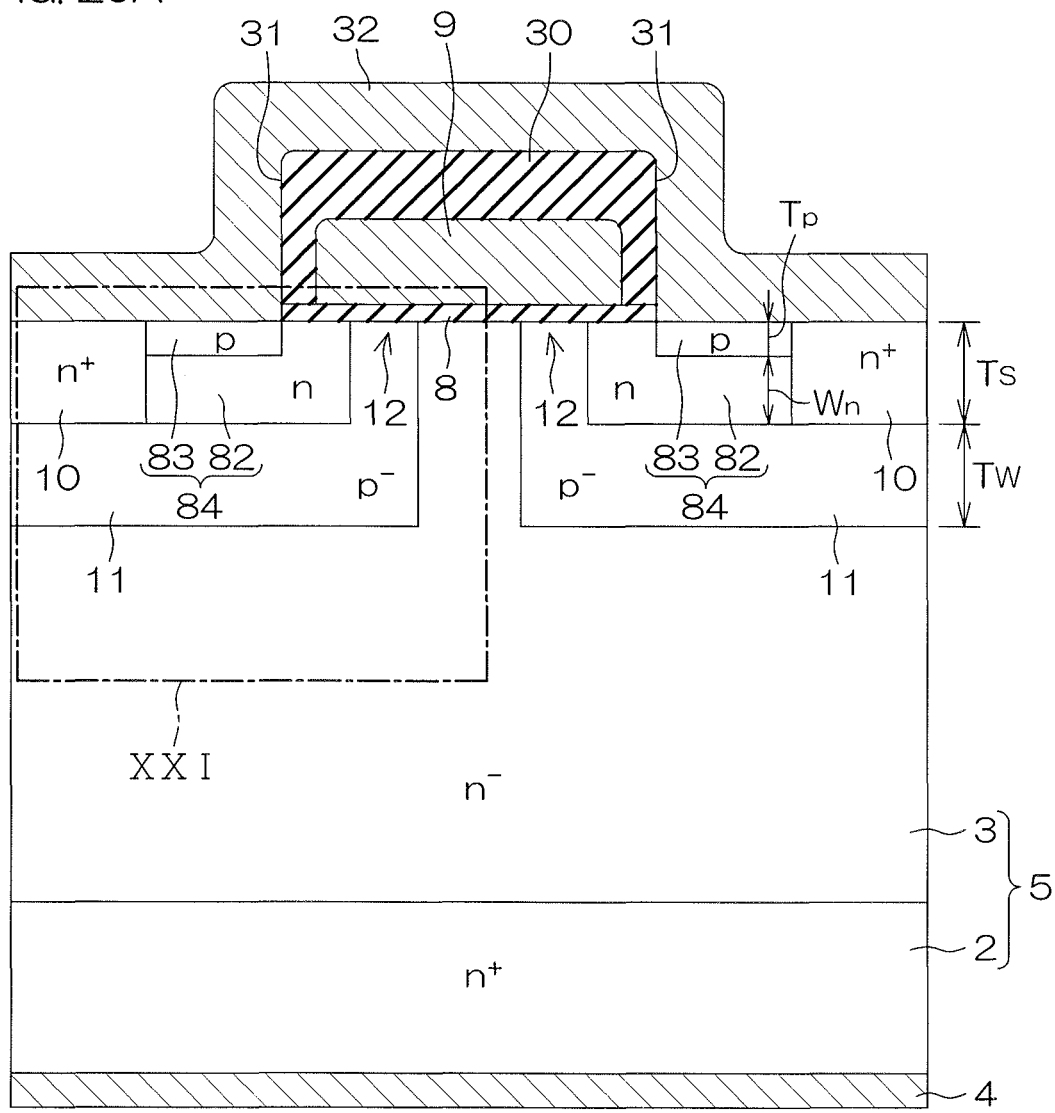

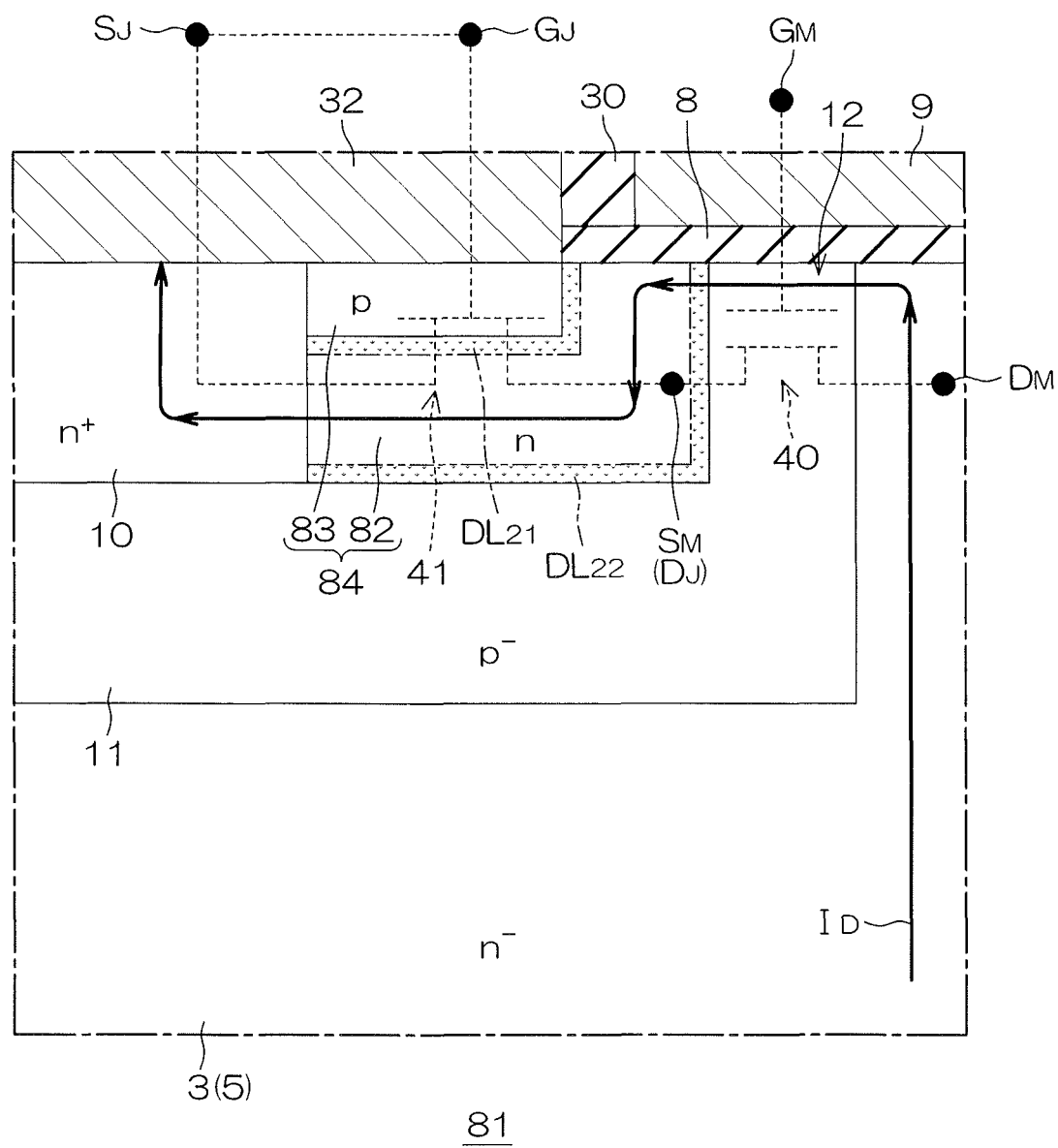

SEMICONDUCTOR DEVICE

TECHNICAL FIELD

The present invention relates to a semiconductor device.

BACKGROUND ART

A metal oxide semiconductor field effect transistor (MOSFET) is known as a semiconductor element that is connected to a load to provide a predetermined switching operation for the load. Patent Literature 1 discloses an example of a semiconductor device including the MOSFET.

The semiconductor device according to Patent Literature 1 includes an n type semiconductor layer, a p type well region formed in a surface layer portion of the semiconductor layer, an n type source region formed in a surface layer portion of the well region spaced from a peripheral edge of the well region, and a gate electrode formed at the semiconductor layer so as to face a channel between the peripheral edge of the well region and a peripheral edge of the source region.

CITATION LIST

Patent Literature

Patent Literature 1: Japanese Patent Application Publication No. 2011-159797

SUMMARY OF THE INVENTION

Technical Problem

When the load is short-circuited while the semiconductor device is in an ON state, the voltage applied to the load is sometimes applied as a short-circuit voltage to the semiconductor device. In this case, a relatively large short-circuit current flows into the semiconductor device. As a result, the semiconductor device can be destroyed by Joule heat due to the short-circuit voltage and the short-circuit current in a time as short as, for example, several μsec to several tens μsec.

The time from the start of flowing of the short-circuit current until the semiconductor device is destroyed is known as the short circuit tolerance. It is considered that the longer time until the semiconductor device is destroyed, the better the short circuit tolerance capability.

The short-circuit current can be suppressed by reducing an impurity concentration of the well region forming a channel. Consequently, the Joule heat is reduced, and hence it is considered that the short circuit tolerance is improved. However, when the impurity concentration of the well region is reduced, a tradeoff problem arises, that is, the ON resistance increases due to a decrease in carrier mobility.

It is, therefore, an object of the present invention to provide a semiconductor device that can suppress an increase in ON resistance and achieve a high short circuit tolerance.

Solution to Problem

A semiconductor device according to a first aspect of the present invention includes a semiconductor layer of a first conductivity type having a first principal surface and a second principal surface, a trench gate structure including a gate trench formed in the surface layer portion of the first principal surface of the semiconductor layer and a gate electrode embedded in the gate trench with an insulating film interposed between the gate trench and the gate electrode, a source region of the first conductivity type formed in the surface layer portion of the first principal surface of the semiconductor layer at a side of the trench gate structure, a well region of a second conductivity type formed in a region at a side of the second principal surface of the semiconductor layer with respect to the source region along the trench gate structure at a side of the trench gate structure and including a channel formed in a portion along the trench gate structure, and a multilayer region formed in a region between the trench gate structure and the source region in the semiconductor layer, the multilayer region including a second conductivity type impurity region formed in the surface layer portion of the first principal surface of the semiconductor layer and a first conductivity type impurity region formed in a side of the second principal surface of the semiconductor layer with respect to the second conductivity type impurity region.

A semiconductor device according to a second aspect of the present invention includes a semiconductor layer of a first conductivity type having a first principal surface and a second principal surface, a trench gate structure including a gate trench formed in the surface layer portion of the first principal surface of the semiconductor layer and a gate electrode embedded in the gate trench with an insulating film interposed between the gate trench and the gate electrode, a source region of the first conductivity type formed in the surface layer portion of the first principal surface of the semiconductor layer at a side of the trench gate structure, a well region of a second conductivity type formed in a region at a side of the second principal surface of the semiconductor layer with respect to the source region along the trench gate structure at a side of the trench gate structure and including a channel formed in a portion along the trench gate structure, a first conductivity type impurity region formed in a region between the trench gate structure and the source region in the semiconductor layer so as to be exposed from the first principal surface of the semiconductor layer and electrically connected to the well region, and a source electrode formed at the first principal surface of the semiconductor layer and electrically connected to the source region and the first conductivity type impurity region, the source electrode forming a Schottky junction with the first conductivity type impurity region.

A semiconductor device according to a third aspect of the present invention includes a semiconductor layer of a first conductivity type having a first principal surface and a second principal surface, a well region of a second conductivity type formed in a surface layer portion of the first principal surface of the semiconductor layer, a source region of the first conductivity type formed in a surface layer portion of the well region spaced from a peripheral edge of the well region, a gate electrode formed on an insulating film at the first principal surface of the semiconductor layer so as to face a channel between the peripheral edge of the well region and a peripheral edge of the source region, and a multilayer region formed in a region between the channel and the source region in a surface layer portion of the well region, the multilayer region having a first conductivity type impurity region formed in the surface layer portion of the well region and a second conductivity type impurity region formed in a surface layer portion of the first conductivity type impurity region.

Effects of the Invention

In the semiconductor device according to the first aspect of the present invention, a p-n junction portion is formed between the second conductivity type impurity region and the first conductivity type impurity region. A p-n junction portion is formed between the second conductivity type well region and the first conductivity type impurity region.

When a short-circuit voltage is applied between the semiconductor layer and the source region, a depletion layer extends from the p-n junction portion formed between the second conductivity type impurity region and the first conductivity type impurity region into the first conductivity type impurity region. A depletion layer extends from the p-n junction portion formed between the second conductivity type well region and the first conductivity type impurity region into the first conductivity type impurity region. This can narrow a current path in the first conductivity impurity region in a short circuit state, and hence can block a short-circuit current in the first conductivity type impurity region.

On the other hand, in a non-short circuit state, the depletion layer hardly extends from the p-n junction portion formed between the second conductivity type impurity region and the first conductivity type impurity region into the first conductivity type impurity region. In the non-short circuit state, the depletion layer hardly extends from the p-n junction portion formed between the second conductivity type well region and the first conductivity type impurity region into the first conductivity type impurity region. In the non-short circuit state, therefore, a current flowing in the first conductivity type impurity region is hardly blocked by the depletion layer.

As described above, in the semiconductor device according to the first aspect, a current constriction portion is formed in a region between the channel (the well region) and the source region. The current constriction portion narrows the current path when the short circuit state is set, and expands the current path when the short circuit state is switched to the non-short circuit state.

This makes it possible to reduce the short-circuit current in the short circuit state. Accordingly, Joule heat due to the short-circuit voltage and the short-circuit current can be reduced. On the other hand, in the non-short circuit state, since the current path is hardly narrowed, it is possible to suppress an increase in ON resistance due to the current constriction portion. Therefore, this makes it possible to provide the semiconductor device that can suppress an increase in ON resistance and achieve a high short circuit tolerance.

In the semiconductor device according to the second aspect of the present invention, a Schottky junction portion is formed between the source electrode and the first conductivity type impurity region. A p-n junction portion is formed between the second conductivity type well region and the first conductivity type impurity region.

When a short-circuit voltage is applied between the semiconductor layer and the source region, a depletion layer extends from the Schottky junction portion between the source electrode and the first conductivity type impurity region into the first conductivity type impurity region. A depletion layer extends from the p-n junction portion formed between the second conductivity type well region and the first conductivity type impurity region into the first conductivity type impurity region. This can narrow a current path in the first conductivity type impurity region in a short circuit state, and hence can block a short-circuit current in the first conductivity type impurity region.

On the other hand, in a non-short circuit state, the depletion layer hardly extends from the Schottky junction portion between the source electrode and the first conductivity type impurity region into the first conductivity type impurity region. In the non-short circuit state, the depletion layer hardly extends from the p-n junction portion formed between the second conductivity type well region and the first conductivity type impurity region into the first conductivity type impurity region. Accordingly, in the non-short circuit state, a current flowing in the first conductivity type impurity region is hardly blocked by the depletion layer.

As described above, in the semiconductor device according to the second aspect, a current constriction portion is formed in a region between the channel (the well region) and the source region. The current constriction portion narrows the current path when the short circuit state is set, and expands the current path when the short circuit state is switched to the non-short circuit state.

This can reduce the short-circuit current in the short circuit state, and hence can reduce Joule heat due to the short-circuit voltage and the short-circuit current. On the other hand, in the non-short circuit state, since the current path is hardly narrowed, an increase in ON resistance due to the current constriction portion can be suppressed. Therefore, this makes it possible to provide the semiconductor device that can suppress an increase in ON resistance and achieve a high short circuit tolerance.

In the semiconductor device according to the third aspect of the present invention, a p-n junction portion is formed between the second conductivity type impurity region and the first conductivity type impurity region. A p-n junction portion is formed between the second conductivity type well region and the first conductivity type impurity region.

When a short-circuit voltage is applied between the semiconductor layer and the source region, a depletion layer extends from the p-n junction portion formed between the second conductivity type impurity region and the first conductivity type impurity region into the first conductivity type impurity region. A depletion layer extends from the p-n junction portion formed between the second conductivity type well region and the first conductivity type impurity region into the first conductivity type impurity region. This can narrow a current path in the first conductivity type impurity region in a short circuit state and block a short-circuit current in the first conductivity type impurity region.

On the other hand, in a non-short circuit state, the depletion layer hardly extends from the p-n junction portion formed between the second conductivity type impurity region and the first conductivity type impurity region into the first conductivity type impurity region. In the non-short circuit state, the depletion layer hardly extends from the p-n junction portion formed between the second conductivity type well region and the first conductivity type impurity region into the first conductivity type impurity region. Accordingly, in the non-short circuit state, a current flowing in the first conductivity type impurity region is hardly blocked by the depletion layer.

As described above, in the semiconductor device according to the third aspect, a current constriction portion is formed in a region between the channel (the well region) and the source region. The current constriction portion narrows the current path when the short circuit state is set, and expands the current path when the short circuit state is switched to the non-short circuit state.

This makes it possible to reduce the short-circuit current in the short circuit state. Accordingly, Joule heat due to the short-circuit voltage and the short-circuit current can be reduced. On the other hand, in the non-short circuit state, since the current path is hardly narrowed, it is possible to suppress an increase in ON resistance due to a current constriction portion. Therefore, this makes it possible to provide the semiconductor device that can suppress an increase in ON resistance and achieve a high short circuit tolerance.

BRIEF DESCRIPTION OF THE DRAWINGS

FIG. 2A is a sectional view taken along line IIA-IIA shown in FIG. 1.

FIG. 3 is an enlarged view of a region surrounded by the broken line III shown in FIG. 2A, showing a case in which a non-short circuit state is set.

FIG. 10 is a plan view showing a semiconductor device according to a third preferred embodiment of the present invention.

FIG. 13B is a sectional view showing a step after FIG. 13A.

FIG. 13C is a sectional view showing a step after FIG. 13B.

FIG. 15B is a sectional view taken along line XVB-XVB shown in FIG. 14.

FIG. 18B is a sectional view showing a step after FIG. 18A.

FIG. 20A is a sectional view taken along line XXA-XXA shown in FIG. 19.

FIG. 21 is an enlarged view of a region surrounded by the broken line XXI shown in FIG. 20, showing a case in which a non-short circuit state is set.

DETAILED DESCRIPTION OF PREFERRED EMBODIMENTS

Preferred embodiments of the present invention will be hereinafter described in detail with reference to the accompanying drawings.

In the following description, an n type impurity or an n type element indicates an element including a pentavalent element as a main impurity. Pentavalent elements include, for example, boron (B), aluminum (Al), indium (In), and gallium (Ga). In the following description, a p type impurity or a p type element indicates an element including a trivalent element as amain impurity. Trivalent elements include, for example, a phosphorus (P) and arsenic (As).

First Preferred Embodiment

Figure 1:
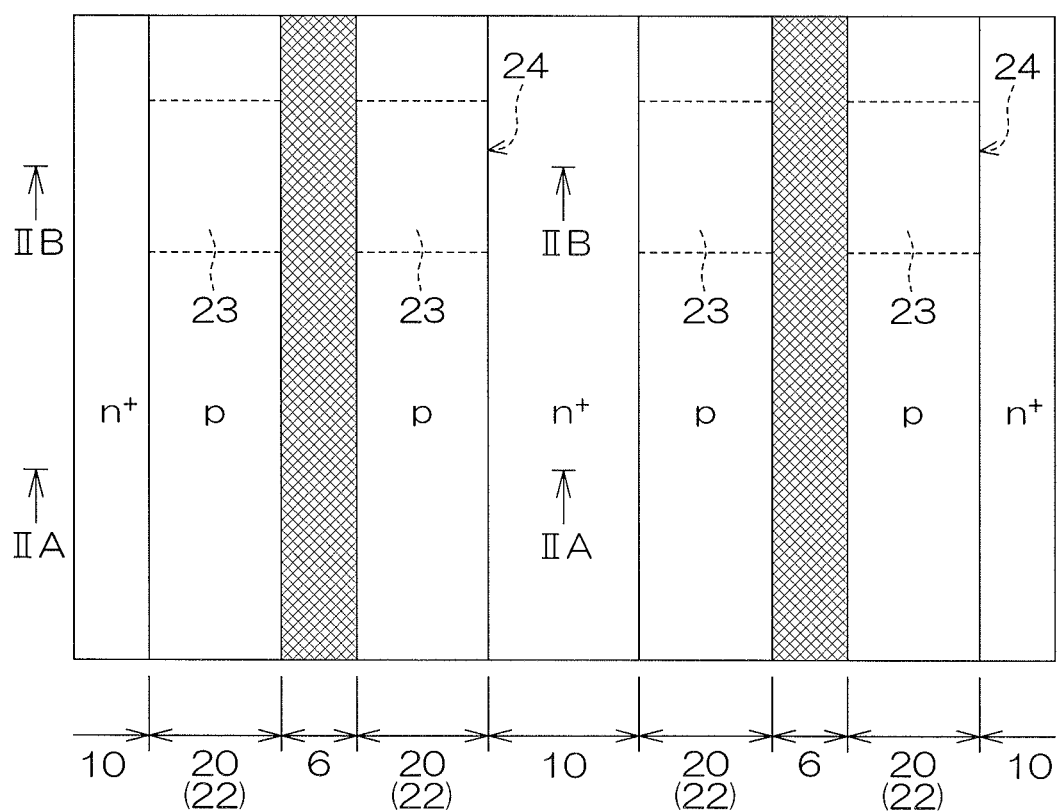
FIG. 1 is a plan view of a semiconductor device according to a first preferred embodiment of the present invention.
Figure 2B:
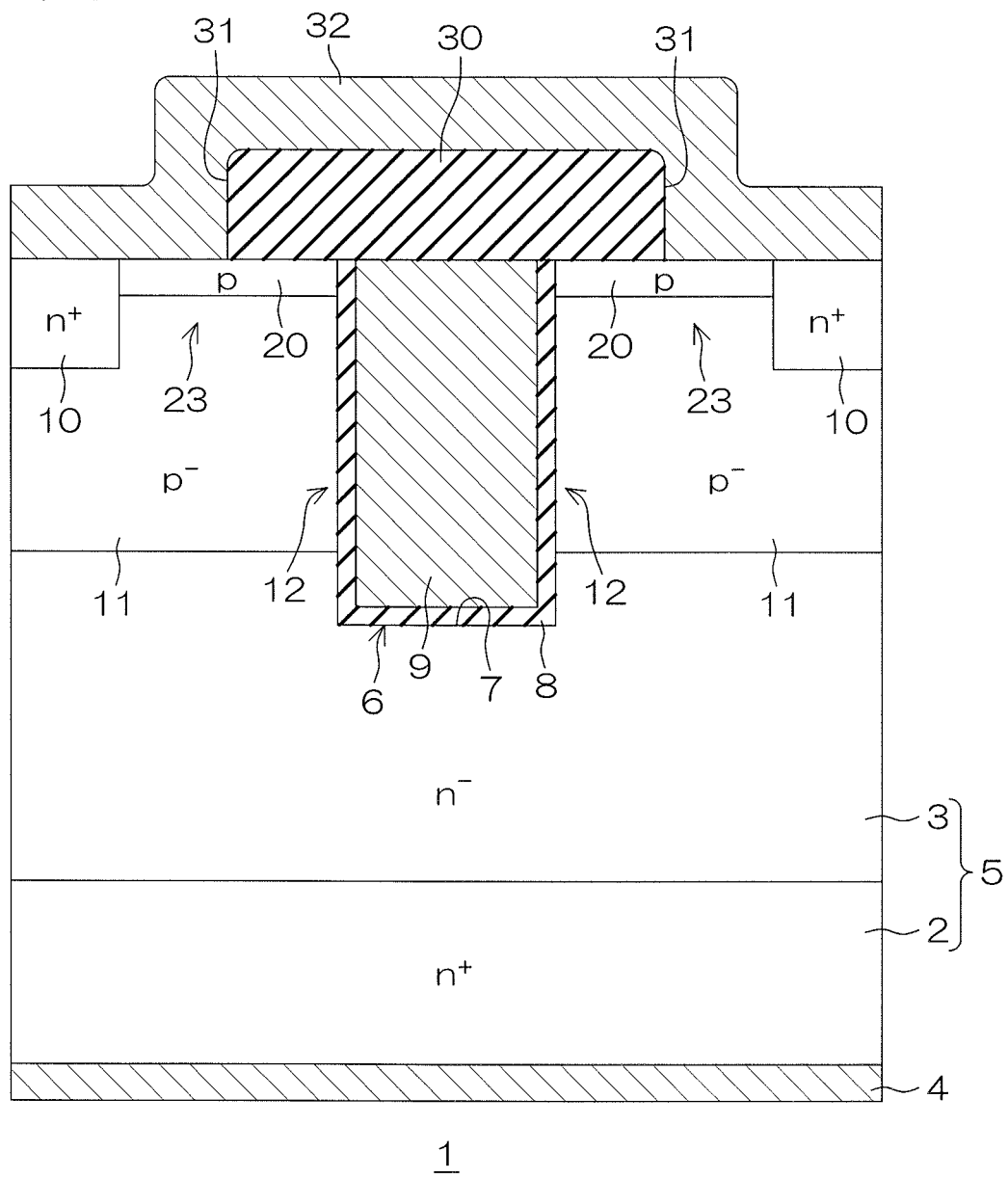
FIG. 2B is a sectional view taken along line IIB-IIB shown in FIG. 1.

FIG. 1 is a plan view of a semiconductor device 1 according to the first preferred embodiment of the present invention. FIG. 2A is a sectional view taken along line IIA-IIA shown in FIG. 1. FIG. 2B is a sectional view taken along line IIB-IIB shown in FIG. 1.

The semiconductor device 1 includes a metal insulator semiconductor field effect transistor (a MISFET). The semiconductor device 1 includes an n type semiconductor layer having a front surface (a first principal surface) and a rear surface (a second principal surface) located on the opposite side to the front surface. The semiconductor layer includes an n$^+$ type SiC semiconductor substrate 2 including SiC and n$^-$ type SiC epitaxial layer 3 including SiC. The SiC epitaxial layer 3 is formed on the front surface of the SiC semiconductor substrate 2.

A drain electrode 4 is connected to the rear surface of the semiconductor layer. The SiC semiconductor substrate 2 and the SiC epitaxial layer 3 are formed as a drain region 5. In the following description, the front surface of the semiconductor layer indicates the front surface of the SiC epitaxial layer 3.

Referring to FIGS. 1, 2A, and 2B, a plurality of trench gate structures 6 are formed in a surface layer portion of the front surface of the SiC epitaxial layer 3. Referring to FIG. 1, the trench gate structures 6 are indicated by crosshatching.

The plurality of trench gate structures 6 extend in band shapes along the same direction and are formed at intervals in a plan view. Each trench gate structure 6 includes a gate electrode 9 embedded in a gate trench 7 formed by selectively digging into the surface layer portion of the SiC epitaxial layer 3 with a gate insulating film 8 interposed between the gate trench 7 and the gate electrode 9.

The gate insulating film 8 is formed such that one surface at a side of the SiC epitaxial layer 3 and the other surface on an opposite side to one surface extend along the inner wall surface of the gate trench 7. The inner wall surface of the gate trench 7 includes side and bottom surfaces. The gate insulating film 8 may have almost uniform thickness.

Referring to FIGS. 1 and 2A, an n$^+$ type source region 10 and a p$^-$ type well region 11 are formed in the surface layer portion of the SiC epitaxial layer 3. The n$^+$ type source region 10 and the p type well region 11 are formed in this order from a side of the front surface to a side of the rear surface of the semiconductor layer at a side of the trench gate structure 6.

The source region 10 extends in a band shape along the trench gate structure 6 and is formed spaced from the trench gate structure 6. In this preferred embodiment, the source region 10 is formed in a middle portion between the adjacent trench gate structures 6. The source region 10 is exposed from the front surface of the SiC epitaxial layer 3.

Referring to FIGS. 2A and 2B, the source region 10 is connected to the well region 11 in a depth direction of the SiC epitaxial layer 3 (the semiconductor layer). The depth direction of the SiC epitaxial layer 3 is a direction perpendicular to the front surface of the SiC epitaxial layer 3. The n type impurity concentration of the source region 10 is higher than the n type impurity concentration of the SiC epitaxial layer 3.

Referring to FIGS. 2A and 2B, the well region 11 is formed in a region at the side of the rear surface of the semiconductor layer with respect to the source region 10 along the trench gate structure 6. The well region 11 is formed in such a depth that a boundary portion between the well region 11 and the SiC epitaxial layer 3 is in contact with the side surface of the trench gate structure 6.

The well region 11 is formed in a region between the adjacent trench gate structures 6. The well region 11 is shared by the trench gate structure 6 on one side and the trench gate structure 6 on the other side adjacent to each other. A portion which extends along the side surface of the trench gate structure 6 in the well region 11 is a channel formation region 12. The formation of a channel in the channel formation region 12 is controlled by the trench gate structure 6 (the gate electrode 9).

A supplementary explanation will be given for the respective numerical values concerning the SiC epitaxial layer 3, the trench gate structure 6, the source region 10, and the well region 11.

With regard to the depth direction of the SiC epitaxial layer 3, a depth $D_{GT}$ of the trench gate structure 6 is, for example, 0.5 µm or more and 2.0 µm or less (about 1.0 µm in this preferred embodiment).

With regard to the depth direction of the SiC epitaxial layer 3, a thickness $T_s$ of the source region 10 is, for example, 0.1 µm or more and 0.2 µm or less (about 0.15 µm in this preferred embodiment).

With regard to the depth direction of the SiC epitaxial layer 3, a thickness $T_w$ of the well region 11 is, for example, 0.4 µm or more and 0.6 µm or less (about 0.5 µm in this preferred embodiment).

The n type impurity concentration of the SiC epitaxial layer 3 is, for example, $1.0 \times 10^{14}$ cm$^{-3}$ or more and $1.0 \times 10^{16}$ cm$^{-3}$ or less (about $8.0 \times 10^{15}$ cm$^{-3}$ in this preferred embodiment).

The n type impurity concentration of the source region 10 is, for example, $1.0 \times 10^{18}$ cm$^{-3}$ or more and $1.0 \times 10^{20}$ cm$^{-3}$ or less (about $6.0 \times 10^{19}$ cm$^{-3}$ in this preferred embodiment).

The p type impurity concentration of the well region 11 is, for example, $1.0 \times 10^{17}$ cm$^{-3}$ or more and $1.0 \times 10^{19}$ cm$^{-3}$ or less (about $2.0 \times 10^{18}$ cm$^{-3}$ in this preferred embodiment).

The semiconductor device 1 according to this preferred embodiment includes a multilayer region 22 formed in a region between the trench gate structure 6 and the source region 10 in the surface layer portion of the SiC epitaxial layer 3.

The multilayer region 22 includes a p type impurity region 20 and an n type impurity region 21 formed in this order from the side of the front surface to the side of the rear surface of the semiconductor layer in the surface layer portion of the SiC epitaxial layer 3. The semiconductor device 1 includes the multilayer region 22 to suppress an increase in ON resistance and achieve a high short circuit tolerance.

Referring to FIGS. 1 and 2A, the multilayer region 22 is formed in a band shape along the trench gate structure 6. The multilayer region 22 is formed to have a depth almost equal to the depth of the source region 10. In the multilayer region 22, the p type impurity region 20, and then type impurity region 21 are formed in contact with side surfaces of the source region 10 and the trench gate structure 6 in a lateral direction parallel to the front surface of the SiC epitaxial layer 3.

The lateral direction parallel to the front surface of the SiC epitaxial layer 3 is also a direction intersecting with the trench gate structure 6 formed in the band shape. The direction intersecting with the trench gate structure 6 formed in the band shape may also be a direction perpendicular to the trench gate structure 6 formed in the band shape.

The p type impurity region 20 is formed in the surface layer portion of the SiC epitaxial layer 3 so as to be exposed from the front surface of the SiC epitaxial layer 3. The p type impurity region 20 is in contact with the entire n type impurity region 21 in the depth direction of the SiC epitaxial layer 3. The p type impurity region 20 forms a p-n junction portion with the n type impurity region 21. The p type impurity concentration of the p type impurity region 20 is higher than the p type impurity concentration of the well region 11.

The n type impurity region 21 is formed in a region at the side of the rear surface of the semiconductor layer with respect to the p type impurity region 20 in the surface layer portion of the SiC epitaxial layer 3. The n type impurity region 21 is in contact with the well region 11 in the depth direction of the SiC epitaxial layer 3. The n type impurity region 21 forms a p-n junction portion with the well region 11.

The n type impurity region 21 has a width $L_n$ almost equal to that of the p type impurity region 20 in the lateral direction parallel to the front surface of the SiC epitaxial layer 3. The n type impurity concentration of the n type impurity region 21 is higher than the n type impurity concentration of the SiC epitaxial layer 3 and is lower than the n type impurity concentration of the source region 10. With regard to the depth direction of the SiC epitaxial layer 3, a thickness $T_n$ of the n type impurity region 21 is preferably equal to or more than a thickness $T_p$ of the p type impurity region 20 ($T_n \geq T_p$).

A supplementary explanation will be given for the respective numerical values concerning the p type impurity region 20 and the n type impurity region 21.

With regard to the depth direction of the SiC epitaxial layer 3, the thickness $T_p$ of the p type impurity region 20 is, for example, 0.04 μm or more and 0.08 μm or less (about 0.06 μm in this preferred embodiment).

With regard to the depth direction of the SiC epitaxial layer 3, the thickness $T_n$ of the n type impurity region 21 is, for example, 0.06 μm or more and 0.12 μm or less (about 0.09 μm in this preferred embodiment).

With regard to the lateral direction parallel to the front surface of the SiC epitaxial layer 3, the width $L_n$ of the n type impurity region 21 is, for example, 0.1 μm or more and 0.8 μm or less (about 0.4 μm in this preferred embodiment).

The p type impurity concentration of the p type impurity region 20 is, for example, $1.0 \times 10^{19}$ cm$^{-3}$ or more and $1.0 \times 10^{21}$ cm$^{-3}$ or less (about $4.0 \times 10^{20}$ cm$^{-3}$ in this preferred embodiment).

The n type impurity concentration of the n type impurity region 21 is, for example, $1.0 \times 10^{17}$ cm$^{-3}$ or more and $1.0 \times 10^{19}$ cm$^{-3}$ or less (about $1.0 \times 10^{18}$ cm$^{-3}$ in this preferred embodiment).

Referring to FIGS. 1 and 2B, portions without the n type impurity region 21 (see the broken lines in FIG. 1) are selectively formed in the multilayer regions 22. Each portion without the n type impurity region 21 is formed as a p type contact region 23.

The multilayer region 22 may include a region 24 in which portions with the n type impurity region 21 and portions without the n type impurity region 21 are alternately formed along the trench gate structure 6.

The p type impurity region 20 is electrically connected to the well region 11 in the p type contact region 23. This sets the p type impurity region 20 at the same potential as that of the well region 11.

Referring to FIGS. 2A and 2B, a surface insulating film 30 is formed on the front surface of the SiC epitaxial layer 3. The surface insulating film 30 covers the trench gate structure 6. Contact holes 31 are formed in the surface insulating film 30 so as to selectively expose the source region 10 and the p type impurity region 20.

A source electrode 32 is formed on the surface insulating film 30. The source electrode 32 enters the contact hole 31 from above the surface insulating film 30. The source electrode 32 is electrically connected to the source region 10 and the p type impurity region 20 in the contact hole 31. This short-circuits the source region 10 and the p type impurity region 20 and sets them at the same potential.

In one mode, the source electrode 32 may form an ohmic junction with the source region 10, and form an ohmic junction with the p type impurity region 20. In another mode, the source electrode 32 may form an ohmic junction with the source region 10, and form a Schottky junction with the p type impurity region 20.

Figure 4:
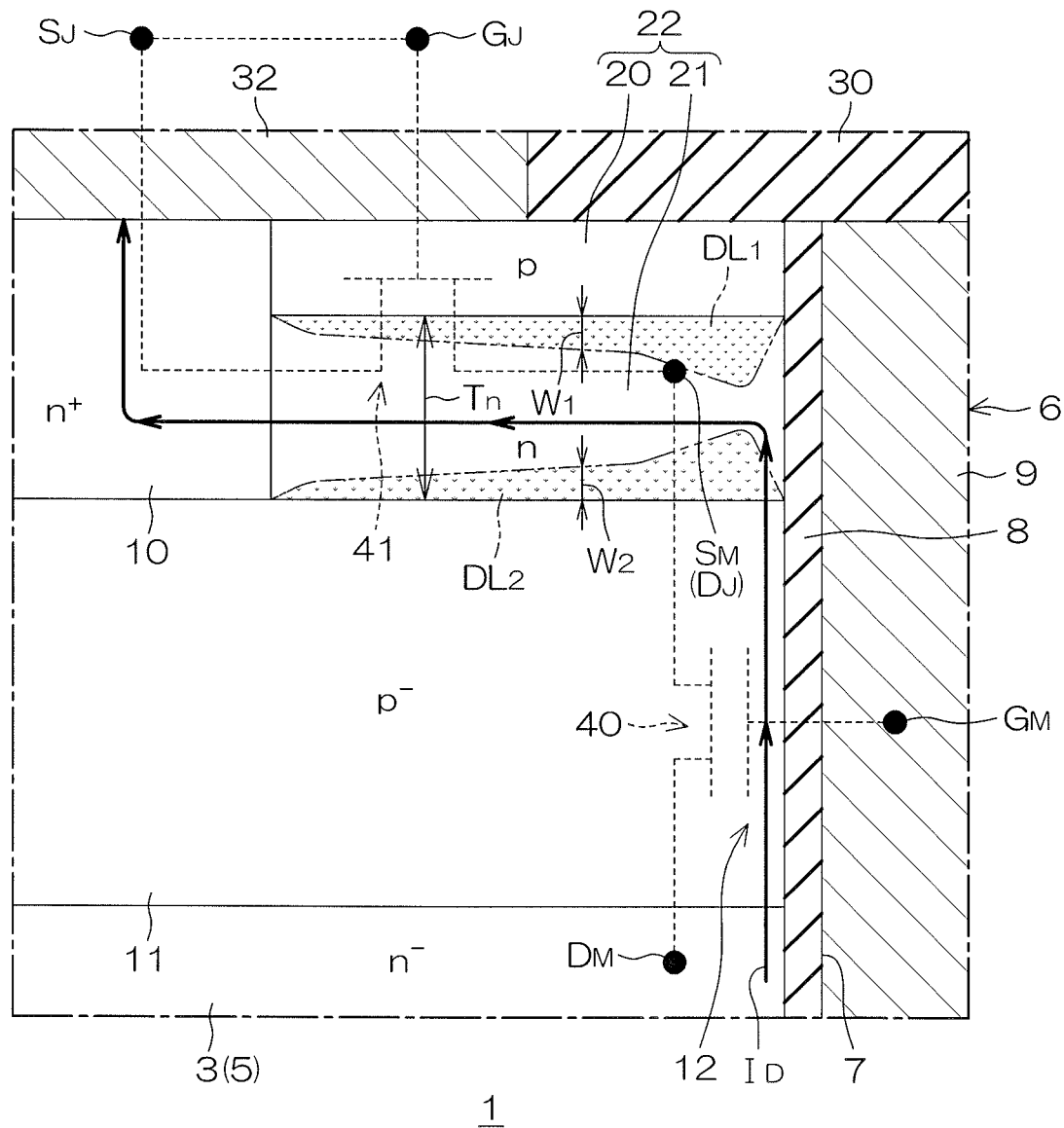
FIG. 4 is an enlarged view of a region corresponding to FIG. 3, showing a case in which a short circuit state is set.

Next, the electrical structure of the semiconductor device 1 will be described with reference to FIGS. 3 and 4. FIG. 3 is an enlarged view of the region surrounded by the broken line III shown in FIG. 2A, showing a case in which a non-short circuit state is set. FIG. 4 is an enlarged view of a region corresponding to FIG. 3, showing a case in which a short circuit state is set.

The non-short circuit state of the semiconductor device 1 indicates a steady state in which a predetermined driving voltage is applied to the gate electrode 9. The short circuit state of the semiconductor device 1 indicates a state in which, while a predetermined driving voltage is applied to the gate electrode 9, a predetermined short-circuit voltage (for example, 200 V to 1000 V) is applied between the drain electrode 4 and the source electrode 32.

Referring to FIGS. 3 and 4, a MISFET 40 and a junction gate field-effect transistor (a JFET) 41 are formed in the side of the trench gate structure 6.

The MISFET 40 is formed by the SiC epitaxial layer 3 (the drain region 5), the trench gate structure 6 (the gate electrode 9), and the source region 10 (more specifically, the n type impurity region 21 electrically connected to the source region 10).

For the sake of descriptive convenience, FIGS. 3 and 4 each show a gate terminal $G_M$, a drain terminal $D_M$, and a source terminal $S_M$ of the MISFET 40 respectively at the trench gate structure 6 (the gate electrode 9), the SiC epitaxial layer 3 (the drain region 5), and the n type impurity region 21.

The JFET 41 is formed by the n$^+$ type source region 10 and a p-n-p multilayer structure including the p$^-$ type well region 11, the n type impurity region 21, and the p type impurity region 20. The well region 11 and the p type impurity region 20 are set at the same potential and constitute the gate of the JFET 41.

For the sake of descriptive convenience, FIGS. 3 and 4 each show a gate terminal $G_J$, a drain terminal $D_J$, and a source terminal $S_J$ of the JFET 41 respectively at the p type impurity region 20, the n type impurity region 21, and the source region 10.

The source terminal $S_M$ of the MISFET 40 is electrically connected to the drain terminal $D_J$ of the JFET 41. This forms a series circuit including the MISFET 40 and the JFET 41. The gate terminal $G_J$ and the source terminal $S_J$ of the JFET 41 are short-circuited by the source electrode 32.

When the predetermined driving voltage is applied to the gate electrode 9, the channel is formed in the channel formation region 12. This turns on the semiconductor device 1, and a current $I_D$ flows from the drain electrode 4 into the source electrode 32 via the SiC epitaxial layer 3, the well region 11 (the channel formation region 12), the n type impurity region 21, and the source region 10. On the other hand, when the semiconductor device 1 is in an OFF state, no channel is formed in the channel formation region 12, and hence the current $I_D$ does not flow between the drain electrode 4 and the source electrode 32.

Referring to FIGS. 3 and 4, the p-n junction portion is formed between the p type impurity region 20 and the n type impurity region 21. The p-n junction portion is formed between the well region 11 and the n type impurity region 21.

A first depletion layer $DL_1$ is formed by the p-n junction portion formed between the p type impurity region 20 and the n type impurity region 21. A second depletion layer $DL_2$ is formed by the p-n junction portion formed between the well region 11 and the n type impurity region 21.

Referring to FIG. 3, while the semiconductor device 1 is in the non-short circuit state, the first depletion layer $DL_1$ and the second depletion layer $DL_2$ hardly extend into the n type impurity region 21. This forms a relatively wide current path between the drain electrode 4 and the source electrode 32. Therefore, in the non-short circuit state, the first depletion layer $DL_1$ and the second depletion layer $DL_2$ hardly block a current flowing in the n type impurity region 21.

On the other hand, referring to FIG. 4, while the semiconductor device 1 is in the short circuit state, the first depletion layer $DL_1$ extends from the p-n junction portion formed between the p type impurity region 20 and the n type impurity region 21 into the n type impurity region 21. The second depletion layer $DL_2$ extends from the p-n junction portion formed between the well region 11 and the n type impurity region 21 into the n type impurity region 21.

A width $W_1$ of the first depletion layer $DL_1$ gradually increases from the side of the source region 10 to the side of the trench gate structure 6. Accordingly, the width $W_1$ of the first depletion layer $DL_1$ at the side of the trench gate structure 6 is relatively larger than the width $W_1$ of the first depletion layer $DL_1$ at a side of the source region 10.

Likewise, a width $W_2$ of the second depletion layer $DL_2$ gradually increases from the side of the source region 10 to the side of the trench gate structure 6. Accordingly, the width $W_2$ of the second depletion layer $DL_2$ at the side of the trench gate structure 6 is relatively larger than the width $W_2$ of the second depletion layer $DL_2$ at the side of the source region 10.

While the semiconductor device 1 is in the short circuit state, the first depletion layer $DL_1$ and the second depletion layer $DL_2$ reduce an area of the current path formed in the n type impurity region 21. In this state, in the n type impurity region 21, the area of the current path formed in a side of the channel formation region 12 is smaller than the area of the current path formed in the side of the source region 10. As described above, while the semiconductor device 1 is in the short circuit state, since the area of the current path formed in the n type impurity region 21 is narrowed, the flow of the current $I_D$ is blocked.

In one mode, the well region 11, the p type impurity region 20, and the n type impurity region 21 may be formed so as to satisfy the equation $T_n > W_1 + W_2$, where $T_n$ is the thickness of the n type impurity region 21, $W_1$ is the width of the first depletion layer $DL_1$, and $W_2$ is the width of the second depletion layer $DL_2$.

In another mode, the well region 11, the p type impurity region 20, and the n type impurity region 21 may be formed so as to satisfy the equation $T_n \leq W_1 + W_2$, where $T_n$ is the thickness of the n type impurity region 21, $W_1$ is the width of the first depletion layer $DL_1$, and $W_2$ is the width of the second depletion layer $DL_2$.

In another mode, since the first depletion layer $DL_1$ and the second depletion layer $DL_2$ overlap each other in the n type impurity region 21, the flow of the short-circuit current $I_D$ can be effectively blocked. The one mode and the other mode may be combined to form the well region 11, the p type impurity region 20, and the n type impurity region 21 so as to include a portion satisfying the equation $T_n \leq W_1 + W_2$ and a portion satisfying the equation $T_n \leq W_1 + W_2$.

Figure 5:
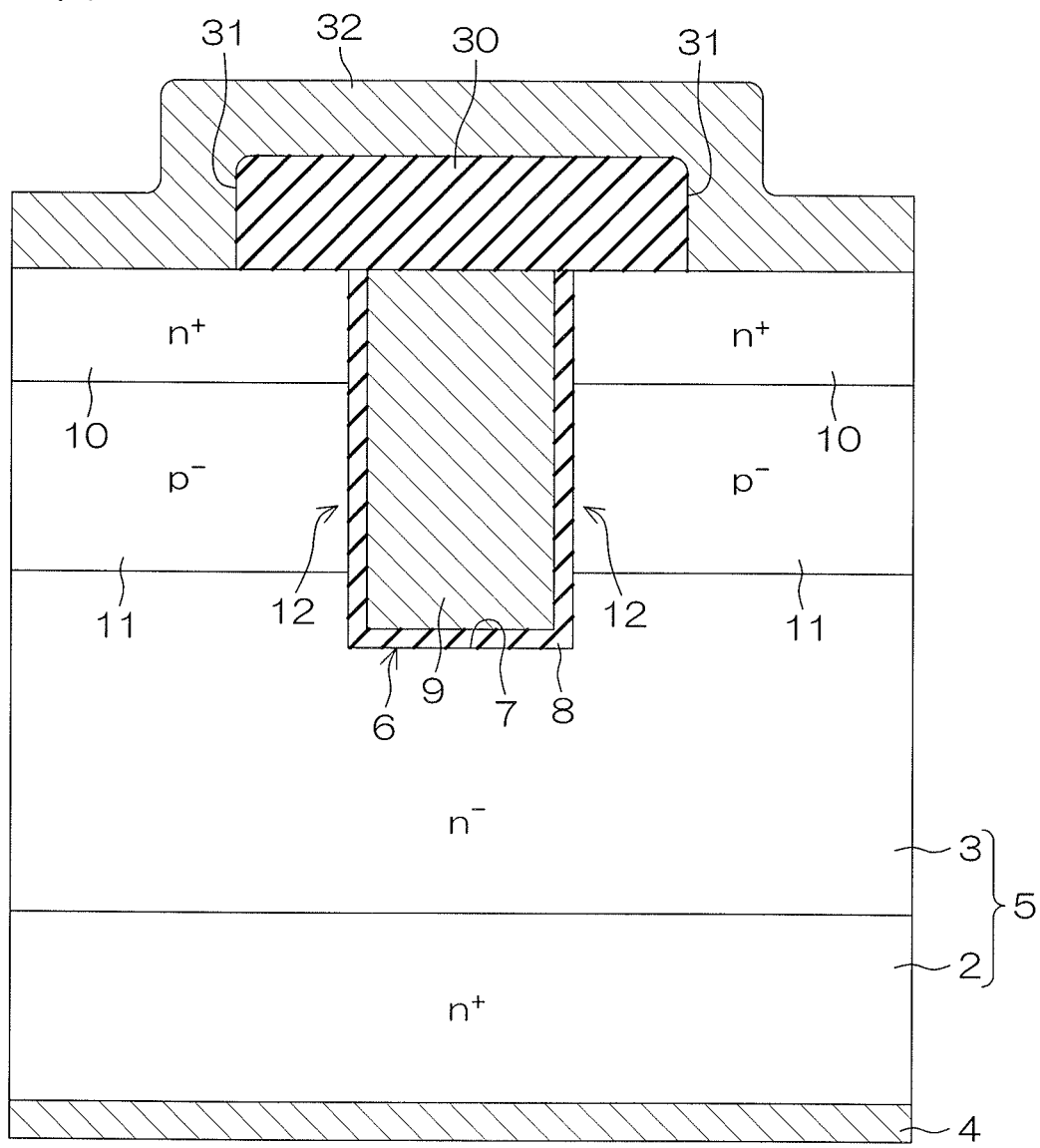
FIG. 5 is a sectional view showing a semiconductor device according to a reference example.

A semiconductor device 101 shown in FIG. 5 was separately prepared to compare the drain current $I_D$—drain voltage $V_D$ characteristics in the presence/absence of the JFET 41 with that in the absence of the JFET 41. The drain current $I_D$—drain voltage $V_D$ characteristics are also the short-circuit current $I_D$—short-circuit voltage $V_D$ characteristics. FIG. 5 is a sectional view of the semiconductor device 101 according to the reference example.

The semiconductor device 101 according to the reference example has a structure without the multilayer region 22 and the JFET 41. The same reference signs as in FIG. 2A denote the same components in FIG. 5, and a description thereof will be omitted.

Figure 6:
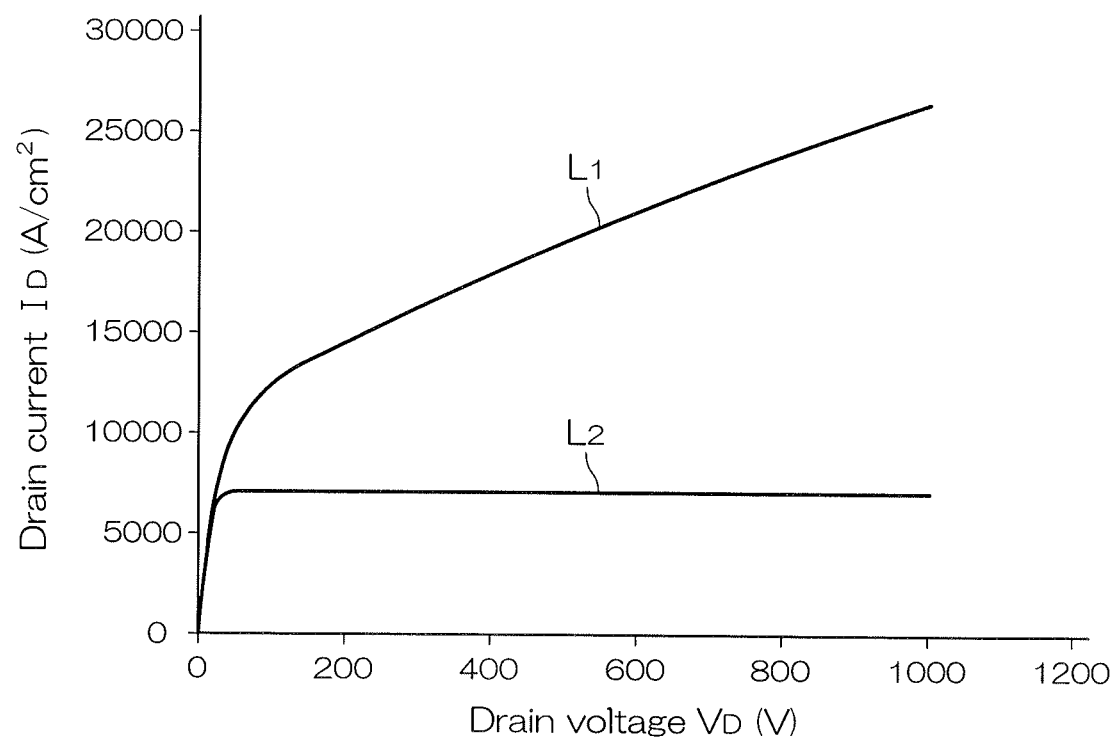
FIG. 6 is a graph showing drain current-drain voltage characteristics.

FIG. 6 shows the results obtained by simulating the current $I_D$ flowing between the drain electrode 4 and the source electrode 32 by applying the drain voltage $V_D$ ranging from 0 V to 1000 V to the drain electrode 4.

Referring to FIG. 6, the ordinate represents the drain current $I_D$ [A/cm$^2$], and the abscissa represents the drain voltage $V_D$ [V].

FIG. 6 shows a curve $L_1$ and a curve $L_2$. The curve $L_1$ represents the drain current $I_D$—drain voltage $V_D$ characteristics of the semiconductor device 101 according to the reference example. The curve $L_2$ represents the drain current $I_D$—drain voltage $V_D$ characteristics of the semiconductor device 1 according to this preferred embodiment.

Referring to the curve $L_1$, in the semiconductor device 101 according to the reference example, the drain current $I_D$ increases with an increase in the drain voltage $V_D$. When the drain voltage $V_D$ exceeds 50 V, the drain current $I_D$ exceeds 10000 A/cm$^2$.

On the other hand, referring to the curve $L_2$, in the semiconductor device 1 according to the preferred embodiment, when the drain voltage $V_D$ exceeds 50 V, the drain current $I_D$ is saturated within the range of 5000 A/cm$^2$ or more and less than 10000 A/cm$^2$.

When the drain voltage $V_D$ is 600V, the drain current $I_D$ in the semiconductor device 1 according to the preferred embodiment is smaller by about 70% than the drain current $I_D$ in the semiconductor device 101 according to the reference example. There is hardly any increase in ON resistance in the semiconductor device 1 according to the preferred embodiment.

As described above, in the semiconductor device 1 according to this preferred embodiment, a current constriction portion (that is, the JFET 41) is formed in a region between the channel formation region 12 (the well region 11) and the source region 10. When the short circuit state is set, the current constriction portion narrows the current path. When the short circuit state is switched to the non-short circuit state, the current constriction portion expands the current path.

This makes it possible to reduce the short-circuit current $I_D$ in the short circuit state. Accordingly, Joule heat due to the short-circuit voltage $V_D$ and the short-circuit current $I_D$ can be reduced. On the other hand, in the non-short circuit state, since the area of the current path hardly decreases, an increase in ON resistance due to the current constriction portion can be suppressed. It is, therefore, possible to provide the semiconductor device 1 that can suppress an increase in ON resistance and achieve a high short circuit tolerance.

Next, an example of a manufacturing method for the semiconductor device 1 will be described. FIGS. 7A to 7F are sectional views showing the manufacturing method for the semiconductor device 1 shown in FIG. 1. FIGS. 7A to 7F each are a sectional view of a region corresponding to FIG. 2A.

Figure 7A:
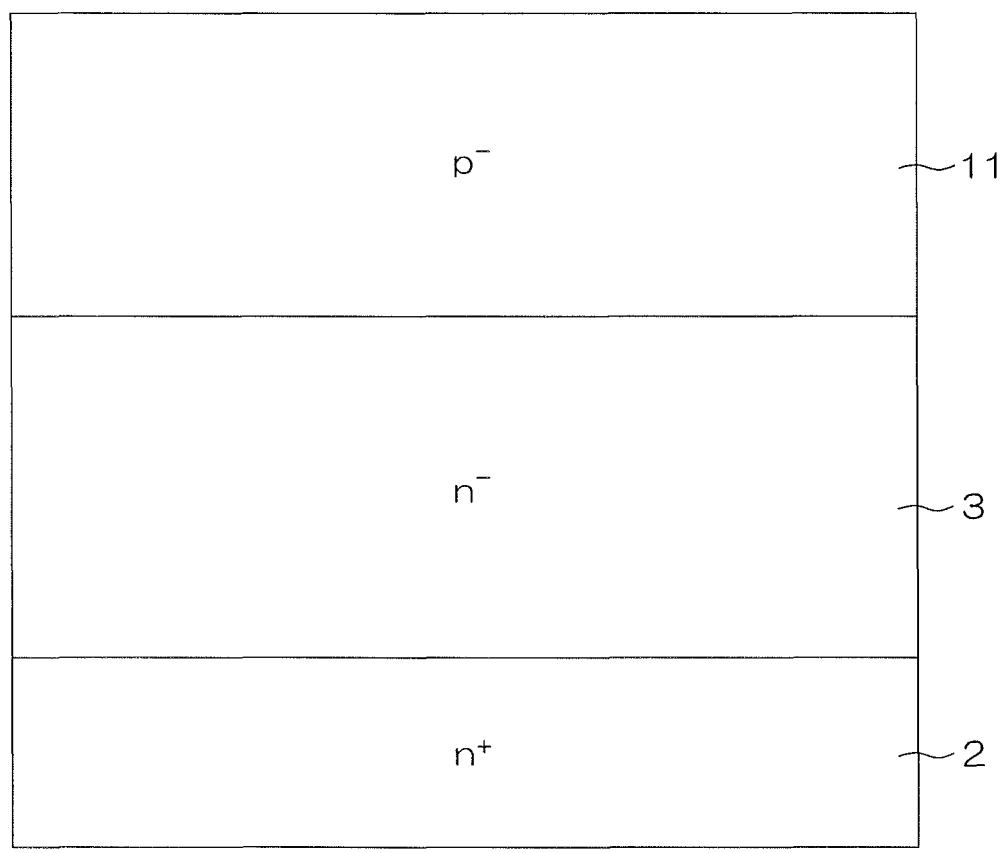
FIG. 7A is a sectional view showing a manufacturing method for the semiconductor device shown in FIG. 1.

Referring to FIG. 7A, first, the SiC semiconductor substrate 2 is prepared. Next, SiC is epitaxially grown from the front surface of the SiC semiconductor substrate 2. This forms the SiC epitaxial layer 3 on the SiC semiconductor substrate 2.

Next, the p type impurity is implanted into the surface layer portion of the SiC epitaxial layer 3. P type impurity implantation is performed via an ion implantation mask (not shown) that is formed on the SiC epitaxial layer 3 and that selectively has openings at regions in which the well regions 11 should be formed. This forms the well regions 11 in surface layer portion of the SiC epitaxial layer 3. After the well regions 11 are formed, the ion implantation mask is removed.

Figure 7B:
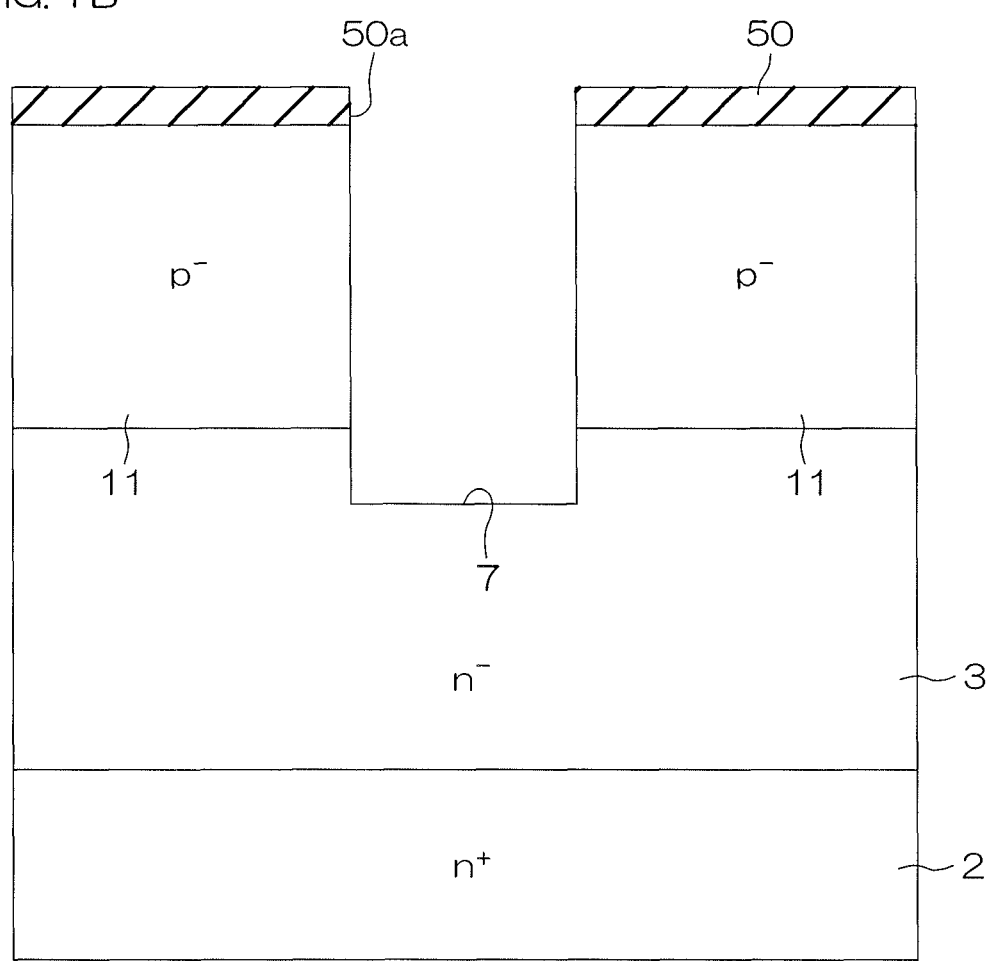
FIG. 7B is a sectional view showing a step after FIG. 7A.

Next, referring to FIG. 7B, a hard mask 50 is formed on the front surface of the SiC epitaxial layer 3. The hard mask 50 selectively has openings 50a at regions in which the gate trenches 7 should be formed. The hard mask 50 may be an insulating film (for example, a silicon oxide film).

Next, surface layer portion of the SiC epitaxial layer 3 are selectively removed by an etching method via the hard mask 50. This forms a plurality of gate trenches 7. After the formation of the gate trenches 7, the hard mask 50 is removed.

Figure 7C:
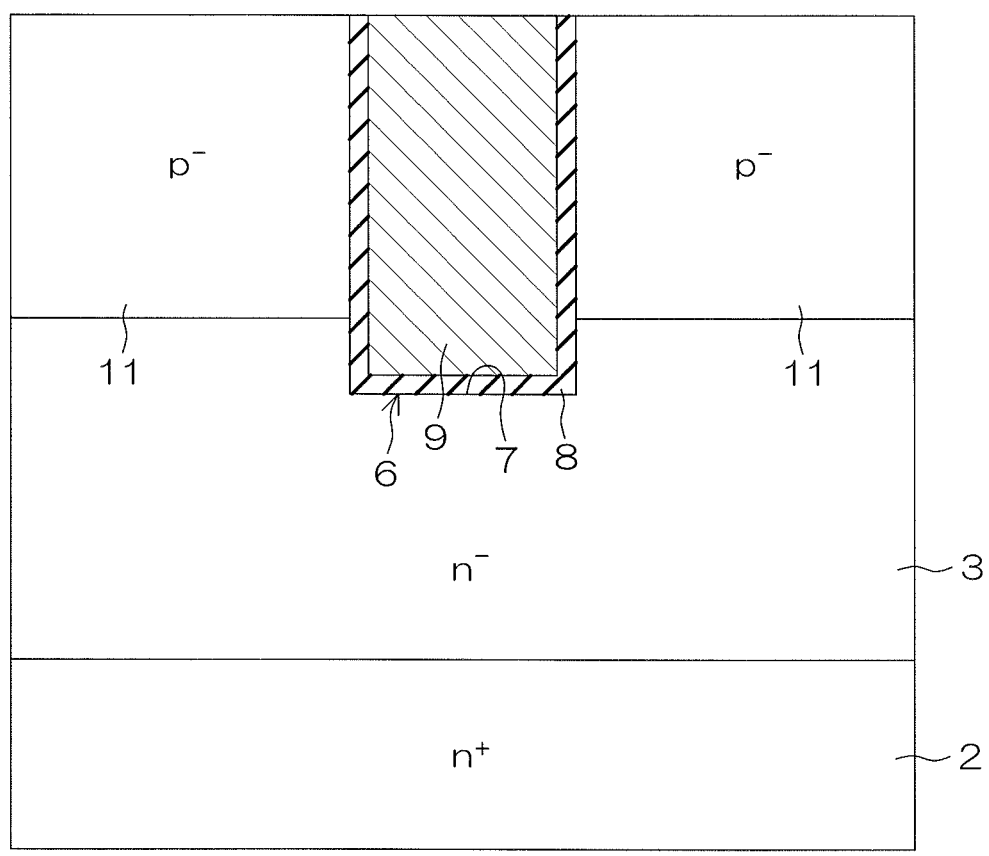
FIG. 7C is a sectional view showing a step after FIG. 7B.

Next, referring to FIG. 7C, the gate insulating film 8 made of silicon oxide is formed on an inner wall surface of the gate trench 7 by, for example, a thermal oxidation method. The gate insulating film 8 may be formed by depositing an insulting material (for example, silicon oxide and/or silicon nitride) on the inner wall surface of the gate trench 7 by, for example, a CVD method.

Next, an electrode material (for example, polysilicon) is deposited to fill the gate trench 7 so as to cover the SiC epitaxial layer 3 by, for example, a CVD method. This forms an electrode material layer covering the SiC epitaxial layer 3.

Next, the electrode material layer is selectively removed by an etched back method. This forms the gate electrode 9 made of the electrode material layer in the gate trench 7.

Figure 7D:
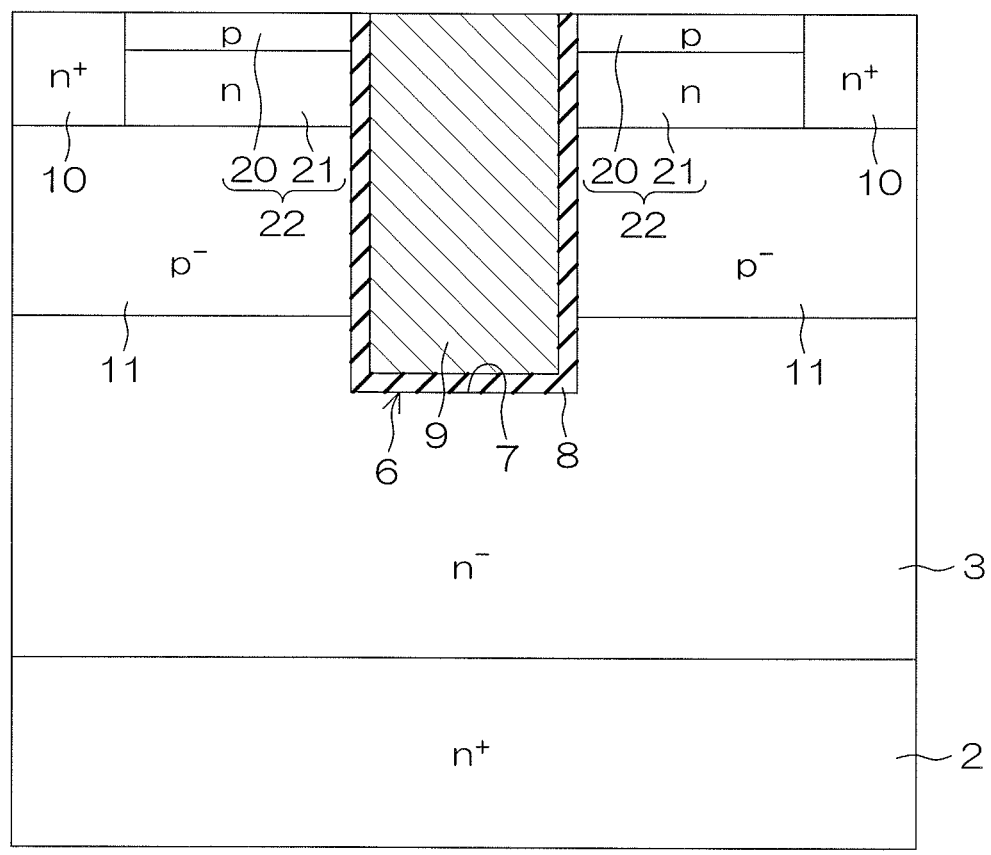
FIG. 7D is a sectional view showing a step after FIG. 7C.

Next, referring to FIG. 7D, the source region 10, the p type impurity region 20, and the n type impurity region 21 are selectively formed in the surface layer portion of the well region 11.

The source region 10 is formed by implanting the n type impurity into a surface layer portion of the well region 11. N type impurity implantation is performed via an ion implantation mask (not shown) that selectively has openings at regions in which the source regions 10 should be formed.

The p type impurity region 20 is formed by implanting the p type impurity into the surface layer portion of the well region 11. P type impurity implantation is performed via an ion implantation mask (not shown) that selectively has openings at regions in which the p type impurity regions 20 should be formed.

The n type impurity region 21 is formed by implanting the n type impurity into the surface layer portion of the well region 11. N type impurity implantation is performed via an ion implantation mask (not shown) that selectively has openings at regions in which the n type impurity regions 21 should be formed.

Figure 7E:
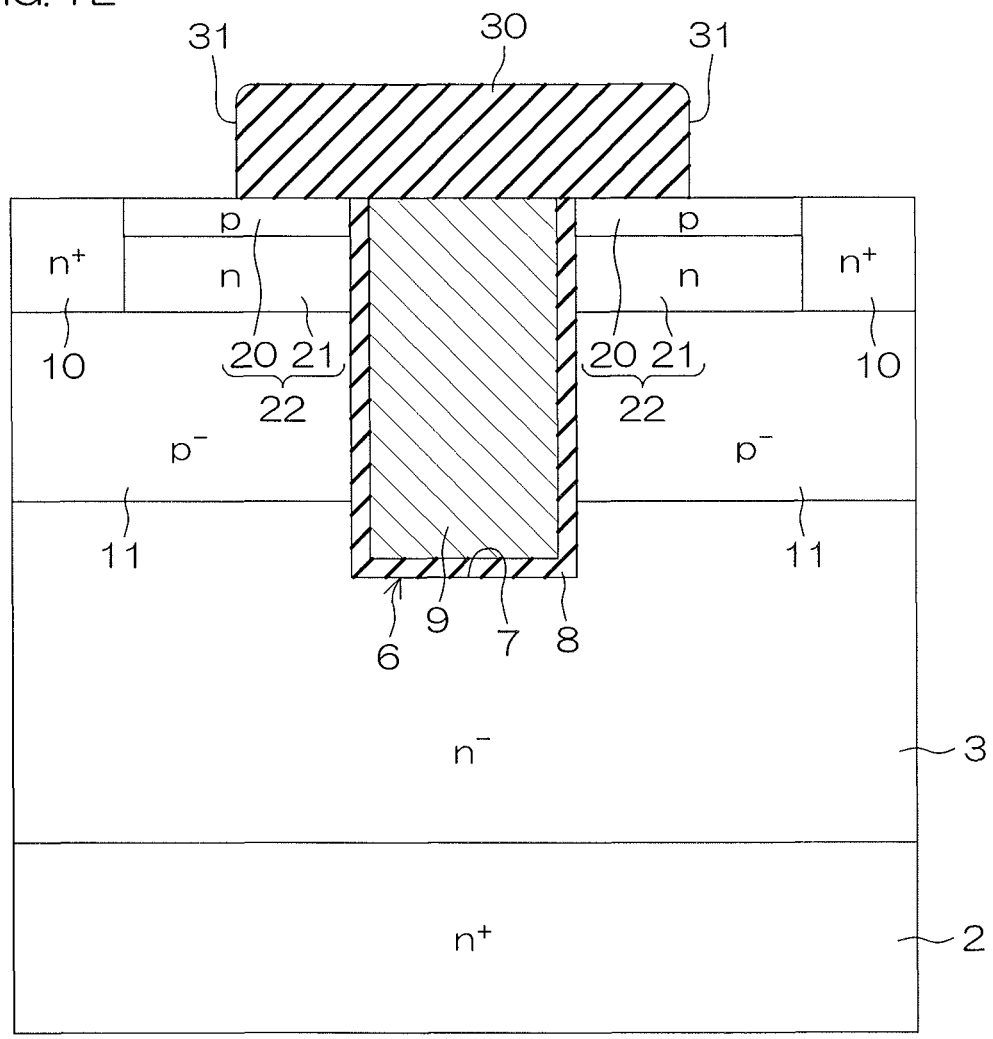
FIG. 7E is a sectional view showing a step after FIG. 7D.

Next, referring to FIG. 7E, an insulating material (oxide silicon in this preferred embodiment) is deposited on the SiC epitaxial layer 3 by, for example, a CVD method. This forms the surface insulating film 30 on the SiC epitaxial layer 3.

Next, the surface insulating film 30 is selectively removed by, for example, an etching method. This forms contact holes 31 in the surface insulating film 30 so as to selectively expose the source region 10 and the p type impurity region 20.

Figure 7F:
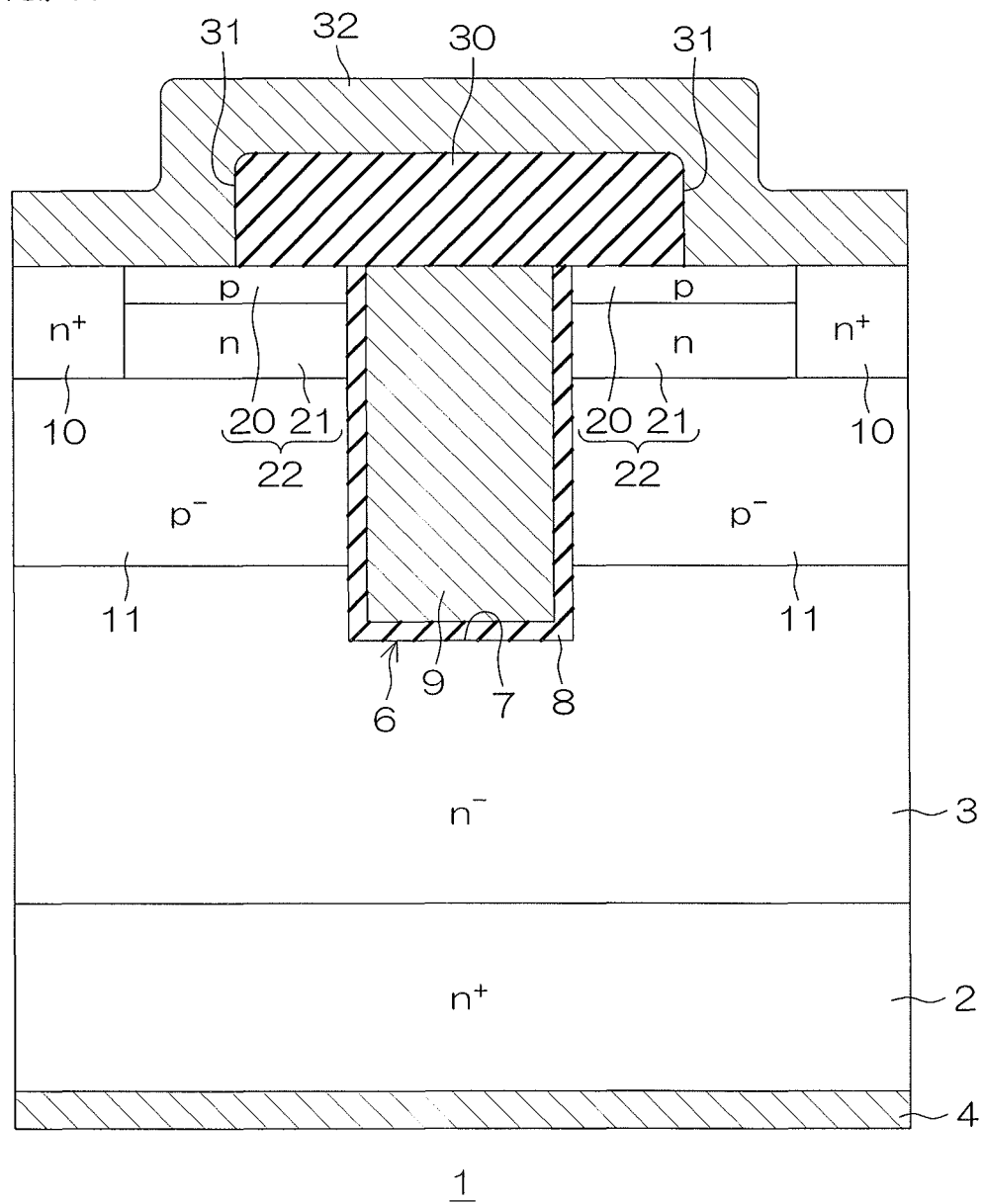
FIG. 7F is a sectional view showing a step after FIG. 7E.

Next, referring to FIG. 7F, an electrode material (for example, copper, aluminum and/or titanium) is deposited on the surface insulating film 30 by, for example, a plating method or a sputtering method. This forms the source electrode 32.

The drain electrode 4 is formed by depositing an electrode material (for example, copper, aluminum and/or titanium) on the rear surface of the SiC semiconductor substrate 2 by, for example, a plating method or a sputtering method. The semiconductor device 1 is manufactured through the steps described above.

FIG. 7D has exemplified the case in which the multilayer region 22 (the p type impurity region 20 and the n type impurity region 21) is formed after the step of forming the trench gate structure 6. However, these steps may be interchanged so that the trench gate structure 6 is formed after the step of forming the multilayer region 22 (the p type impurity region 20 and the n type impurity region 21).

Second Preferred Embodiment

Figure 8:
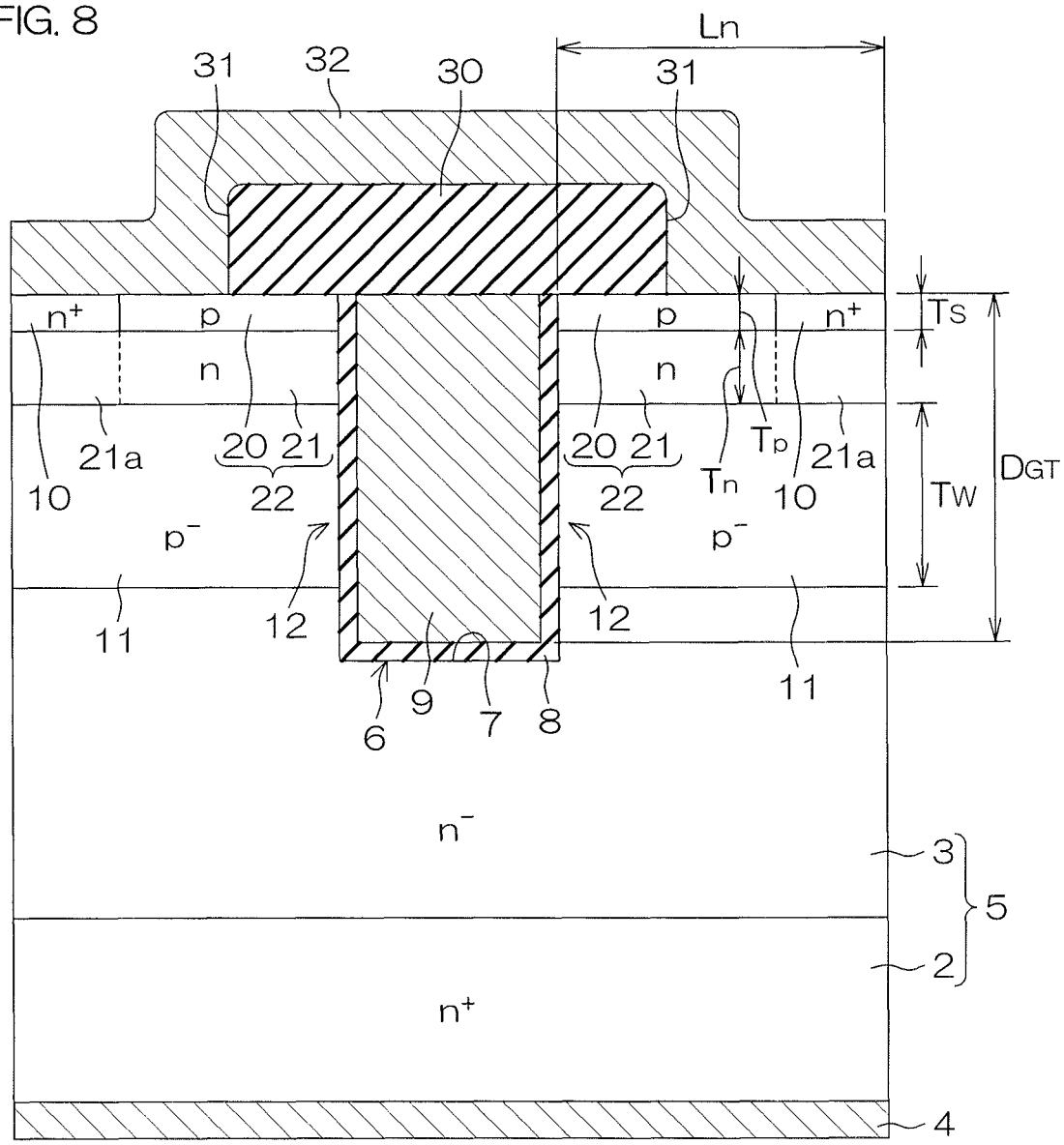
FIG. 8 is a sectional view of a semiconductor device according to a second preferred embodiment of the present invention.

FIG. 8 is a sectional view of a semiconductor device 51 according to the second preferred embodiment of the present invention. The same reference signs as in the first preferred embodiment denote the same components in FIG. 8, and a description thereof will be omitted.

The semiconductor device 51 according to this preferred embodiment includes the multilayer region 22 as in the first preferred embodiment. The multilayer region 22 includes the n type impurity region 21 having an extended portion 21a extending in a region below the source region 10.

The width $L_n$ of the n type impurity region 21 including the extended portion 21a is the same as that in the first preferred embodiment. The n type impurity region 21 is formed to be wider than the p type impurity region 20 in the lateral direction parallel to the front surface of the SiC epitaxial layer 3.

The source region 10 has a portion facing the well region 11 across the extended portion 21a of the n type impurity region 21. In this preferred embodiment, the extended portion 21a of the n type impurity region 21 is formed in an entire region below the source region 10. Accordingly, the entire source region 10 faces the well region 11 across the extended portion 21a of the n type impurity region 21.

The source region 10 according to this preferred embodiment has the thickness $T_s$ almost equal to the thickness $T_p$ of the p type impurity region 20. The source region 10 is not in contact with the well region 11 unlike in the first preferred embodiment described above.

In this preferred embodiment, therefore, with regard to the lateral direction parallel to the front surface of the SiC epitaxial layer 3, the p type impurity region 20 is in contact with the source region 10, but the n type impurity region 21 is not in contact with the source region 10.

The MISFET 40 and the JFET 41 described above are formed on the side of the trench gate structure 6. The p-n junction portion is formed between the p type impurity region 20 and the n type impurity region 21. The p-n junction portion is formed between the well region 11 and the n type impurity region 21.

The first depletion layer $DL_1$ is formed from the p-n junction portion formed between the p type impurity region 20 and the n type impurity region 21. The second depletion layer $DL_2$ is formed from the p-n junction portion formed between the well region 11 and the n type impurity region 21.

While the semiconductor device 51 is in the non-short circuit state, the first depletion layer $DL_1$ and the second depletion layer $DL_2$ hardly extend into the n type impurity region 21. This forms a relatively wide current path between the drain electrode 4 and the source electrode 32. In the non-short circuit state, therefore, the current flowing in the n type impurity region 21 is hardly blocked by the first depletion layer $DL_1$ and the second depletion layer $DL_2$.

On the other hand, while the semiconductor device 51 is in the short circuit state, the first depletion layer $DL_1$ extends from the p-n junction portion formed between the p type impurity region 20 and the n type impurity region 21 into the n type impurity region 21. The second depletion layer $DL_2$ extends from the p-n junction portion formed between the well region 11 and the n type impurity region 21 into the n type impurity region 21.

The first depletion layer $DL_1$ and the second depletion layer $DL_2$ extend into the n type impurity region 21 in the same mode as in the semiconductor device 1 described above. Accordingly, while the semiconductor device 51 is in the short circuit state, the first depletion layer $DL_1$ and the second depletion layer $DL_2$ reduce the area of the current path in the n type impurity region 21. This blocks the flow of the short-circuit current $I_D$ in the n type impurity region 21 in the short circuit state.

Figure 9:
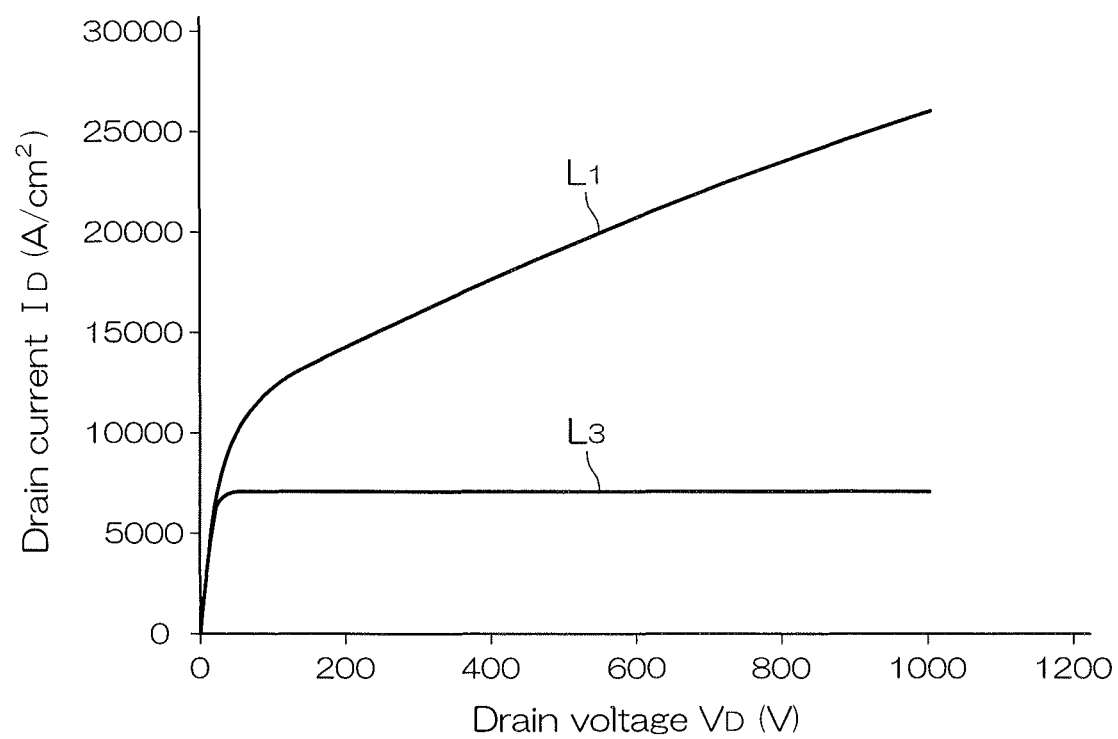
FIG. 9 is a graph showing drain current-drain voltage characteristics.

FIG. 9 shows the drain current $I_D$—drain voltage $V_D$ characteristics of the semiconductor device 51 according to this preferred embodiment. The graph of FIG. 9 corresponds to the graph of FIG. 6 described above. FIG. 9 shows a curve $L_3$ and the curve $L_1$ described above. The curve $L_3$ represents the drain current $I_D$—drain voltage $V_D$ characteristics of the semiconductor device 51 according to the preferred embodiment.

The curve $L_3$ in FIG. 9 indicates that the semiconductor device 51 according to this preferred embodiment has almost the same drain current $I_D$—drain voltage $V_D$ characteristics as that of the semiconductor device 1 described above (see also FIG. 6).

As described above, in the semiconductor device 51 according to this preferred embodiment, a current constriction portion (that is, the JFET 41) is formed in a region between the channel formation region 12 (the well region 11) and the source region 10. When the short circuit state is set, the current constriction portion narrows the current path. When the short circuit state is switched to the non-short circuit state, the current constriction portion expands the current path.

This makes it possible to reduce the short-circuit current $I_D$ in the short circuit state. Accordingly, Joule heat due to the short-circuit voltage $V_D$ and the short-circuit current $I_D$ can be reduced. On the other hand, in the non-short circuit state, since the current path is hardly narrowed, it is possible to suppress an increase in ON resistance due to a current constriction portion. This makes it possible to provide the semiconductor device 51 that can suppress an increase in ON resistance and achieve a high short circuit tolerance.

The semiconductor device 51 according to this preferred embodiment is manufactured by the same manufacturing method as that for the semiconductor device 1 according to the first preferred embodiment described above. For example, in the step shown in FIG. 7D, the implantation energy of the n type impurity may be adjusted so as to form the source region 10 in a shallow region of the surface layer portion of the SiC epitaxial layer 3.

Third Preferred Embodiment

Figure 11A:
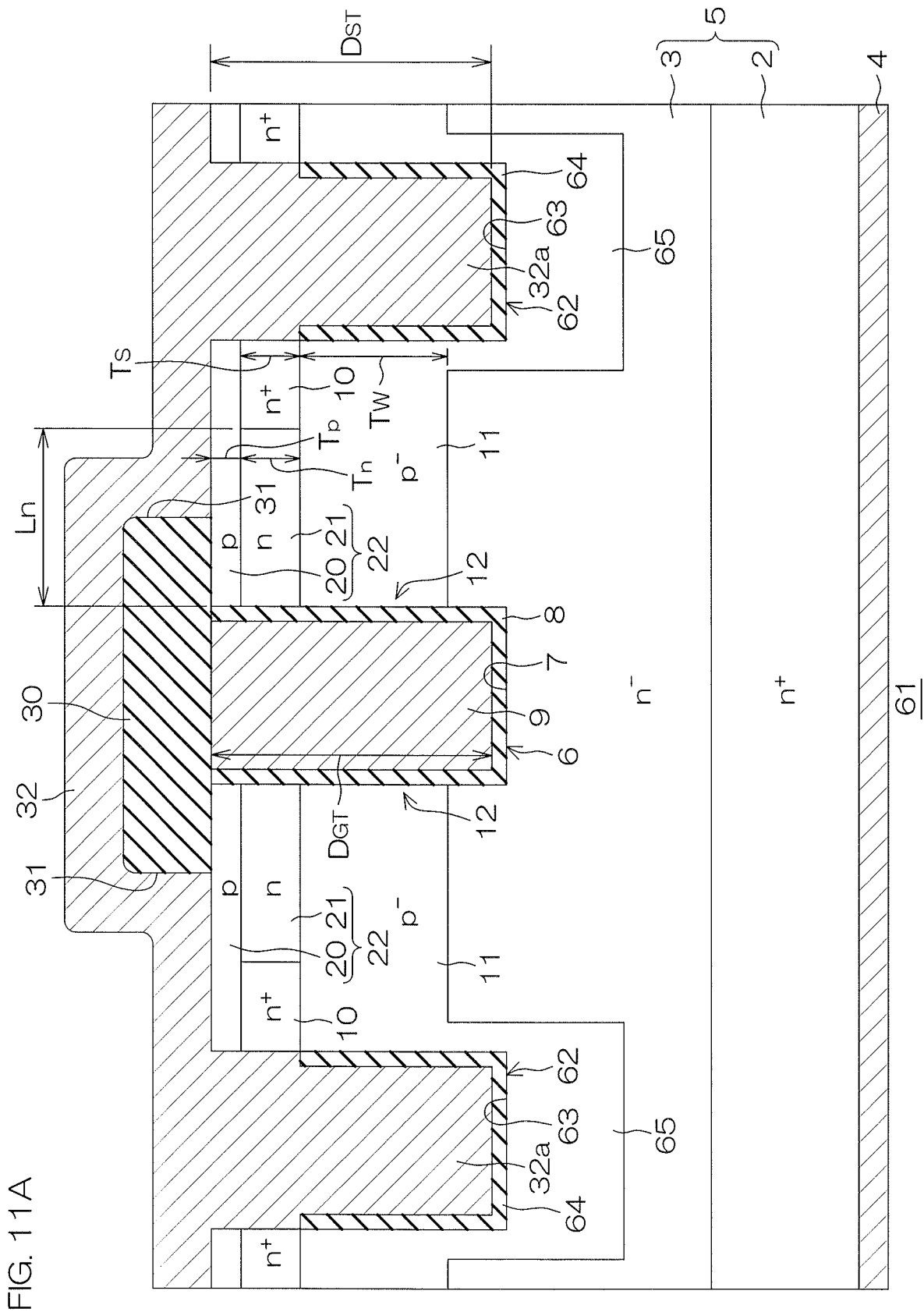
FIG. 11A is a sectional view taken along line XIA-XIA shown in FIG. 10.
Figure 11B:
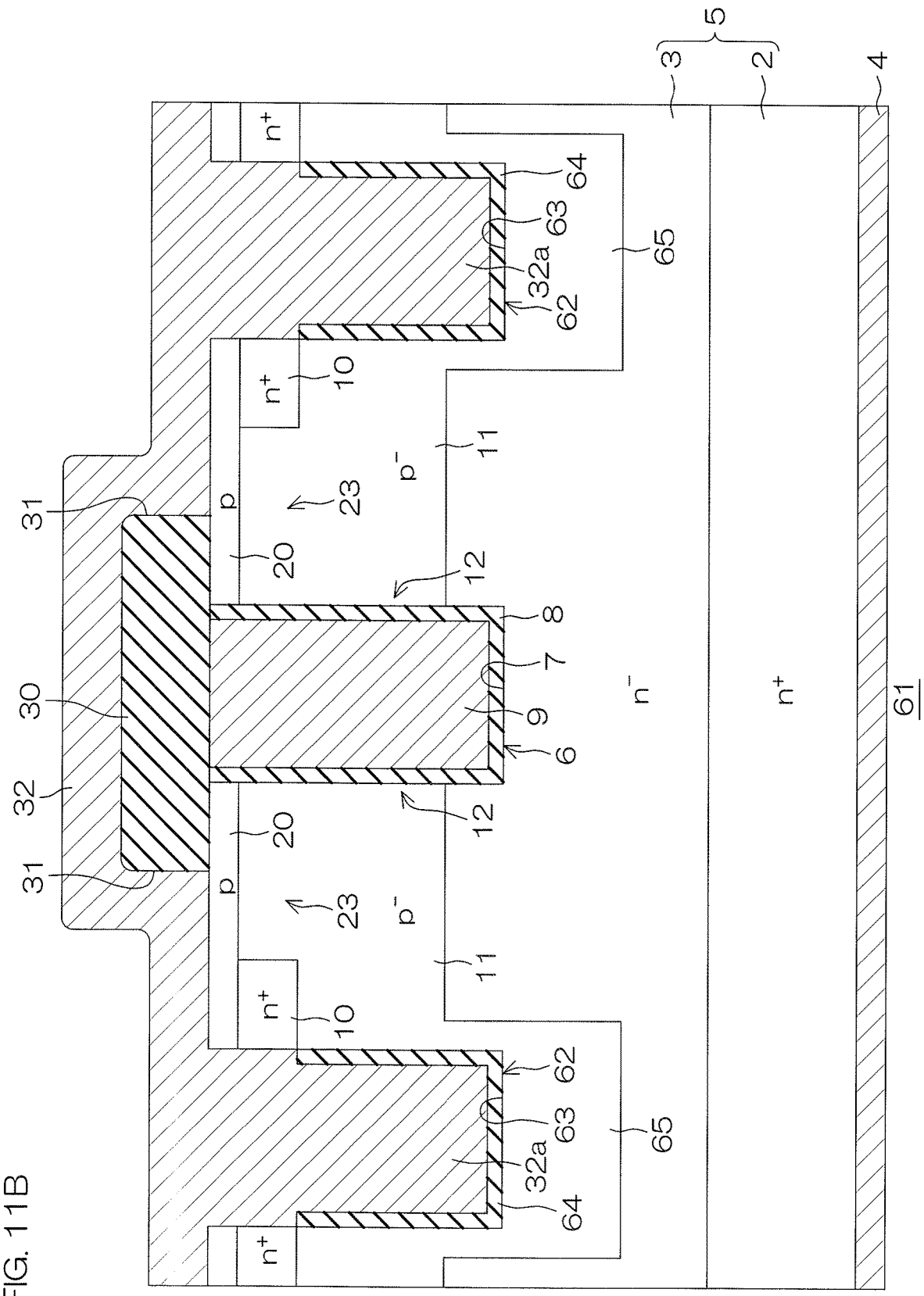
FIG. 11B is a sectional view taken along line XIB-XIB shown in FIG. 10.

FIG. 10 is a plan view of a semiconductor device 61 according to the third preferred embodiment of the present invention. FIG. 11A is a sectional view taken along line XIA-XIA shown in FIG. 10. FIG. 11B is a sectional view taken along line XIB-XIB shown in FIG. 10. The same reference signs as in the first preferred embodiment described above denote the same components in FIGS. 10, 11A, and 11B, and a description thereof will be omitted.

Referring to FIGS. 10, 11A, and 11B, in this preferred embodiment, the trench gate structures 6 described above and a plurality of trench source structures 62 are formed in the surface layer portion of the SiC epitaxial layer 3. Referring to FIG. 10, the trench gate structures 6 and the trench source structures 62 are indicated by crosshatching.

The trench source structure 62 is formed in a region between one trench gate structure 6 and the other trench gate structure 6 adjacent to each other in the plan view. The trench source structure 62 extends in a band shape along the trench gate structure 6.

Each trench source structure 62 has a structure in which a portion 32a of the source electrode 32 described above is embedded in a source trench 63 formed by selectively digging into the surface layer portion of the SiC epitaxial layer 3. In this preferred embodiment, the portion 32a of the source electrode 32 is embedded in the source trench 63, with a source insulating film 64 interposed between the source electrode 32 and the source trench 63. The trench source structure 62 is formed so as to have a depth $D_{ST}$ almost equal to the depth $D_{GT}$ of the trench gate structure 6.

The source region 10 described above (see the broken line portion in FIG. 10) and the well region 11 are formed on the side of the trench gate structure 6 (a region between the trench gate structure 6 and the trench source structure 62).

The source region 10 extends in a band shape along the same direction as that of the trench gate structure 6 and is formed spaced from the trench gate structure 6. The source region 10 is in contact with the side surface of the trench source structure 62 in the lateral direction parallel to the front surface of the SiC epitaxial layer 3. The source region 10 is in contact with the well region 11 in the depth direction of the SiC epitaxial layer 3.

The well region 11 is formed along the trench gate structure 6 in a region at the side of the rear surface of the semiconductor layer with respect to the source region 10. The well region 11 is formed in such the depth that the boundary portion between the well region 11 and the SiC epitaxial layer 3 is in contact with the side surface of the trench gate structure 6.

The well region 11 is formed in a region between the trench gate structure 6 and the trench source structure 62 adjacent to each other. The well region 11 is shared by the trench gate structure 6 and the trench source structure 62 adjacent to each other. The channel formation region 12 described above is formed in the portion along the side surface of the trench gate structure 6.

In this preferred embodiment, the well region 11 integrally has a source trench side region 65 formed along side and bottom surfaces of the source trench 63 (the trench source structure 62). A bottom portion of the source trench side region 65 is located in a region between the SiC semiconductor substrate 2 and the bottom surface of the trench source structure 62.

The source trench side region 65 may have the p type impurity concentration almost equal to the p type impurity concentration of the well region 11. The p type impurity concentration of the source trench side region 65 may be equal to or more than the p type impurity concentration of the well region 11 or may be equal to or less than the p type impurity concentration of the well region 11.

In the trench source structure 62, the source insulating film 64 is formed so as to cover the SiC epitaxial layer 3 and the well region 11 and expose the source region 10. The portion 32a of the source electrode 32 is electrically connected to the source region 10 exposed from the source trench 63 in the source trench 63.

Referring to FIGS. 10 and 11A, the multilayer region 22 described above is formed in a region between the trench gate structure 6 and the trench source structure 62 in the surface layer portion of the SiC epitaxial layer 3.

More specifically, the multilayer region 22 is formed in a region between the trench gate structure 6 and the source region 10. The multilayer region 22 extends in a band shape along the trench gate structure 6. The multilayer region 22 has the p type impurity region 20 and the n type impurity region 21 described above.

The p type impurity region 20 is formed in the surface layer portion of the SiC epitaxial layer 3 so as to be exposed from the front surface of the SiC epitaxial layer 3. The p type impurity region 20 is formed to be wider than the n type impurity region 21 in the lateral direction parallel to the front surface of the SiC epitaxial layer 3. The p type impurity region 20 covers the source region 10 and the n type impurity region 21.

More specifically, the p type impurity region 20 is in contact with the trench gate structure 6 and the trench source structure 62 in the lateral direction parallel to the front surface of the SiC epitaxial layer 3. Accordingly, the p type impurity region 20 covers the entire source region 10 and the entire n type impurity region 21.

The n type impurity region 21 is formed in a region at the side of the rear surface of the semiconductor layer with respect to the p type impurity region 20 in the surface layer portion of the SiC epitaxial layer 3. The n type impurity region 21 is in contact with the well region 11 in the depth direction of the SiC epitaxial layer 3.

The n type impurity region 21 is in contact with the trench gate structure 6 and the source region 10 in the lateral direction parallel to the front surface of the SiC epitaxial layer 3. The thickness $T_n$ of the n type impurity region 21 is almost equal to the thickness $T_s$ of the source region 10 with regard to the depth direction of the SiC epitaxial layer 3. The width $L_n$ of the n type impurity region 21 is the same as that described in the first preferred embodiment.

In the trench source structure 62, the source insulating film 64 exposes the p type impurity region 20 and the source region 10. Accordingly, the portion 32a of the source electrode 32 is electrically connected to the p type impurity region 20 and the source region 10 in the source trench 63.

Referring to FIGS. 10 and 11B, the contact region 23 described above (see the broken line portions in FIG. 10) is selectively formed in the multilayer regions 22. The p type impurity region 20 is electrically connected to the well region 11 in the contact region 23. This sets the p type impurity region 20 and the well region 11 at the same potential.

Referring to FIGS. 11A and 11B, the surface insulating film 30 described above is formed on the SiC epitaxial layer 3. The surface insulating film 30 has contact holes 31 that selectively expose the p type impurity regions 20. The source electrode 32 described above is formed on the surface insulating film 30.

The MISFET 40 and the JFET 41 described above are formed in the side of the trench gate structure 6. The p-n junction portion is formed between the p type impurity region 20 and the n type impurity region 21. The p-n junction portion is formed between the well region 11 and the n type impurity region 21.

The first depletion layer $DL_1$ is formed from the p-n junction portion formed between the p type impurity region 20 and the n type impurity region 21. The second depletion layer $DL_2$ is formed from the p-n junction portion formed between the well region 11 and the n type impurity region 21.

While the semiconductor device 61 is in the non-short circuit state, the first depletion layer $DL_1$ and the second depletion layer $DL_2$ hardly extend into the n type impurity region 21. This forms a relatively wide current path between the drain electrode 4 and the source electrode 32. In the non-short circuit state, therefore, the current flowing in the n type impurity region 21 is hardly blocked by the first depletion layer $DL_1$ and the second depletion layer $DL_2$.

On the other hand, while the semiconductor device 61 is in the short circuit state, the first depletion layer $DL_1$ extends from the p-n junction portion formed between the p type impurity region 20 and the n type impurity region 21 into the n type impurity region 21. The first depletion layer $DL_1$ extends from the p-n junction portion formed between the well region 11 and the n type impurity region 21 into the n type impurity region 21.

The first depletion layer $DL_1$ and the second depletion layer $DL_2$ extend into the n type impurity region 21 in the same mode as in the semiconductor device 1 described above. Accordingly, while the semiconductor device 61 is in the short circuit state, the first depletion layer $DL_1$ and the second depletion layer $DL_2$ reduce the area of the current path in the n type impurity region 21. This blocks the flow of the short-circuit current $I_D$ in the n type impurity region 21 in the short circuit state.

Figure 12:
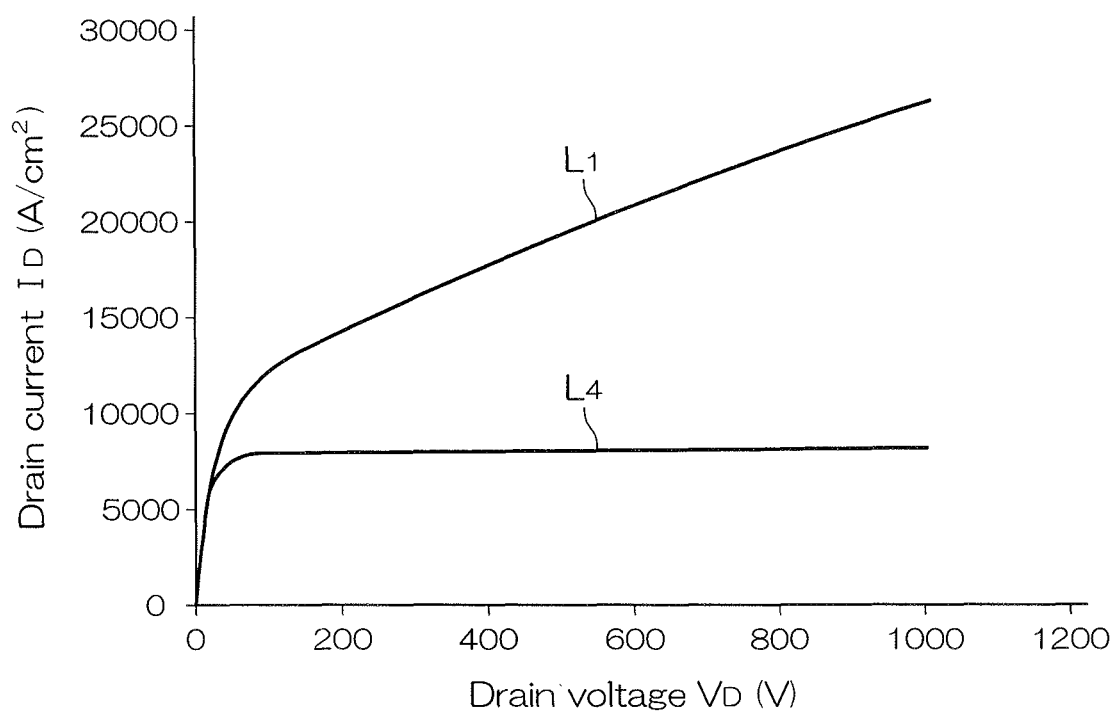
FIG. 12 is a graph showing drain current-drain voltage characteristics.

FIG. 12 shows the drain current $I_D$—drain voltage $V_D$ characteristics of the semiconductor device 61 according to this preferred embodiment. The graph of FIG. 12 corresponds to the graph of FIG. 6 described above. FIG. 12 shows a curve $L_4$ and the curve $L_1$ described above. The curve $L_4$ represents the drain current $I_D$—drain voltage $V_D$ characteristics of the semiconductor device 61 according to the preferred embodiment.

The curve $L_4$ in FIG. 12 indicates that the semiconductor device 61 according to this preferred embodiment has almost the same drain current $I_D$—drain voltage $V_D$ characteristics as that of the semiconductor device 1 described above (see also FIG. 6).

As described above, in the semiconductor device 61 according to this preferred embodiment, a current constriction portion (that is, the JFET 41) is formed in a region between the channel formation region 12 (the well region 11) and the source region 10. When the short circuit state is set, the current constriction portion narrows the current path.

When the short circuit state is switched to the non-short circuit state, the current constriction portion expands the current path.

This makes it possible to reduce the short-circuit current $I_D$ in the short circuit state. Accordingly, Joule heat due to the short-circuit voltage $V_D$ and the short-circuit current $I_D$ can be reduced. On the other hand, in the non-short circuit state, since the current path is hardly narrowed, it is possible to suppress an increase in ON resistance due to the current constriction portion. This makes it possible to provide the semiconductor device 51 that can suppress an increase in ON resistance and achieve a high short circuit tolerance.

Next, an example of a manufacturing method for the semiconductor device 61 will be described. FIGS. 13A to 13F are sectional views showing a manufacturing method for the semiconductor device 61 shown in FIG. 10. FIGS. 13A to 13F are sectional views of a region corresponding to FIG. 11A.

Figure 13A:
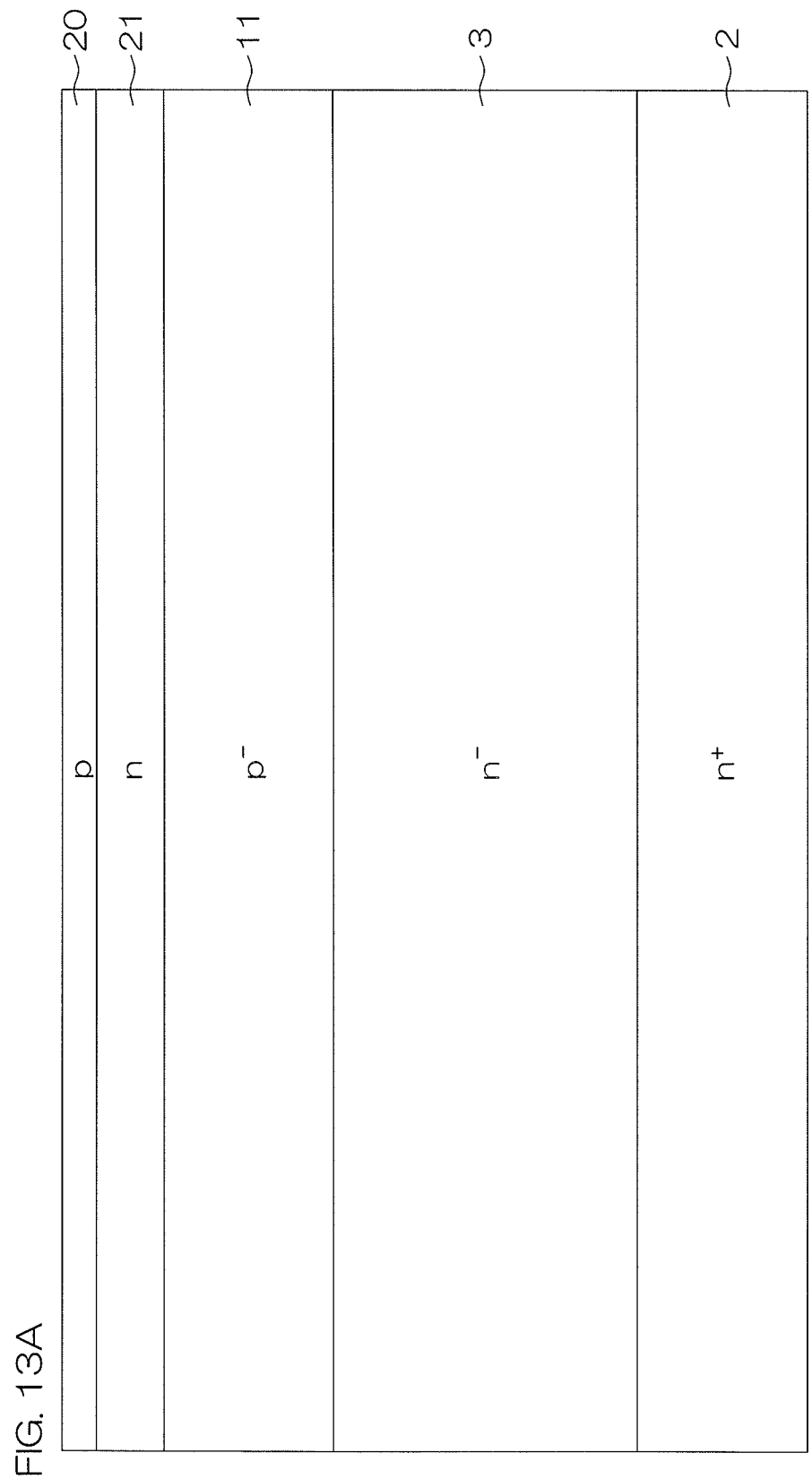
FIG. 13A is a sectional view showing a manufacturing method for the semiconductor device shown in FIG. 10.

First, referring to FIG. 13A, the SiC semiconductor substrate 2 is prepared. Next, SiC is epitaxially grown from the front surface of the SiC semiconductor substrate 2. This forms the SiC epitaxial layer 3 on the SiC semiconductor substrate 2.

Next, the well region 11, the p type impurity region 20, and the n type impurity region 21 are formed in the surface layer portion of the SiC epitaxial layer 3.

The well region 11 is formed by implanting the n type impurity into the surface layer portion of the SiC epitaxial layer 3. N type impurity implantation is performed via an ion implantation mask (not shown) that selectively has openings at regions in which the well regions 11 should be formed.

The p type impurity region 20 is formed by implanting the p type impurity into the surface layer portion of the SiC epitaxial layer 3. P type impurity implantation is performed via an ion implantation mask (not shown) that selectively has openings at regions in which the p type impurity regions 20 should be formed.

The n type impurity region 21 is formed by implanting the n type impurity into the surface layer portion of the SiC epitaxial layer 3. N type impurity implantation is performed via an ion implantation mask (not shown) that selectively has openings at regions in which the n type impurity regions 21 should be formed.

Next, referring to FIG. 13B, a hard mask 50 is formed on the front surface of the SiC epitaxial layer 3. The hard mask 50 has openings 50a and openings 50b. The openings 50a selectively expose regions in which the gate trenches 7 should be formed. The openings 50b selectively expose regions in which the source trenches 63 should be formed.

Next, the surface layer portion of the SiC epitaxial layer 3 is selectively removed by an etching method via the hard mask 50. This forms the plurality of gate trenches 7 and the plurality of source trenches 63. After the gate trenches 7 and the source trenches 63 are formed, the hard mask 50 is removed.

Next, referring to FIG. 13C, the p type impurity is selectively implanted into the SiC epitaxial layer 3 that is exposed from a bottom portion of the source trench 63. This forms the source trench side region 65 as the portion of the well region 11. The source trench side regions 65 are formed by, for example, implanting the p type impurity via an ion implantation mask (not shown) selectively having openings corresponding to regions in which the source trench side regions 65 should be formed.

Next, the gate insulating film 8 made of silicon oxide is formed on the inner wall surface of the gate trench 7 and the source insulating film 64 made of silicon oxide is formed on the inner wall surface of the source trench 63 by, for example, a thermal oxidation method. The gate insulating film 8 and the source insulating film 64 may be formed by a CVD method. In this case, an insulating material (for example, silicon oxide and/or silicon nitride) is deposited on the inner wall surface of the gate trench 7 and the inner wall surface of the source trench 63.

Next, an electrode material (for example, polysilicon) is deposited to fill the gate trench 7 and cover the SiC epitaxial layer 3 by, for example, a CVD method. This forms an electrode material layer covering the SiC epitaxial layer 3.

Next, the electrode material layer is selectively removed by an etched back method. This forms the gate electrode 9 by the electrode material layer in the gate trench 7.

Figure 13D:
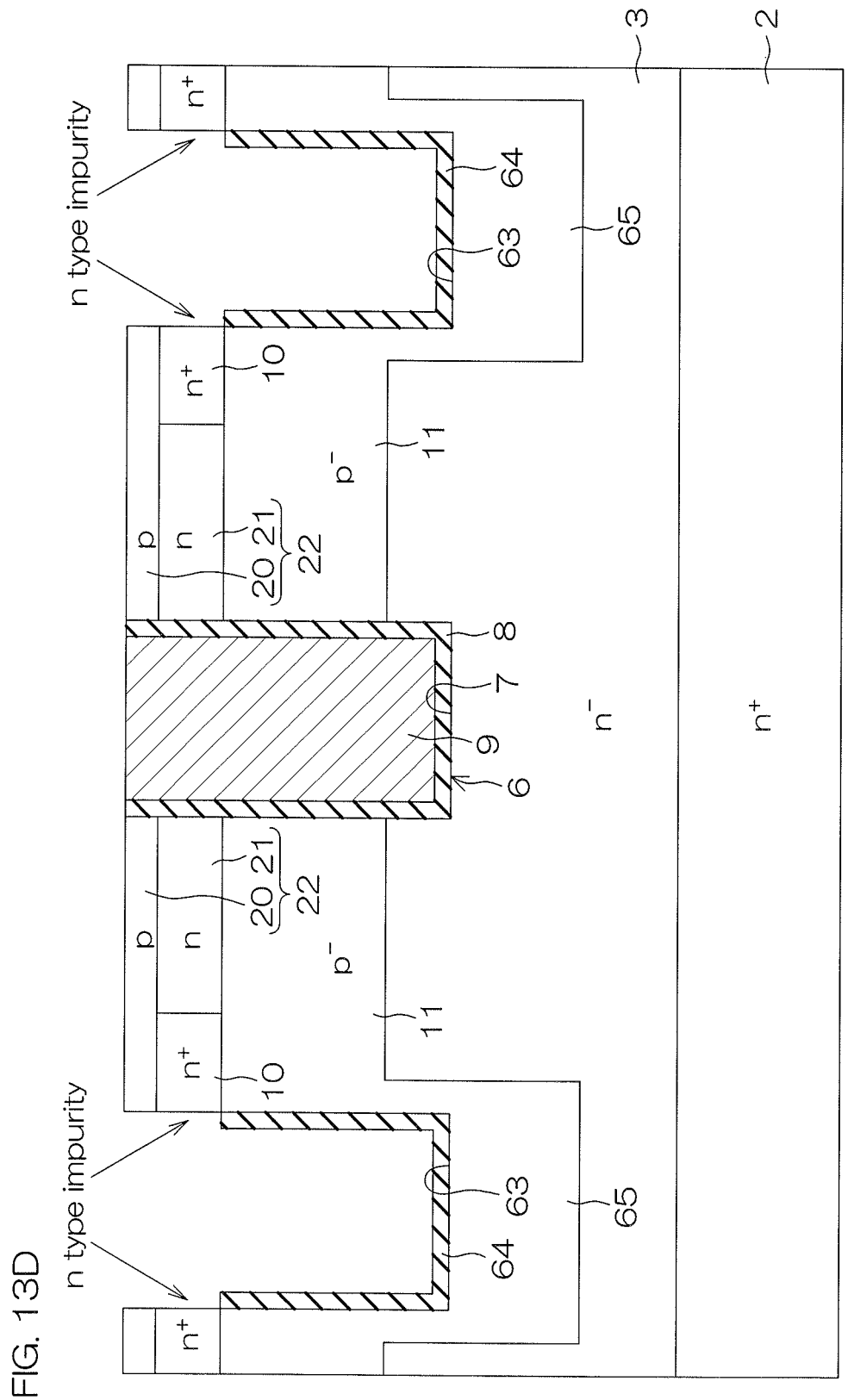
FIG. 13D is a sectional view showing a step after FIG. 13C.

Next, referring to FIG. 13D, a portion of the source insulating film 64 formed on the inner wall surface of the source trench 63 is selectively removed by, for example, an etching back method.

Next, the n type impurity is implanted into the inner wall surface of the source trench 63 which is exposed from the source insulating film 64 by an oblique irradiation method. This forms the source region 10 exposed from the inner wall surface of the source trench 63. Oblique irradiation/implantation of the n type impurity can effectively suppress the positional deviation of the source region 10 relative to the source trench 63. This makes it possible to form the MISFET 40 and the JFET 41 having good switching characteristics.

Figure 13E:
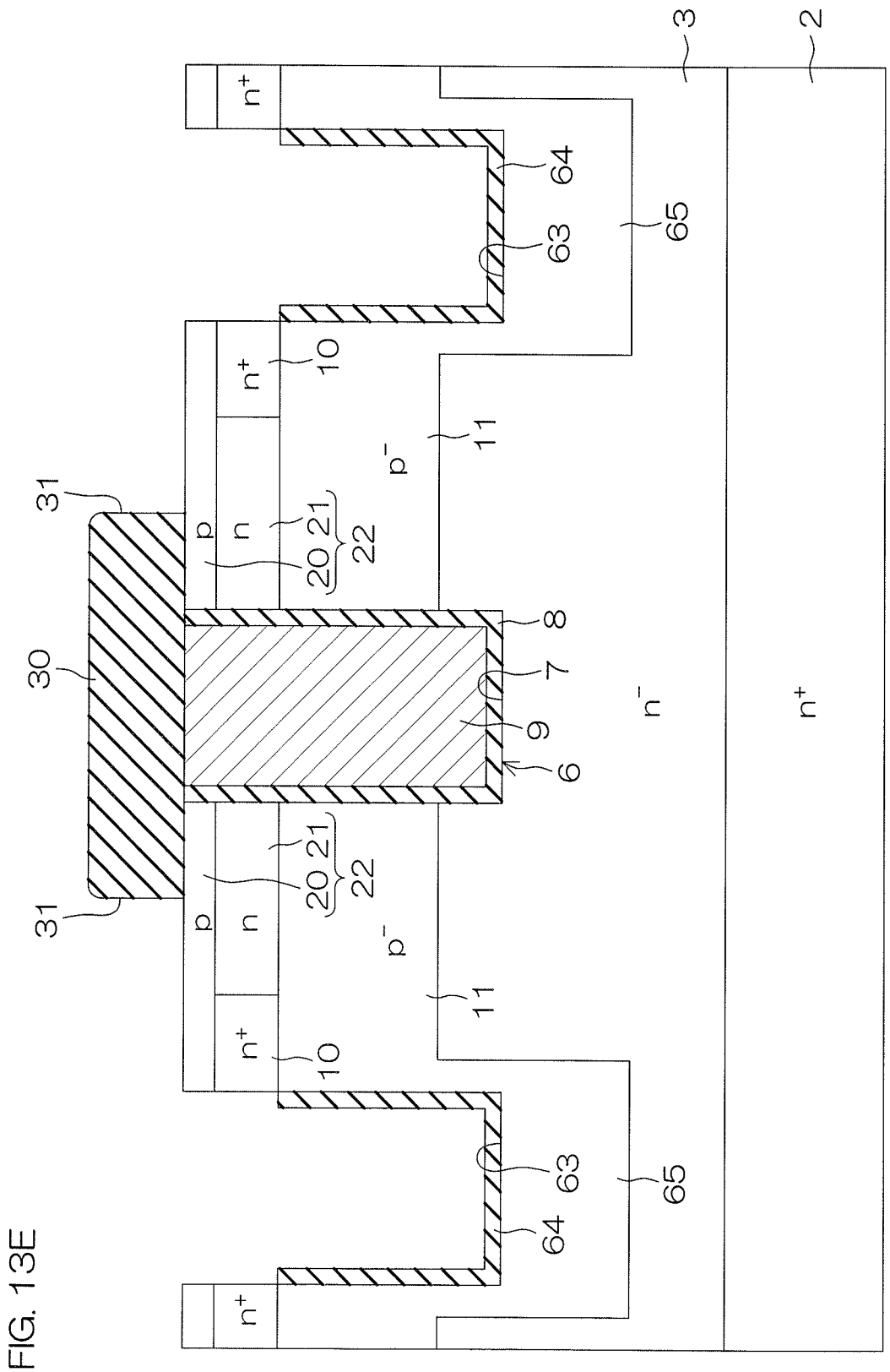
FIG. 13E is a sectional view showing a step after FIG. 13D.

Next, referring to FIG. 13E, an insulating material (silicon oxide in this preferred embodiment) is deposited on the SiC epitaxial layer 3 by, for example, a CVD method. This forms the surface insulating film 30 on the SiC epitaxial layer 3.

Next, the surface insulating film 30 is selectively removed by, for example, an etching method. With this process, the contact holes 31 that selectively expose the p type impurity region 20 are formed in the surface insulating film 30.

Figure 13F:
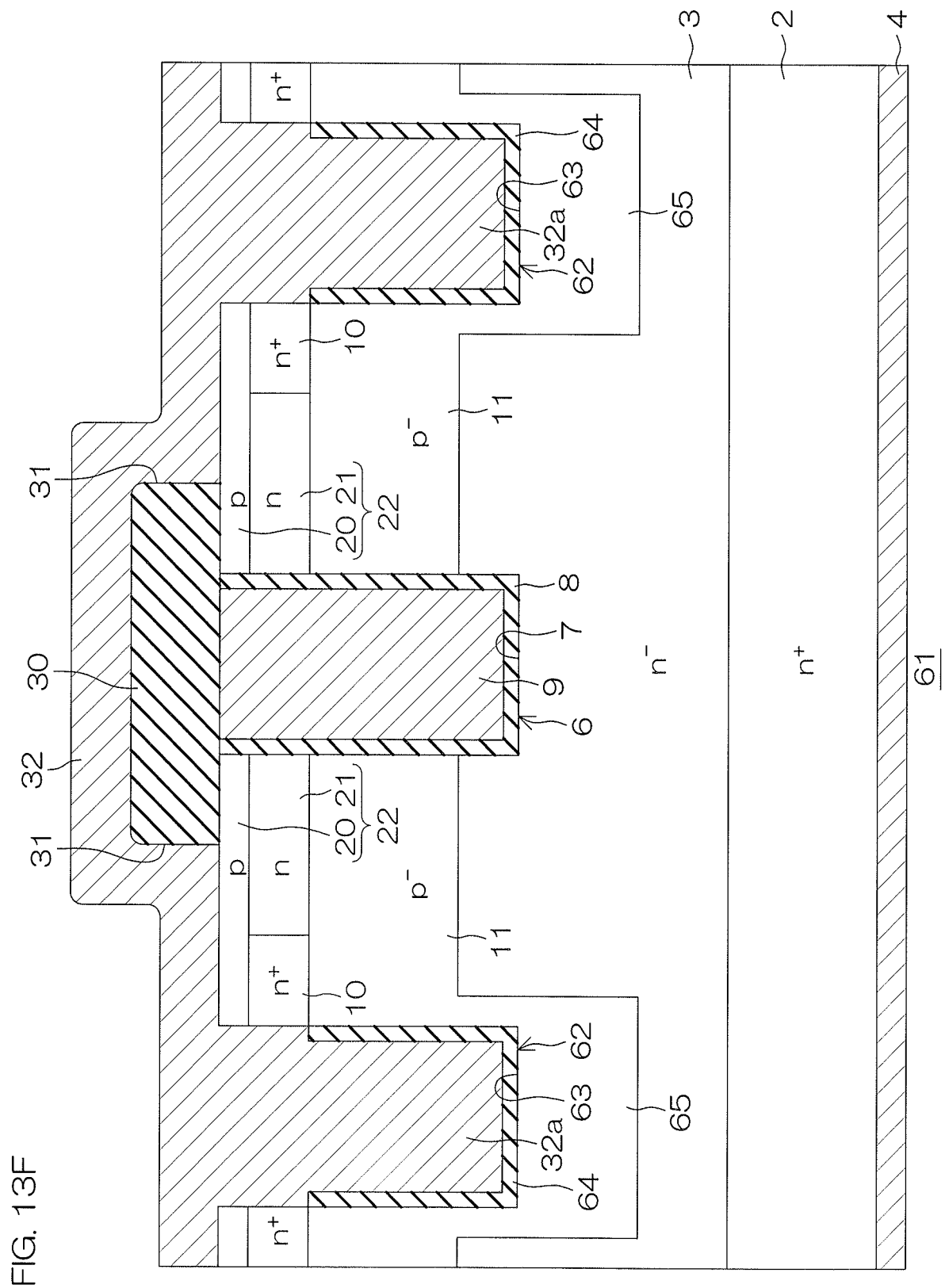
FIG. 13F is a sectional view showing a step after FIG. 13E.

Next, referring to FIG. 13F, an electrode material (for example, copper, aluminum and/or titanium) is deposited to fill the source trench 63 and cover the surface insulating film 30 by, for example, a plating method or a sputtering method. This forms the source electrode 32.

The drain electrode 4 is formed by depositing an electrode material (for example, copper, aluminum and/or titanium) on the rear surface of the SiC semiconductor substrate 2 by, for example, a plating method or a sputtering method. The semiconductor device 61 is manufactured thorough the steps described above.

Fourth Preferred Embodiment

Figure 14:
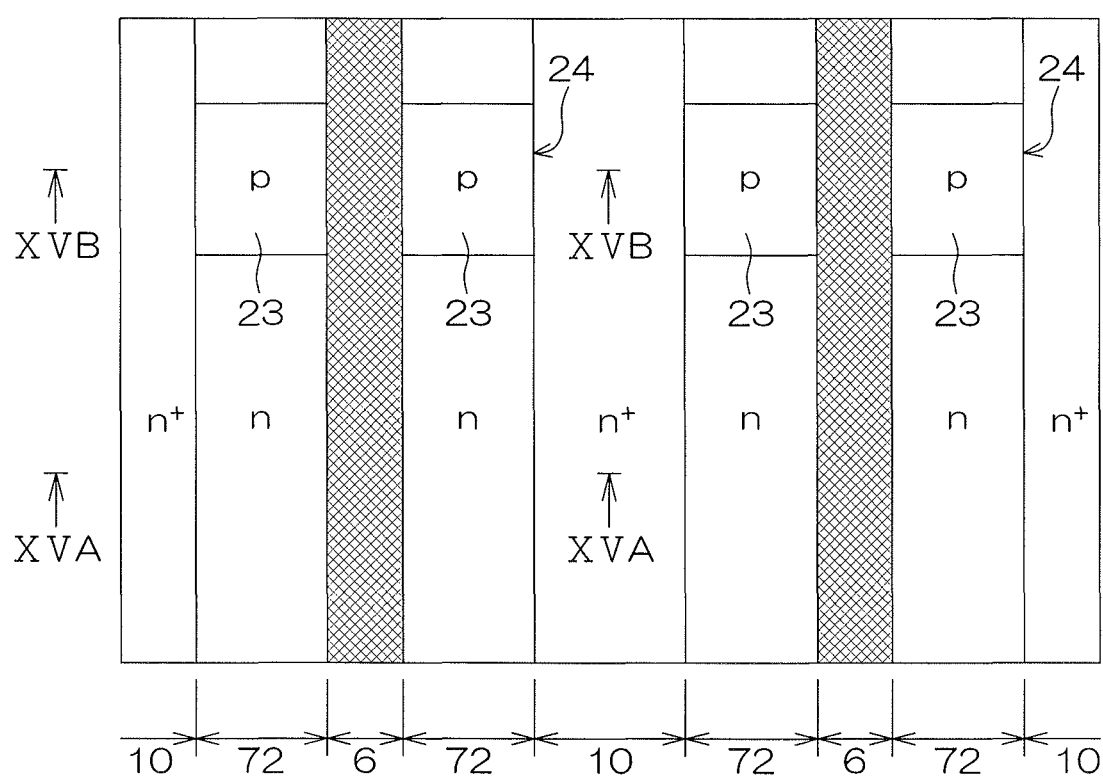
FIG. 14 is a plan view of a semiconductor device according to a fourth preferred embodiment of the present invention.
Figure 15A:
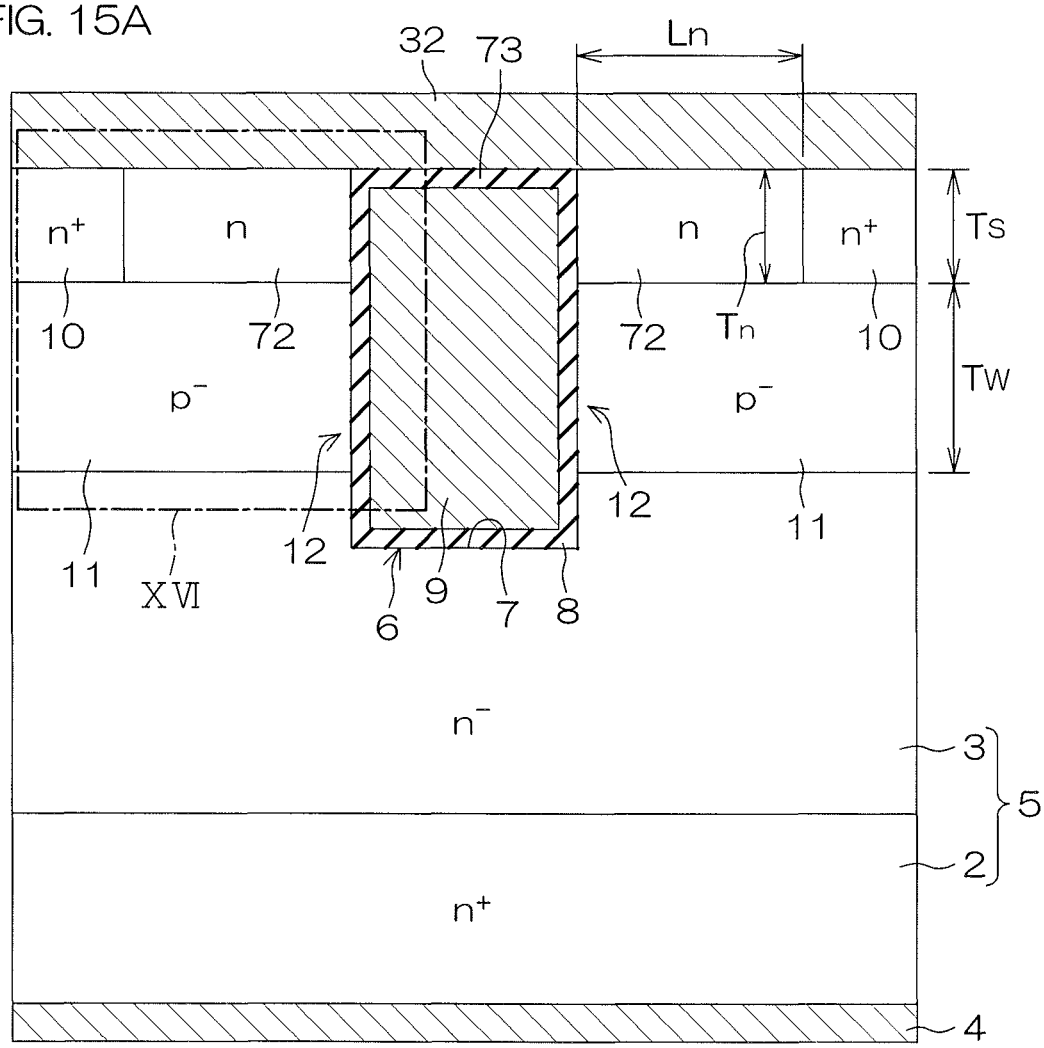
FIG. 15A is a sectional view taken along line XVA-XVA shown in FIG. 14.

FIG. 14 is a plan view of a semiconductor device 71 according to the fourth preferred embodiment of the present invention. FIG. 15A is a sectional view taken along line XVA-XVA shown in FIG. 14. FIG. 15B is a sectional view taken along line XVB-XVB shown in FIG. 14. The same reference signs as in the first preferred embodiment described above denote the same components in FIGS. 14, 15A, and 15B, and a description thereof will be omitted.

Referring to FIGS. 14 and 15A, the semiconductor device 71 according to this preferred embodiment includes an n type impurity region 72. The n type impurity region 72 is formed in the surface layer portion of the well region 11 so as to be exposed from the front surface of the SiC epitaxial layer 3. The n type impurity region 72 forms a p-n junction portion with the well region 11.

The n type impurity region 72 is formed in a region between the trench gate structure 6 and the source region 10, and extends in a band shape along the trench gate structure 6. Then type impurity region 72 is in contact with side surfaces of the source region 10 and the trench gate structure 6 in the lateral direction parallel to the front surface of the SiC epitaxial layer 3. The n type impurity region 72 is connected to the well region 11 in the depth direction of the SiC epitaxial layer 3.

With regard to the depth direction of the SiC epitaxial layer 3, a thickness $T_n$ of the n type impurity region 72 is almost equal to the thickness $T_s$ of the source region 10. The n type impurity concentration of the n type impurity region 72 is higher than the n type impurity concentration of the SiC epitaxial layer 3 and is lower than the n type impurity concentration of the source region 10.

The thickness $T_n$ of the n type impurity region 72 is, for example, 0.1 μm or more and 0.2 μm or less (about 0.15 μm in this preferred embodiment). A width $L_n$ of the n type impurity region 72 is the same as that described in the first preferred embodiment.

The n type impurity concentration of the n type impurity region 72 is, for example, $1.0 \times 10^{17}$ cm$^{-3}$ or more and $1.0 \times 10^{19}$ cm$^{-3}$ or less (about $1.0 \times 10^{18}$ cm$^{-3}$ in this preferred embodiment).

Referring to FIGS. 14 and 15B, the contact region 23 described above is selectively formed in the multilayer region 22. The p type impurity region 20 is electrically connected to the well region 11 in the contact region 23. This sets the p type impurity region 20 and the well region 11 at the same potential.

Referring to FIGS. 15A and 15B, a front surface of the gate electrode 9 embedded in the gate trench 7 is covered by a surface insulating film 73 formed in the gate trench 7. This preferred embodiment exemplifies a case in which the front surface of the surface insulating film 73 and the front surface of the SiC epitaxial layer 3 are flat with respect to each other (more specifically, flush with each other) to form one front surface. The surface insulating film 30 described above (see FIG. 2A, etc.) may be used in place of the surface insulating film 73.

Referring to FIGS. 15A and 15B, the source electrode 32 described above is formed on the front surface of the SiC epitaxial layer 3 so as to cover the surface insulating film 73.

The source electrode 32 is electrically connected to the source region 10 and the n type impurity region 72. The source electrode 32 forms a Schottky junction with the n type impurity region 72, and forms an ohmic junction with the source region 10.

Figure 16:
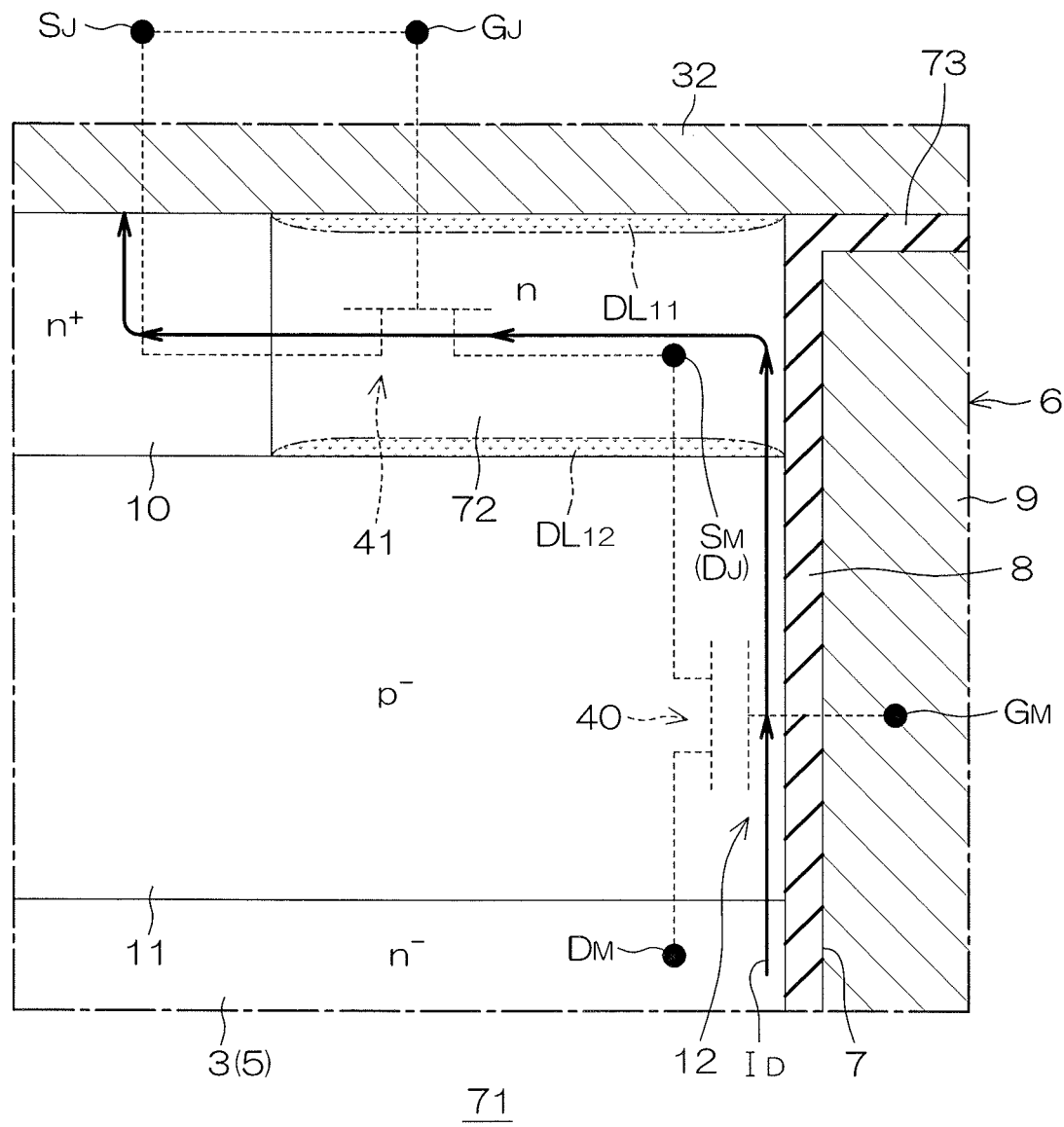
FIG. 16 is an enlarged view of the region surrounded by the broken line XVI shown in FIG. 15A.
Figure 17:
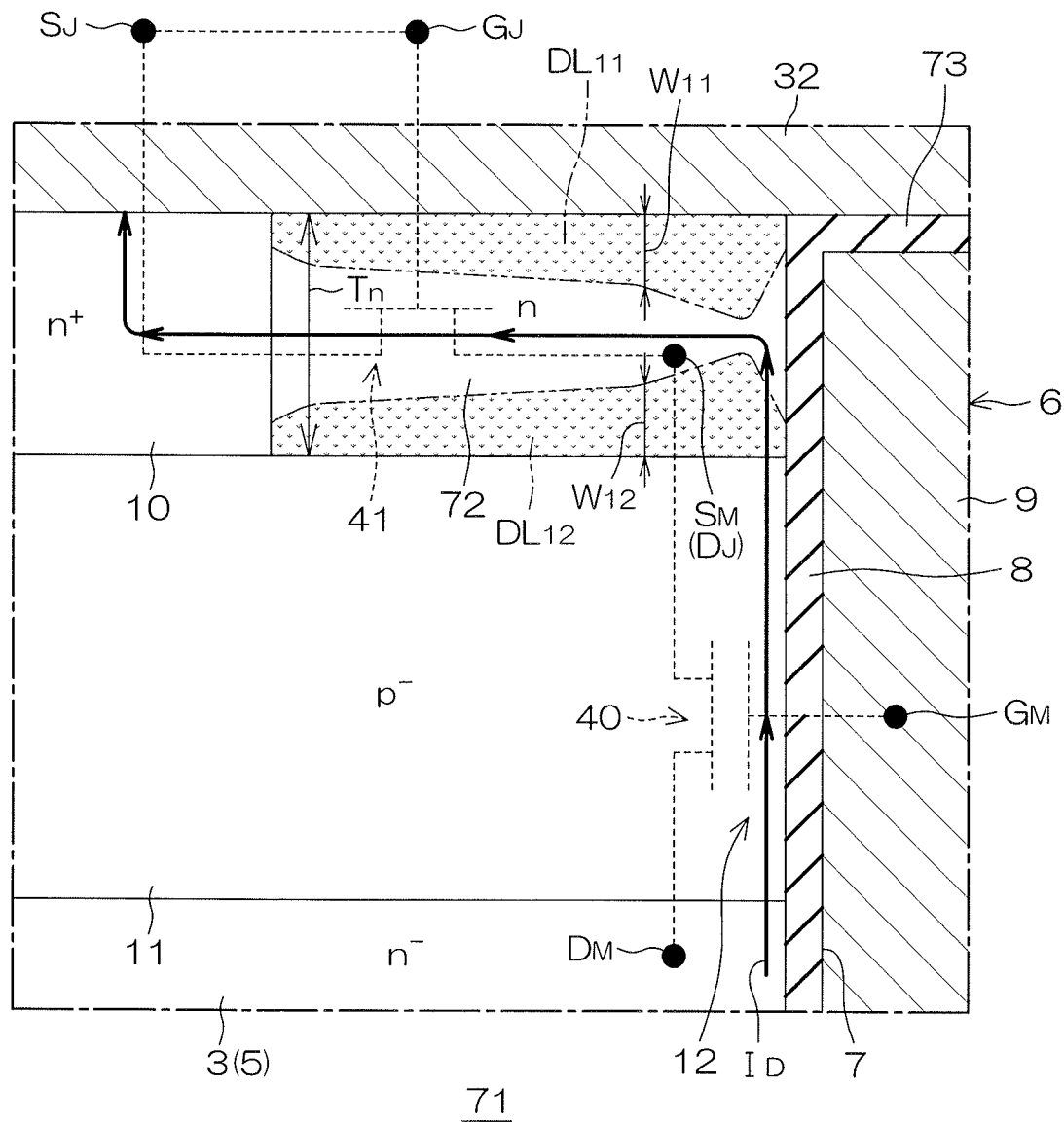
FIG. 17 is an enlarged view of a region corresponding to FIG. 16, showing a case in which a short circuit state is set.

Next, the electrical structure of the semiconductor device 71 will be described with reference to FIGS. 16 and 17. FIG. 16 is an enlarged view of the region surrounded by the broken line XVI shown in FIG. 15A, showing a case in which a non-short circuit state is set. FIG. 17 is an enlarged view of a region corresponding to FIG. 16, showing a case in which a short circuit state is set.

Referring to FIGS. 16 and 17, the MISFET 40 and the JFET 41 are formed in the side of the trench gate structure 6. Referring to FIGS. 16 and 17, the MISFET 40 and the JFET 41 are indicated by the broken lines.

The MISFET 40 is formed by the SiC epitaxial layer 3 (the drain region 5), the trench gate structure 6 (the gate electrode 9), and the source region 10 (the more specifically, the n type impurity region 72 electrically connected to the source region 10).

For the sake of descriptive convenience, FIGS. 16 and 17 each show the gate terminal $G_M$, the drain terminal $D_M$, and the source terminal $S_M$ of the MISFET 40 respectively at the trench gate structure 6 (the gate electrode 9), the SiC epitaxial layer 3 (the drain region 5), and the n type impurity region 72.

The JFET 41 is formed by the source region 10, the well region 11, and the n type impurity region 72 and the source electrode 32 that forms the Schottky junction with the n type impurity region 72. The source electrode 32 and the well region 11 are set at the same potential and constitute the gate of the JFET 41.

For the sake of descriptive convenience, FIGS. 16 and 17 show the gate terminal $G_J$, the drain terminal $D_J$, and the source terminal $S_J$ of the JFET 41 respectively at the source electrode 32, the n type impurity region 72, and the source region 10.

The source terminal $S_M$ of the MISFET 40 is electrically connected to the drain terminal $D_J$ of the JFET 41. This forms the series circuit including the MISFET 40 and the JFET 41. The gate terminal $G_J$ and the source terminal $S_J$ of the JFET 41 are short-circuited by the source electrode 32.

When the predetermined driving voltage is applied to the gate electrode 9, the channel is formed in the channel formation region 12. This turns on the semiconductor device 71, and the current $I_D$ flows from the drain electrode 4 into the source electrode 32 via the SiC epitaxial layer 3, the well region 11 (the channel formation region 12), the n type impurity region 72, and the source region 10. On the other hand, when the semiconductor device 71 is in the OFF state, no channel is formed in the channel formation region 12, and hence the current $I_D$ does not flow between the drain electrode 4 and the source electrode 32.

Referring to FIGS. 16 and 17, the Schottky junction is formed between the source electrode 32 and the n type impurity region 72. A first depletion layer $DL_{11}$ is formed by the Schottky junction formed between the source electrode 32 and the n type impurity region 72.

The p-n junction portion is formed between the well region 11 and then type impurity region 72. A second depletion layer $DL_{12}$ is formed by the p-n junction portion formed between the well region 11 and the n type impurity region 72.

Referring to FIG. 16, while the semiconductor device 71 is in the non-short circuit state, the first depletion layer $DL_{11}$ and the second depletion layer $DL_{12}$ hardly extend into the n type impurity region 72. This forms a relatively wide current path between the drain electrode 4 and the source electrode 32. In the non-short circuit state, therefore, the first depletion layer $DL_{11}$ and the second depletion layer $DL_{12}$ hardly block a current flowing in the n type impurity region 72.

On the other hand, referring to FIG. 17, while the semiconductor device 71 is in the short circuit state, the first depletion layer $DL_{11}$ extends from the Schottky junction portion formed between the source electrode 32 and the n type impurity region 72 into the n type impurity region 72. The second depletion layer $DL_{12}$ extends from the p-n j unction portion formed between the well region 11 and the n type impurity region 72 into the n type impurity region 72.

A width $W_{11}$ of the first depletion layer $DL_{11}$ gradually increases from the side of the source region 10 to the side of the trench gate structure 6. Accordingly, the width $W_{11}$ of the first depletion layer $DL_{11}$ at the side of the trench gate structure 6 is relatively larger than the width $W_{11}$ of the first depletion layer $DL_{11}$ at the side of the source region 10.

Likewise, a width $W_{12}$ of the second depletion layer $DL_{12}$ gradually increases from the side of the source region 10 to the side of the trench gate structure 6. Accordingly, the width $W_{12}$ of the second depletion layer $DL_{12}$ at the side of the trench gate structure 6 is relatively larger than the width $W_{12}$ of the second depletion layer $DL_{12}$ at the side of the source region 10.

While the semiconductor device 71 is in the short circuit state, the first depletion layer $DL_{11}$ and the second depletion layer $DL_{12}$ reduce the area of the current path formed in the n type impurity region 72. In this state, in the n type impurity region 72, the area of the current path formed in the side of the channel formation region 12 is smaller than the area of the current path formed in the side of the source region 10. As described above, while the semiconductor device 71 is in the short circuit state, since the area of the current path formed in the n type impurity region 72 is narrowed, the flow of the current $I_D$ is blocked.

In one mode, the well region 11 and the n type impurity region 72 may be formed so as to satisfy the equation $T_n > W_{11} + W_{12}$, where $T_n$ is the thickness of the n type impurity region 72, $W_{11}$ is the width of the first depletion layer $DL_{11}$, and $W_2$ is the width of the second depletion layer $DL_{12}$.

In another mode, the well region 11 and the n type impurity region 72 may be formed so as to satisfy the equation $T_n \leq W_{11} + W_{12}$, where $T_n$ is the thickness of the n type impurity region 72, $W_{11}$ is the width of the first depletion layer $DL_{11}$, and $W_{12}$ is the width of the second depletion layer $DL_{12}$.

In another mode, since the first depletion layer $DL_{11}$ and the second depletion layer $DL_{12}$ overlap each other in the n type impurity region 72, the flow of the short-circuit current $I_D$ can be effectively blocked. The one mode and the other mode may be combined to form the well region 11 and the n type impurity region 72 so as to include a portion satisfying the equation $T_n > W_{11} + W_{12}$ and a portion satisfying the equation $T_n \leq W_{11} + W_{12}$.

As described above, in the semiconductor device 71 according to this preferred embodiment, a current constriction portion (that is, the JFET 41) is formed in a region between the channel formation region 12 (the well region 11) and the source region 10. The current constriction portion narrows the current path when the short circuit state is set, and expands the current path when the short circuit state is switched to the non-short circuit state.

This can reduce the short-circuit current $I_D$ in the short circuit state, and hence can reduce Joule heat due to the short-circuit voltage $V_D$ and the short-circuit current $I_D$. On the other hand, in the non-short circuit state, since the current path is hardly narrowed, an increase in ON resistance due to the current constriction portion can be suppressed. This makes it possible to provide the semiconductor device 71 that can suppress an increase in ON resistance and achieve a high short circuit tolerance.

In the semiconductor device 71 according to this preferred embodiment, the first depletion layer $DL_{11}$ is formed by the Schottky junction portion between the source electrode 32 and the n type impurity region 72. Therefore, unlike in each preferred embodiment described above, there is no need to form the p type impurity region 20. This can reduce the number of steps, and hence can provide the inexpensive semiconductor device 71.

Next, an example of a manufacturing method for the semiconductor device 71 will be described. FIGS. 18A to 18F are sectional views showing the manufacturing method for the semiconductor device 71 shown in FIG. 14. FIGS. 18A to 18F each are a sectional view of a region corresponding to FIG. 15A.

Figure 18A:
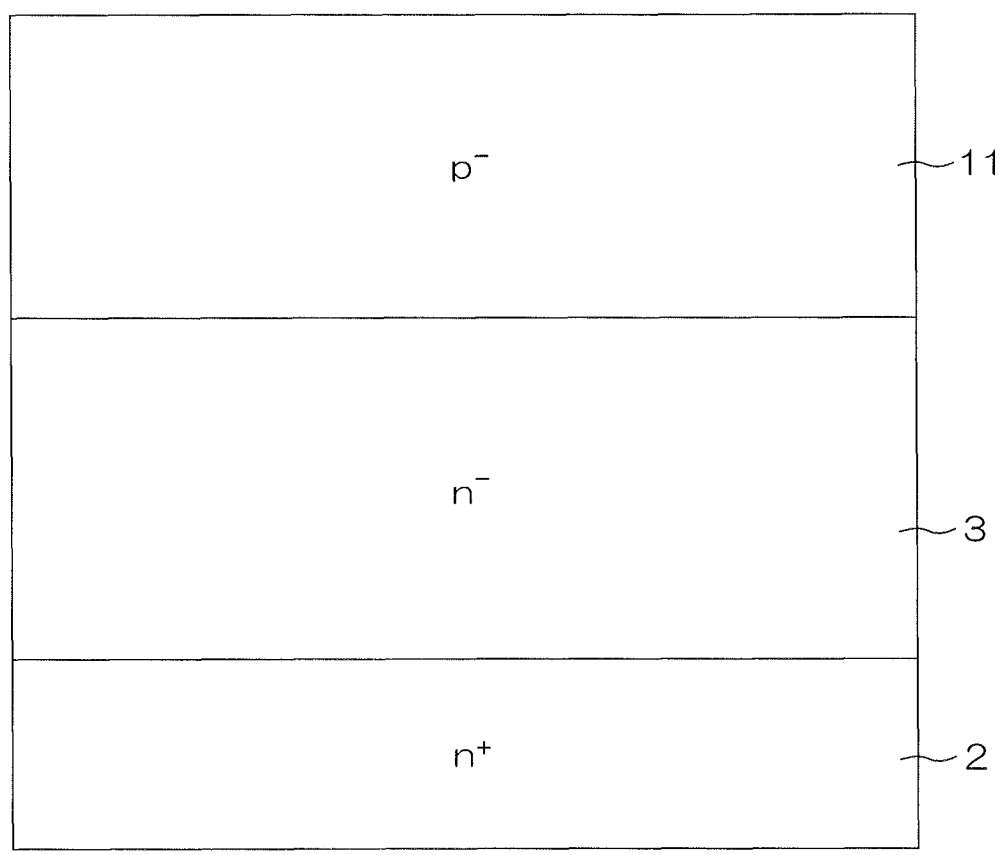
FIG. 18A is a sectional view showing a manufacturing method for the semiconductor device shown in FIG. 14.

First, referring to FIG. 18A, the SiC semiconductor substrate 2 is prepared. Next, SiC is epitaxially grown from the front surface of the SiC semiconductor substrate 2. This forms the SiC epitaxial layer 3 on the SiC semiconductor substrate 2.

Next, the p type impurity is implanted into the surface layer portion of the SiC epitaxial layer 3. P type impurity implantation is performed via an ion implantation mask (not shown) that selectively has openings at regions in which the well regions 11 should be formed and is formed on the front surface of the SiC epitaxial layer 3. This forms the well regions 11 in the surface layer portion of the SiC epitaxial layer 3. After the well regions 11 are formed, the ion implantation mask is removed.

Next, referring to FIG. 18B, a hard mask 50 is formed on the front surface of the SiC epitaxial layer 3. The hard mask 50 selectively has openings 50a at regions in which the gate trenches 7 should be formed.

Next, the surface layer portion of the semiconductor layer is selectively removed by an etching method via the hard mask 50. This forms the plurality of gate trenches 7. After the formation of the gate trenches 7, the hard mask 50 is removed.

Figure 18C:
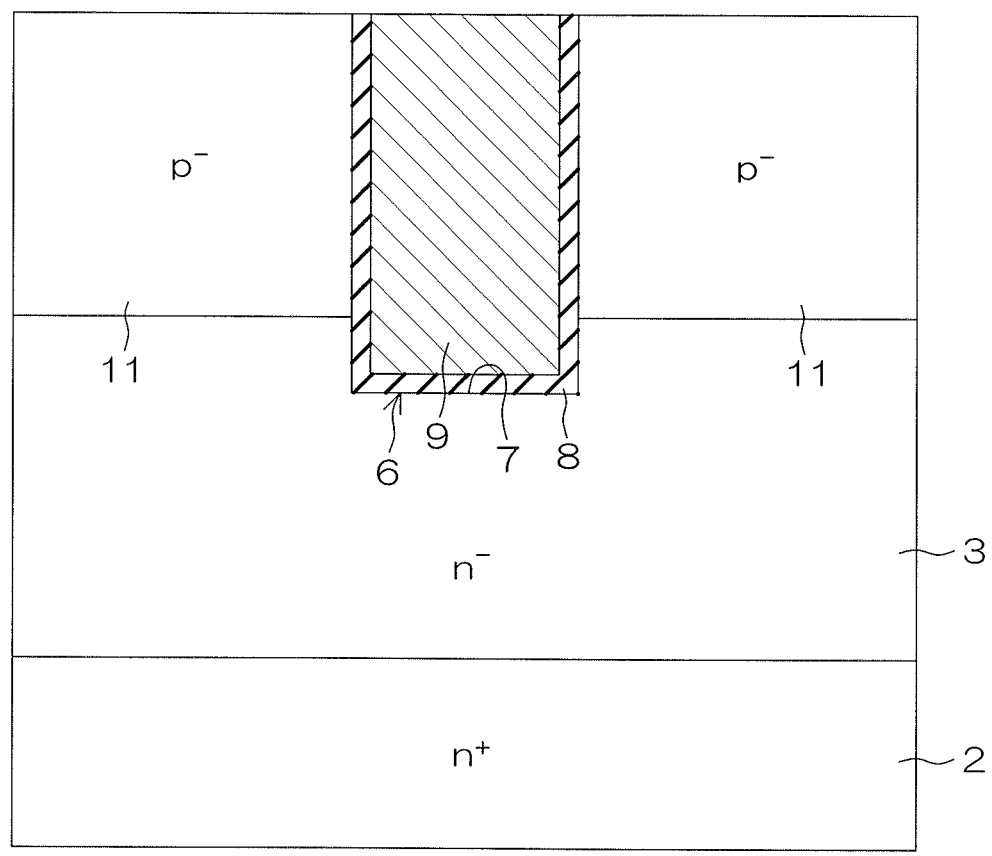
FIG. 18C is a sectional view showing a step after FIG. 18B.

Next, referring to FIG. 18C, the gate insulating film 8 made of silicon oxide is formed on the inner wall surface of the gate trench 7 by, for example, a thermal oxidation method. The gate insulating film 8 may be formed by depositing an insulting material (for example, silicon oxide and/or silicon nitride) on the inner wall surface of the gate trench 7 by, for example, a CVD method.

Next, an electrode material (for example, polysilicon) is deposited to fill the gate trench 7 so as to cover the SiC epitaxial layer 3 by, for example, a CVD method. This forms an electrode material layer covering the SiC epitaxial layer 3.

Next, the electrode material layer is selectively removed by an etched back method. This forms the gate electrode 9 made of the electrode material layer in the gate trench 7.

Figure 18D:
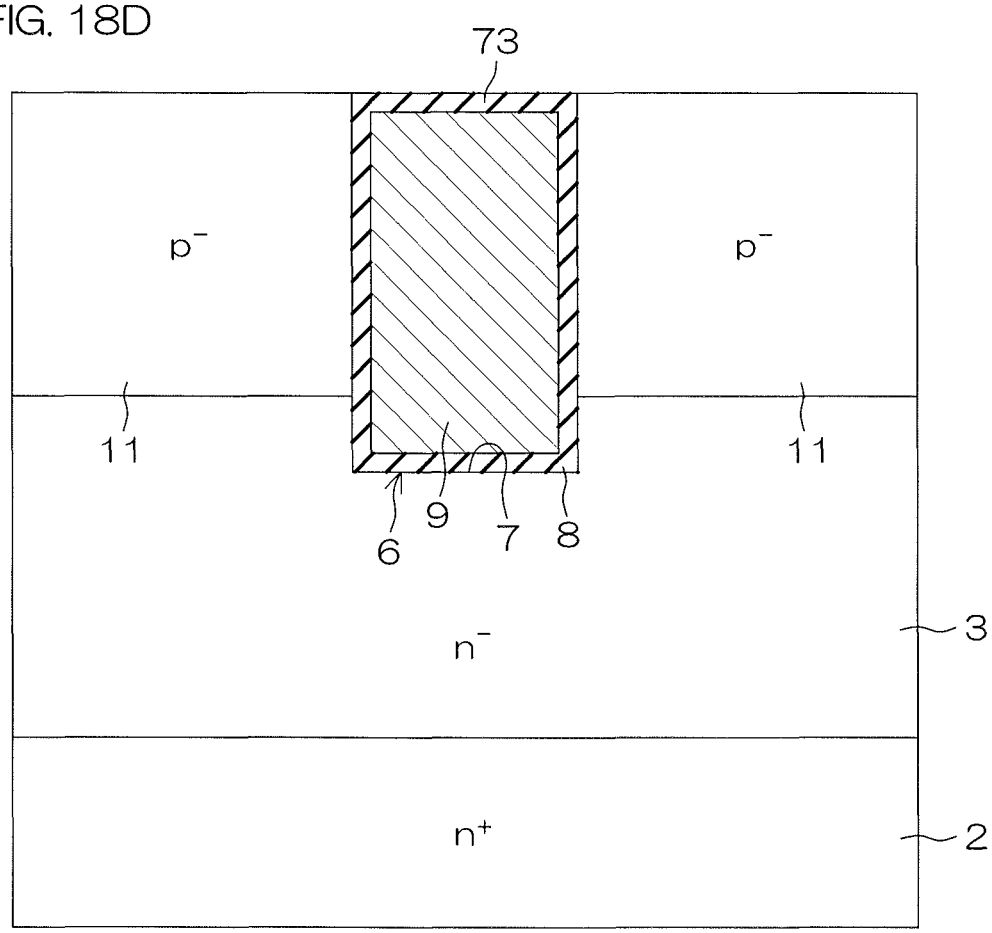
FIG. 18D is a sectional view showing a step after FIG. 18C.

Next, referring to FIG. 18D, the front surface of the gate electrode 9 which is exposed from the gate trench 7 is selectively oxidized. This forms the surface insulating film 73.

Figure 18E:
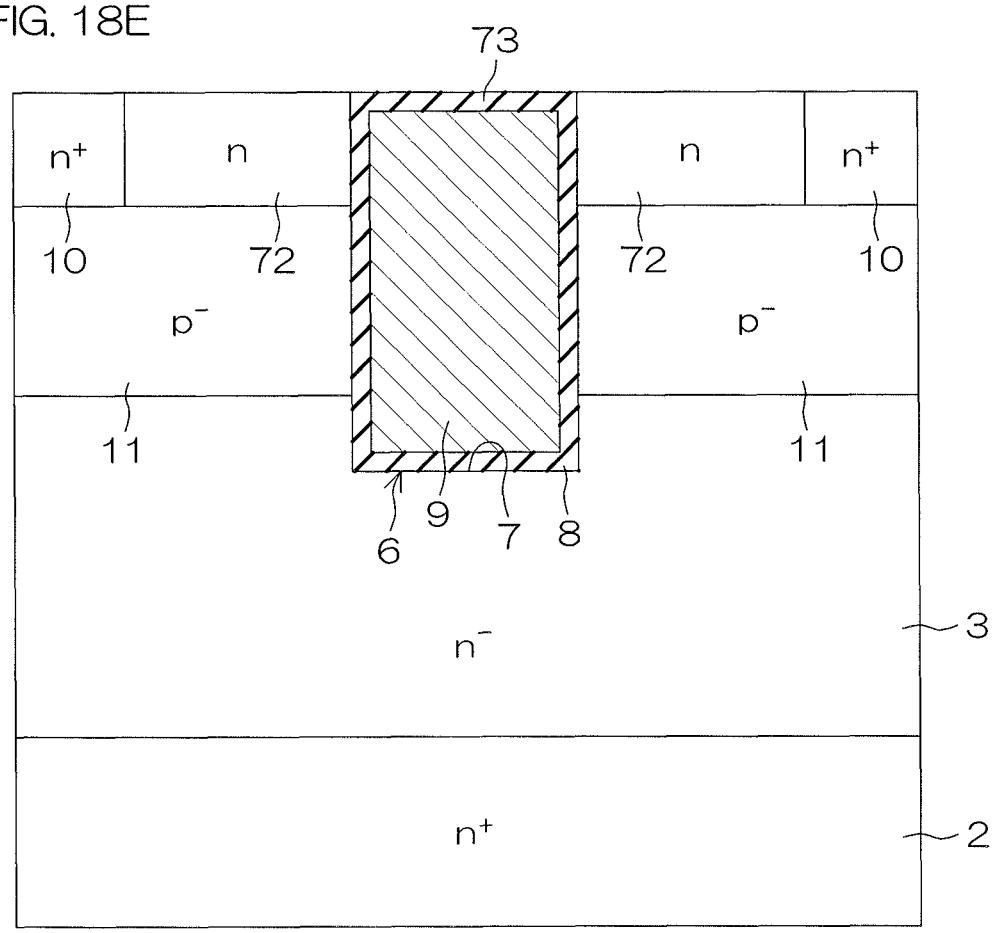
FIG. 18E is a sectional view showing a step after FIG. 18D.

Next, referring to FIG. 18E, the source region 10 and the n type impurity region 72 are selectively formed in the surface layer portion of the well region 11.

The source region 10 is formed by implanting the n type impurity into the surface layer portion of the well region 11. N type impurity implantation is performed via an ion implantation mask (not shown) that selectively has openings at regions in which the source regions 10 should be formed.

The n type impurity region 72 is formed by implanting the n type impurity into the surface layer portion of the well region 11. N type impurity implantation is performed via an ion implantation mask (not shown) that selectively has openings at regions in which the n type impurity regions 72 should be formed.

Figure 18F:
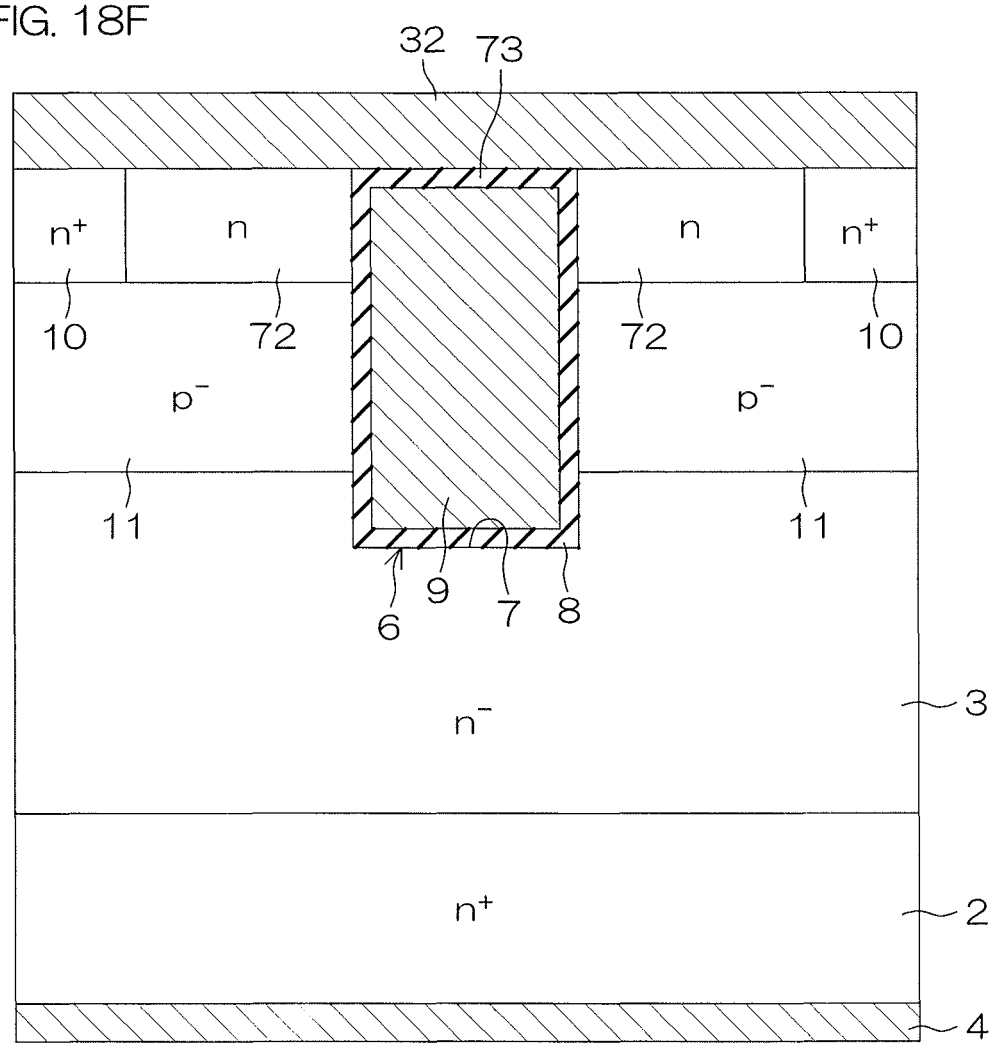
FIG. 18F is a sectional view showing a step after FIG. 18E.

Next, referring to FIG. 18F, an electrode material (for example, copper, aluminum and/or titanium) is deposited so as to cover the surface insulating film 73 and the SiC epitaxial layer 3 by, for example, a plating method or a sputtering method. This forms the source electrode 32.

An electrode material (for example, copper, aluminum and/or titanium) is deposited on the rear surface of the SiC semiconductor substrate 2 by, for example, a plating method or a sputtering method. This forms the drain electrode 4. The semiconductor device 71 is manufactured through the steps described above.

Fifth Preferred Embodiment

Figure 19:
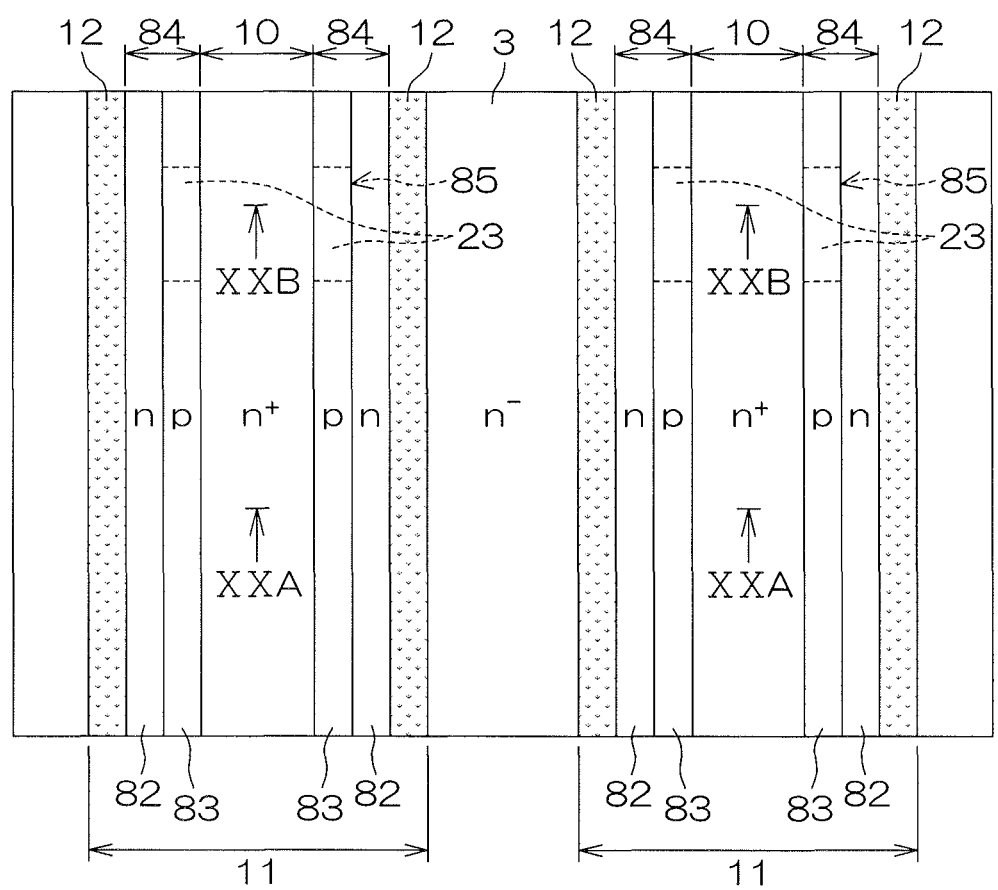
FIG. 19 is a plan view of a semiconductor device according to a fifth preferred embodiment of the present invention.
Figure 20B:
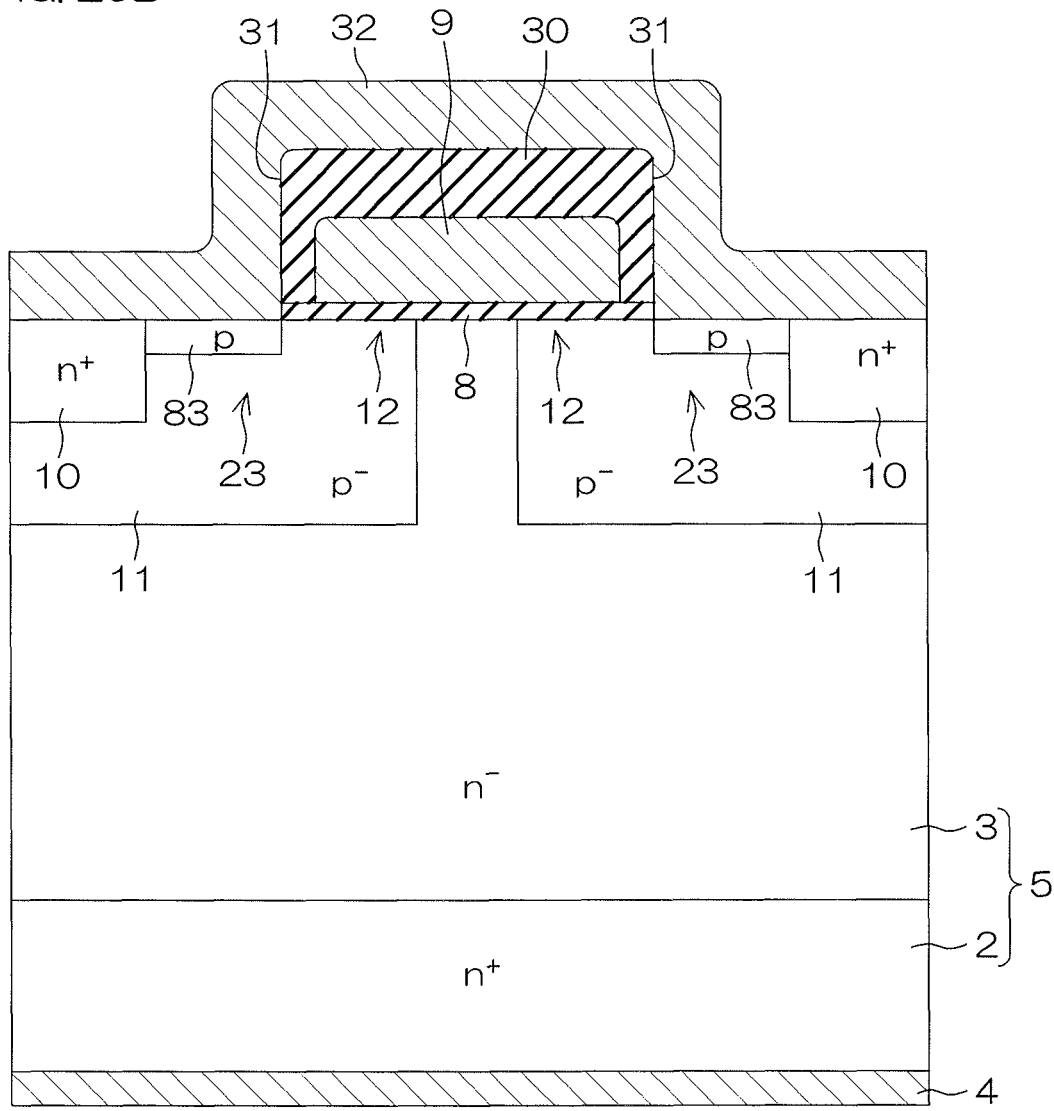
FIG. 20B is a sectional view taken along line XXB-XXB shown in FIG. 19.

FIG. 19 is a plan view of a semiconductor device 81 according to the fifth preferred embodiment of the present invention. FIG. 20A is a sectional view taken along line XXA-XXA shown in FIG. 19. FIG. 20B is a sectional view taken along line XXB-XXB shown in FIG. 19. The same reference signs as in the first preferred embodiment described above denote the same components in FIGS. 19, 20A, and 20B, and a description thereof will be omitted.

Referring to FIGS. 19 and 20A, in the semiconductor device 81 according to this preferred embodiment, the plurality of the well regions 11 described above are formed in the surface layer portion of the SiC epitaxial layer 3. The plurality of well regions 11 extend in band shapes along the same direction in the plan view and are formed at intervals. The source region 10 described above is formed in the surface layer portion of each well region 11.

FIG. 19 exemplarily shows a case in which the source region 10 is formed in a middle portion of the internal region of each well region 11 in the plan view. The source region 10 extends in a band shape along the well region 11, and is formed in the side of the inner region of the well region 11 spaced from the peripheral edge of the well region 11. The source region 10 is exposed from the front surface of the SiC epitaxial layer 3.

The semiconductor device 81 according to this preferred embodiment has a planar gate structure and includes the gate electrode 9 formed on the front surface of the SiC epitaxial layer 3. The gate electrode 9 faces the channel formation region 12 between the peripheral edge of the well region 11 and the peripheral edge of the source region 10 across the gate insulating film 8. Referring to FIG. 19, each channel formation region 12 is indicated by dotted hatching. The formation of the channel in the channel formation region 12 is controlled by the gate electrode 9.

The semiconductor device 81 according to this preferred embodiment includes a multilayer region 84 formed between the channel formation region 12 and the source region 10 in the surface layer portion of the well region 11. The multilayer region 84 includes an n type impurity region 82 and a p type impurity region 83 formed in a surface layer portion of the n type impurity region 82. The semiconductor device 81 includes the multilayer region 84 so as to suppress an increase in ON resistance and achieve a high short circuit tolerance.

Referring to FIGS. 19 and 20A, the multilayer region 84 is formed in a band shape along the well region 11. The multilayer region 84 is formed to have a depth almost equal to the depth of the source region 10.

The n type impurity region 82 is formed in a region between the peripheral edge of the source region 10 and the peripheral edge of the well region 11 spaced from the peripheral edge of the well region 11 to the side of the inner region of the well region 11. The n type impurity region 82 forms a p-n junction portion with the well region 11. The channel formation region 12 is formed in a region between the peripheral edge of the n type impurity region 82 and the peripheral edge of the well region 11.

The n type impurity region 82 is in contact with the source region 10 and the channel formation region 12 in the lateral direction parallel to the front surface of the SiC epitaxial layer 3. The n type impurity concentration of the n type impurity region 82 is higher than the n type impurity concentration of the semiconductor layer and lower than the n type impurity concentration of the source region 10.

The gate electrode 9 faces a region between the peripheral edge of the well region 11 and the peripheral edge of the n type impurity region 82 (that is, the channel formation region 12) across the gate insulating film 8. This forms the channel in the region between the peripheral edge of the well region 11 and the peripheral edge of the n type impurity region 82.

The p type impurity region 83 is exposed from the front surface of the SiC epitaxial layer 3. The p type impurity region 83 is formed in a region between the peripheral edge of the source region 10 and the peripheral edge of the n type impurity region 82 spaced from the peripheral edge of the n type impurity region 82 to the side of the inner region of the n type impurity region 82. The p type impurity region 83 forms a p-n junction portion with the n type impurity region 82.

The p type impurity region 83 is in contact with the source region 10 in the lateral direction parallel to the front surface of the SiC epitaxial layer 3. The p type impurity concentration of the p type impurity region 83 is higher than the p type impurity concentration of the well region 11.

A supplementary explanation will be given for the respective numerical values concerning the n type impurity region 82 and the p type impurity region 83.

A width $W_n$ of the n type impurity region 82 is, for example, 0.06 μm or more and 0.12 μm or less (about 0.09 μm in this preferred embodiment). The width $W_n$ of the n type impurity region 82 is defined by the distance between the peripheral edge of the n type impurity region 82 and the peripheral edge of the p type impurity region 83.

With regard to the depth direction of the SiC epitaxial layer 3, the thickness $T_p$ of the p type impurity region 83 is, for example, 0.04 μm or more and 0.08 μm or less (about 0.06 μm in this preferred embodiment).

With regard to the lateral direction parallel to the front surface of the SiC epitaxial layer 3, the width of the n type impurity region 82 may be, for example, 0.1 μm or more and 0.8 μm or less.

The n type impurity concentration of the n type impurity region 82 is, for example, $1.0 \times 10^{17}$ cm$^{-3}$ or more and $1.0 \times 10^{19}$ cm$^{-3}$ or less (about $1.0 \times 10^{18}$ cm$^{-3}$ in this preferred embodiment).

The p type impurity concentration of the p type impurity region 83 is, for example, $1.0 \times 10^{19}$ cm$^{-3}$ or more and $1.0 \times 10^{21}$ cm$^{-3}$ or less (about $4.0 \times 10^{20}$ cm$^{-3}$ in this preferred embodiment).

Referring to FIGS. 19 and 20B, portions without the n type impurity region 82 (see the broken lines in FIG. 19) are selectively formed in the multilayer regions 84. Each portion without the n type impurity region 82 is formed as the contact region 23.

The multilayer region 84 may include a region 85 in which portions with the n type impurity region 82 and portions without the n type impurity region 82 are alternately formed along the direction in which the well regions 11 extend.

The p type impurity region 20 is electrically connected to the well region 11 in the p type contact region 23. This sets the p type impurity region 20 at the same potential as that of the well region 11.

Referring to FIGS. 20A and 20B, the surface insulating film 30 is formed on the front surface of the SiC epitaxial layer 3. The surface insulating film 30 covers the gate electrode 9. Contact holes 31 are formed in the surface insulating film 30 so as to selectively expose the source region 10 and the p type impurity region 83.

The source electrode 32 is formed on the surface insulating film 30. The source electrode 32 enters the contact hole 31 from above the surface insulating film 30. The source electrode 32 is electrically connected to the source region 10 and the p type impurity region 83 in the contact hole 31. This short-circuits the source region 10 and the p type impurity region 83 and sets them at the same potential.

In one mode, the source electrode 32 may form the ohmic junction with the source region 10, and form the ohmic junction with the p type impurity region 83. In another mode, the source electrode 32 may form the ohmic junction with the source region 10, and form the Schottky junction with the p type impurity region 83.

Figure 22:
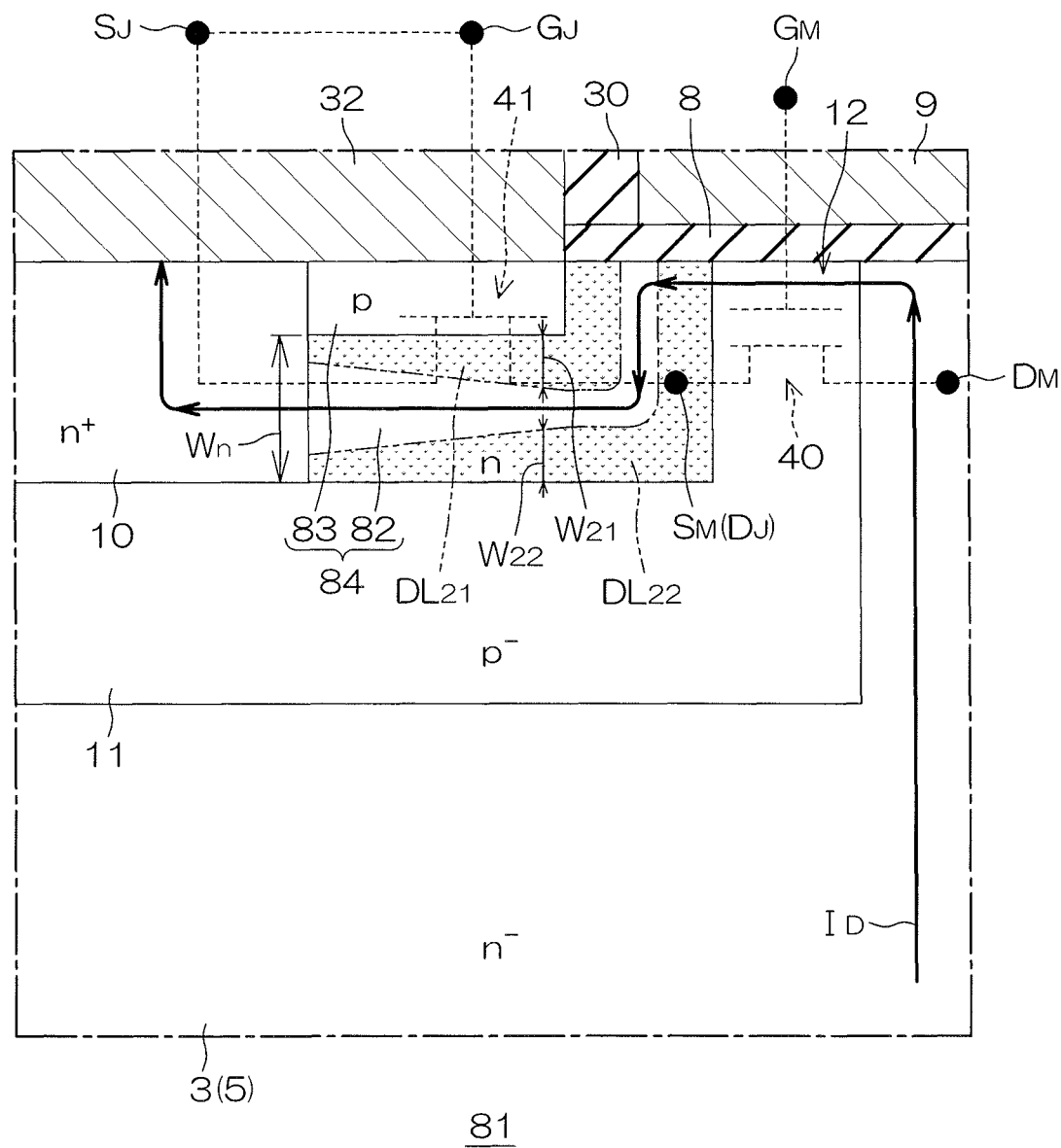
FIG. 22 is an enlarged view of a region corresponding to FIG. 21, showing a case in which a short circuit state is set.

Next, the electrical structure of the semiconductor device 81 will be described with reference to FIGS. 21 and 22. FIG. 21 is an enlarged view of the region surrounded by the broken line XXI shown in FIG. 20A, showing a case in which a non-short circuit state is set. FIG. 22 is an enlarged view of a region corresponding to FIG. 21, showing a case in which a short circuit state is set.

The non-short circuit state of the semiconductor device 81 indicates a steady state in which a predetermined driving voltage is applied to the gate electrode 9. A short circuit state of the semiconductor device 1 indicates a state in which while a predetermined driving voltage is applied to the gate electrode 9, a predetermined short-circuit voltage (for example, 200 V to 1000 V) is applied between the drain electrode 4 and the source electrode 32.

Referring to FIGS. 21 and 22, the MISFET 40 and the JFET 41 are formed in the SiC epitaxial layer 3. Referring to FIGS. 21 and 22, the MISFET 40 and the JFET 41 are indicated by the broken lines.

The MISFET 40 is formed by the SiC epitaxial layer 3 (the drain region 5), the gate electrode 9, and the source region 10 (more specifically, the n type impurity region 82 electrically connected to the source region 10).

For the sake of descriptive convenience, FIGS. 21 and 22 each show the gate terminal $G_M$, the drain terminal $D_M$, and the source terminal $S_M$ of the MISFET 40 respectively at the gate electrode 9, the SiC epitaxial layer 3 (the drain region 5), and the n type impurity region 82.

The JFET 41 is formed by the $n^+$ type source region 10 and the p-n-p multilayer structure including the p− type well region 11, the n type impurity region 82, and the p type impurity region 83. The p type impurity region 83 and the well region 11 are set at the same potential and constitute the gate of the JFET 41.

For the sake of descriptive convenience, FIGS. 21 and 22 each show the gate terminal $G_J$, the drain terminal $D_J$, and the source terminal $S_J$ of the JFET 41 respectively at the p type impurity region 83, the n type impurity region 82, and the source region 10.

The source terminal $S_M$ of the MISFET 40 and the drain terminal $D_J$ of the JFET 41 are electrically connected to each other. This forms the series circuit including the MISFET 40 and the JFET 41. The gate terminal $G_J$ and the source terminal $S_J$ of the JFET 41 are short-circuited by the source electrode 32.

When the predetermined driving voltage is applied to the gate electrode 9, the channel is formed in the channel formation region 12. This turns on the semiconductor device 81, and the current $I_D$ flows from the drain electrode 4 into the source electrode 32 via the SiC epitaxial layer 3, the well region 11 (the channel formation region 12), the n type impurity region 82, and the source region 10. On the other hand, when the semiconductor device 81 is in the OFF state, no channel is formed in the channel formation region 12, and hence the current $I_D$ does not flow between the drain electrode 4 and the source electrode 32.

Referring to FIGS. 21 and 22, the p-n junction portion is formed between the n type impurity region 82 and the p type impurity region 83. A first depletion layer $DL_{21}$ is formed by the p-n junction portion formed between the n type impurity region 82 and the p type impurity region 83.

The p-n junction portion is formed between the well region 11 and the n type impurity region 82. A second depletion layer $DL_{22}$ is formed by the p-n junction portion formed between the well region 11 and the n type impurity region 82.

Referring to FIG. 21, while the semiconductor device 81 is in the non-short circuit state, the first depletion layer $DL_{21}$ and the second depletion layer $DL_{22}$ hardly extend into the n type impurity region 82. This forms a relatively wide current path between the drain electrode 4 and the source electrode 32. Accordingly in the non-short circuit state, the first depletion layer $DL_{21}$ and the second depletion layer $DL_{22}$ hardly block a current flowing in the n type impurity region 21.

On the other hand, referring to FIG. 22, while the semiconductor device 81 is in the short circuit state, the first depletion layer $DL_{21}$ extends from the p-n junction portion formed between the n type impurity region 82 and the p type impurity region 83 into the n type impurity region 21. The second depletion layer $DL_{22}$ extends from the p-n junction portion formed between the well region 11 and the n type impurity region 82 into the n type impurity region 21.

A width $W_{21}$ of the first depletion layer $DL_{21}$ gradually increases from the side of the source region 10 to the side of the gate structure 9. Accordingly, the width $W_{21}$ of the first depletion layer $DL_{21}$ at the side of the gate electrode 9 is relatively larger than the width $W_{21}$ of the first depletion layer $DL_{21}$ at the side of the source region 10.

Likewise, a width $W_{22}$ of the second depletion layer $DL_{22}$ gradually increases from the side of the source region 10 to the side of the gate electrode 9. Accordingly, the width $W_{22}$ of the second depletion layer $DL_{22}$ at the side of the gate electrode 9 is relatively larger than the width $W_{22}$ of the second depletion layer $DL_{22}$ at the side of the source region 10.

While the semiconductor device 81 is in the short circuit state, the first depletion layer $DL_{21}$ and the second depletion layer $DL_{22}$ reduce an area of the current path formed in the n type impurity region 82. In this state, in the n type impurity region 82, the area of the current path formed the side of the channel formation region 12 is smaller than the area of the current path formed on the side of the source region 10. As described above, while the semiconductor device 81 is in the short circuit state, since the area of the current path formed in the n type impurity region 82 is narrowed, the flow of the short-circuit current $I_D$ is blocked.

In one mode, the well region 11, the n type impurity region 82, and the p type impurity region 83 may be formed so as to satisfy the equation $W_n > W_{21} + W_{22}$, where $W_n$ is the width of the n type impurity region 82, $W_{21}$ is the width of the first depletion layer $DL_{21}$, and $W_{22}$ is the width of the second depletion layer $DL_{22}$.

In another mode, the well region 11, the n type impurity region 82, and the p type impurity region 83 may be formed so as to satisfy the equation $W_n \leq W_{21} + W_{22}$, where $W_n$ is the width of the n type impurity region 82, $W_{21}$ is the width of the first depletion layer $DL_{21}$, and $W_{22}$ is the width of the second depletion layer $DL_{22}$.

In another mode, since the first depletion layer $DL_{21}$ and the second depletion layer $DL_{22}$ overlap each other in the n type impurity region 82, the flow of the short-circuit current $I_D$ can be effectively blocked. The one mode and the other mode may be combined to form the well region 11, the n type impurity region 82, and the p type impurity region 83 so as to include a portion satisfying the equation $W_n > W_{21} + W_{22}$ and a portion satisfying the equation $W_n \leq W_{21} + W_{22}$.

As described above, in the semiconductor device 81 according to this preferred embodiment, a current constriction portion (that is, the JFET 41) is formed in a region between the channel formation region 12 (the well region 11) and the source region 10. When the short circuit state is set, the current constriction portion narrows the current path. When the short circuit state is switched to the non-short circuit state, the current constriction portion expands the current path.

This makes it possible to reduce the short-circuit current $I_D$ in a short circuit state. Accordingly, Joule heat due to the short-circuit voltage $V_D$ and the short-circuit current $I_D$ can be reduced. On the other hand, in the non-short circuit state, since the current path is hardly narrowed, it is possible to suppress an increase in ON resistance due to the current constriction portion. Therefore, this makes it possible to provide the semiconductor device 81 that can suppress an increase in ON resistance and achieve a high short circuit tolerance.

Sixth Preferred Embodiment

Figure 23:
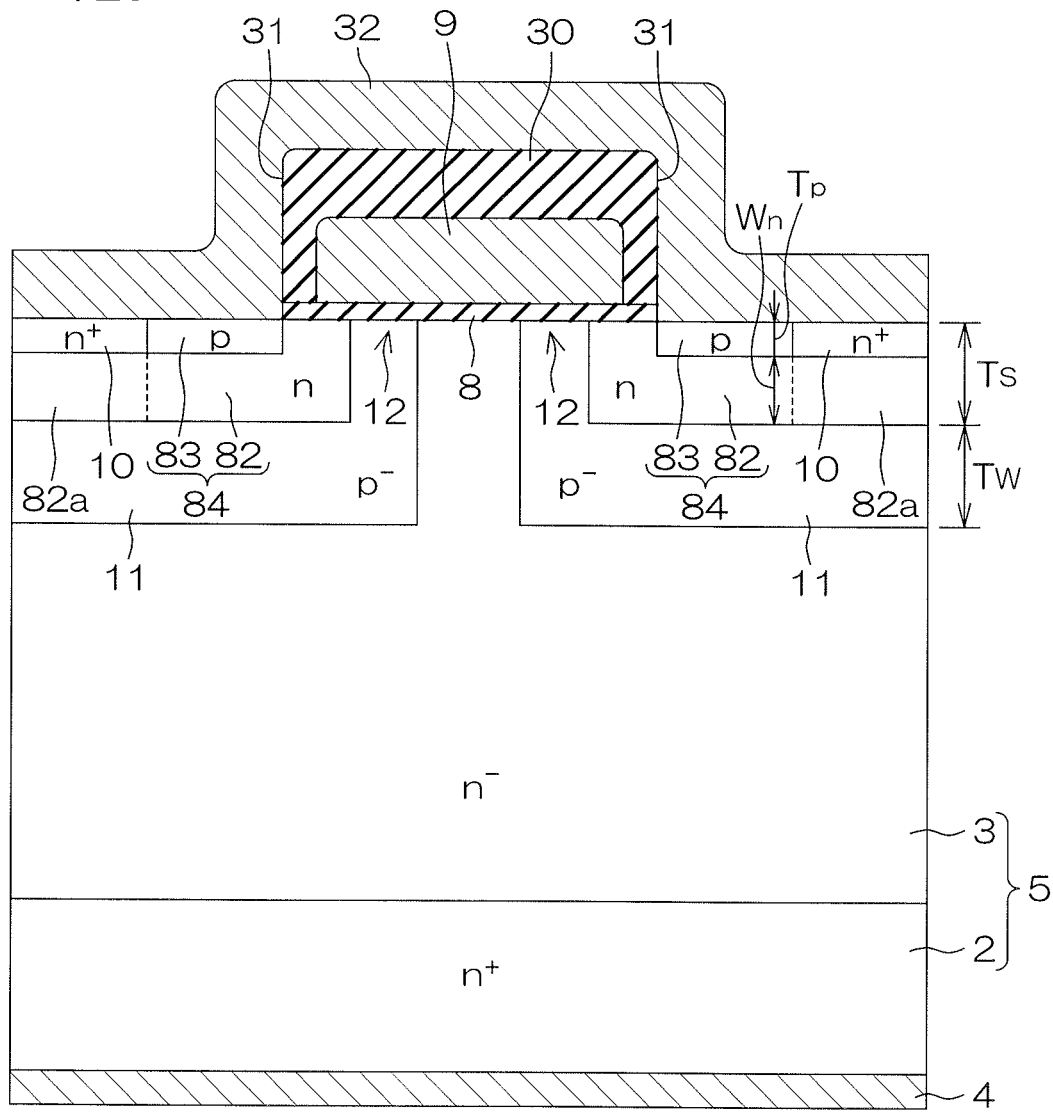
FIG. 23 is a sectional view of a semiconductor device according to a sixth preferred embodiment of the present invention.

FIG. 23 is a sectional view of a semiconductor device 91 according to the sixth preferred embodiment of the present invention. The same reference signs as in the fifth preferred embodiment described above denote the same components in FIG. 23, and a description thereof will be omitted.

In the semiconductor device 91 according to this preferred embodiment, the multilayer region 84 is formed in the surface layer portion of the well region 11. The multilayer region 84 is formed in the region between the channel formation region 12 and the source region 10 and includes the n type impurity region 82 and the p type impurity region 83 described above.

The n type impurity region 82 according to this preferred embodiment has an extended portion 82a extending into a region below the source region 10. The source region 10 has a portion facing the well region 11 across the extended portion 82a of the n type impurity region 82.

In this preferred embodiment, the extended portion 82a of the n type impurity region 82 is formed in the entire region below the source region 10. Accordingly, the entire source region 10 faces the well region 11 across the extended portion 82a of the n type impurity region 82. Unlike in the semiconductor device 81 described above, in the semiconductor device 91 according to this preferred embodiment, the source region 10 is not in contact with the well region 11.

With regard to the lateral direction parallel to the front surface of the SiC epitaxial layer 3, the p type impurity region 83 is in contact with the source region 10, but the n type impurity region 82 is not in contact with the source region 10. With regard to the depth direction of the SiC epitaxial layer 3, the thickness $T_s$ of the source region 10 is almost equal to a thickness $T_p$ of the p type impurity region 83.

As in the semiconductor device 81 described above, the MISFET 40 and the JFET 41 are formed in the SiC epitaxial layer 3. A p-n junction portion is formed between the n type impurity region 82 and the p type impurity region 83. A p-n junction portion is formed between the well region 11 and the n type impurity region 82.

A first depletion layer $DL_{21}$ is formed by the p-n junction portion formed between the n type impurity region 82 and the p type impurity region 83. A second depletion layer $DL_{22}$ is formed by the p-n junction portion formed between the well region 11 and the n type impurity region 82.

While the semiconductor device 91 is in the non-short circuit state, the first depletion layer $DL_{21}$ and the second depletion layer $DL_{22}$ hardly extend into the n type impurity region 82. This forms a relatively wide current path between the drain electrode 4 and the source electrode 32. In the non-short circuit state, therefore, the first depletion layer $DL_{21}$ and the second depletion layer $DL_{22}$ hardly block a current flowing in the n type impurity region 82.

On the other hand, while the semiconductor device 91 is in the short circuit state, the first depletion layer $DL_{21}$ and the second depletion layer $DL_{22}$ extend into the n type impurity region 82 in the same mode as the semiconductor device 81 described above. Accordingly, while the semiconductor device 91 is in the short circuit state, the first depletion layer $DL_{21}$ and the second depletion layer $DL_{22}$ reduce the area of the current path formed in the n type impurity region 82. As described above, while the semiconductor device 91 is in the short circuit state, the area of the current path formed in the n type impurity region 82 is narrowed, the flow of the short-circuit current $I_D$ is blocked.

As described above, in the semiconductor device 91 according to this preferred embodiment, a current constriction portion (that is, the JFET 41) is formed in a region between the channel formation region 12 (the well region 11) and the source region 10. When the short circuit state is set, the current constriction portion narrows the current path. When the short circuit state is switched to the non-short circuit state, the current constriction portion expands the current path.

This makes it possible to reduce the short-circuit current $I_D$ in the short circuit state. Accordingly, Joule heat due to the short-circuit voltage $V_D$ and the short-circuit current $I_D$ can be reduced. On the other hand, in the non-short circuit state, since the area of a current path is hardly narrowed, it is possible to suppress an increase in ON resistance due to the current constriction portion. Therefore, this makes it possible to provide the semiconductor device 91 that can suppress an increase in ON resistance and achieve a high short circuit tolerance.

Seventh Preferred Embodiment

Figure 24:
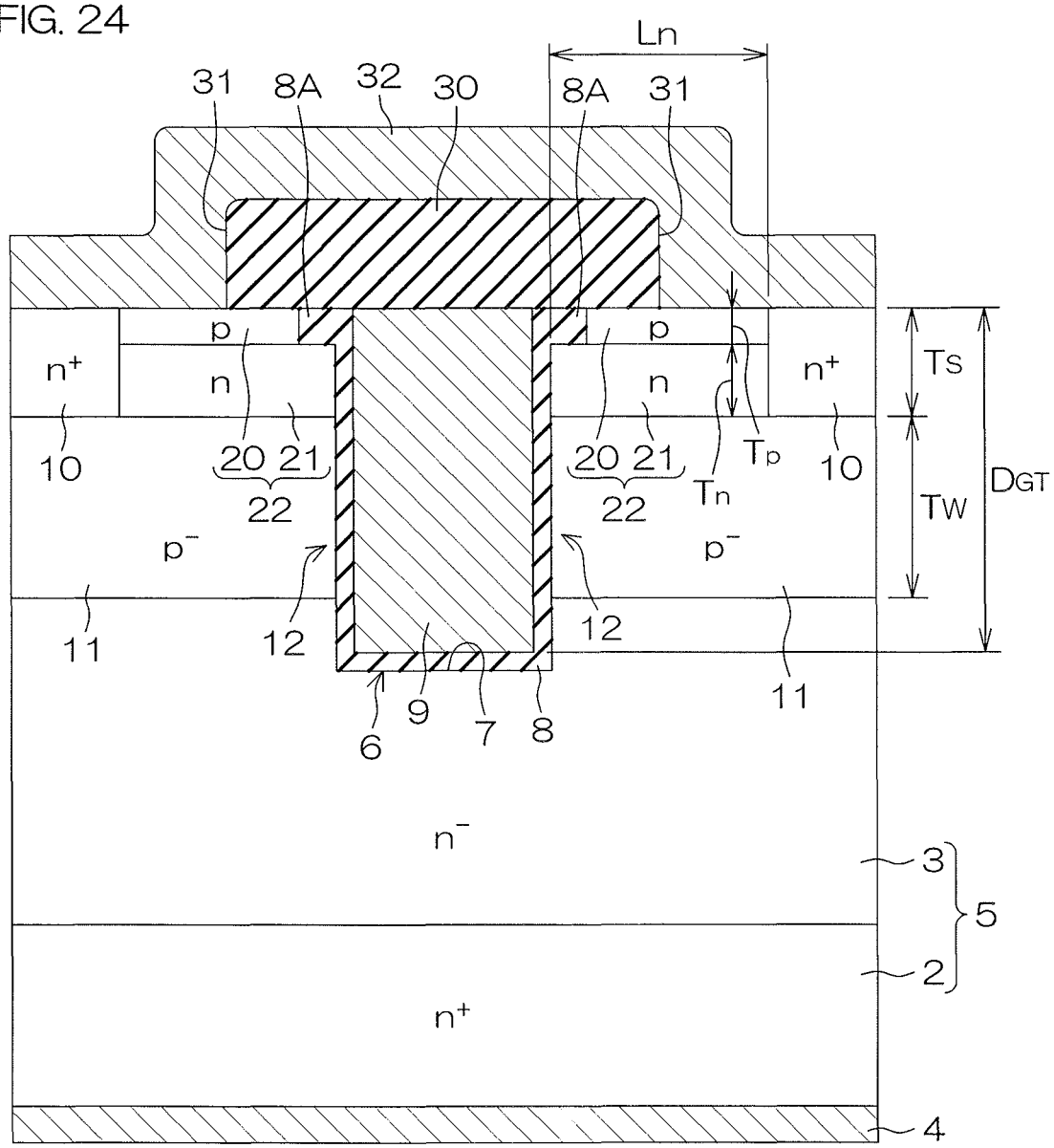
FIG. 24 is a sectional view of a semiconductor device according to a seventh preferred embodiment of the present invention.

FIG. 24 is a sectional view of a semiconductor device 92 according to the seventh preferred embodiment of the present invention. The semiconductor device 92 according to this preferred embodiment is also a modification of the semiconductor device 1 according to the first preferred embodiment (see FIG. 2A, etc.). The same reference signs as in the first preferred embodiment denote the same components in FIG. 24, and a description thereof will be omitted.

The first preferred embodiment described above has exemplified the case in which the gate insulating film 8 is formed along the inner wall surface of the gate trench 7. In contrast to this, in the semiconductor device 92 according to this preferred embodiment, as shown in FIG. 24, the gate insulating film 8 includes a thick film portion 8A in the surface layer portion of the SiC epitaxial layer 3.

The thick film portion 8A of the gate insulating film 8 is a portion where a portion of the gate insulating film 8 thickened in the lateral direction parallel to the front surface of the SiC epitaxial layer 3 at the surface layer portion of the SiC epitaxial layer 3. More specifically, the thick film portion 8A of the gate insulating film 8 is a portion where a portion of the gate insulating film 8 thickened than a thickness of the remaining portion so as to extend from the side surface of the trench gate structure 6 toward the p type impurity region 20.

The thick film portion 8A of the gate insulating film 8 has a thickness 1.5 times or more than that of the remaining portion of the gate insulating film 8. The thick film portion 8A of the gate insulating film 8 is in contact with the p type impurity region 20 in the lateral direction parallel to the front surface of the SiC epitaxial layer 3.

The thick film portion 8A of the gate insulating film 8 may be in contact with the n type impurity region 21 in the depth direction of the SiC epitaxial layer 3. The thick film portion 8A of the gate insulating film 8 may be formed across a boundary portion between the p type impurity region 20 and the n type impurity region 21 in the depth direction of the SiC epitaxial layer 3. In this case, the thick film portion 8A of the gate insulating film 8 may be in contact with the n type impurity region 21 in the lateral direction parallel to the front surface of the SiC epitaxial layer 3. The gate insulating film 8 may include silicon oxide.

The above arrangement can also obtain effects similar to those of the first preferred embodiment described above.

Eighth Preferred Embodiment

Figure 25:
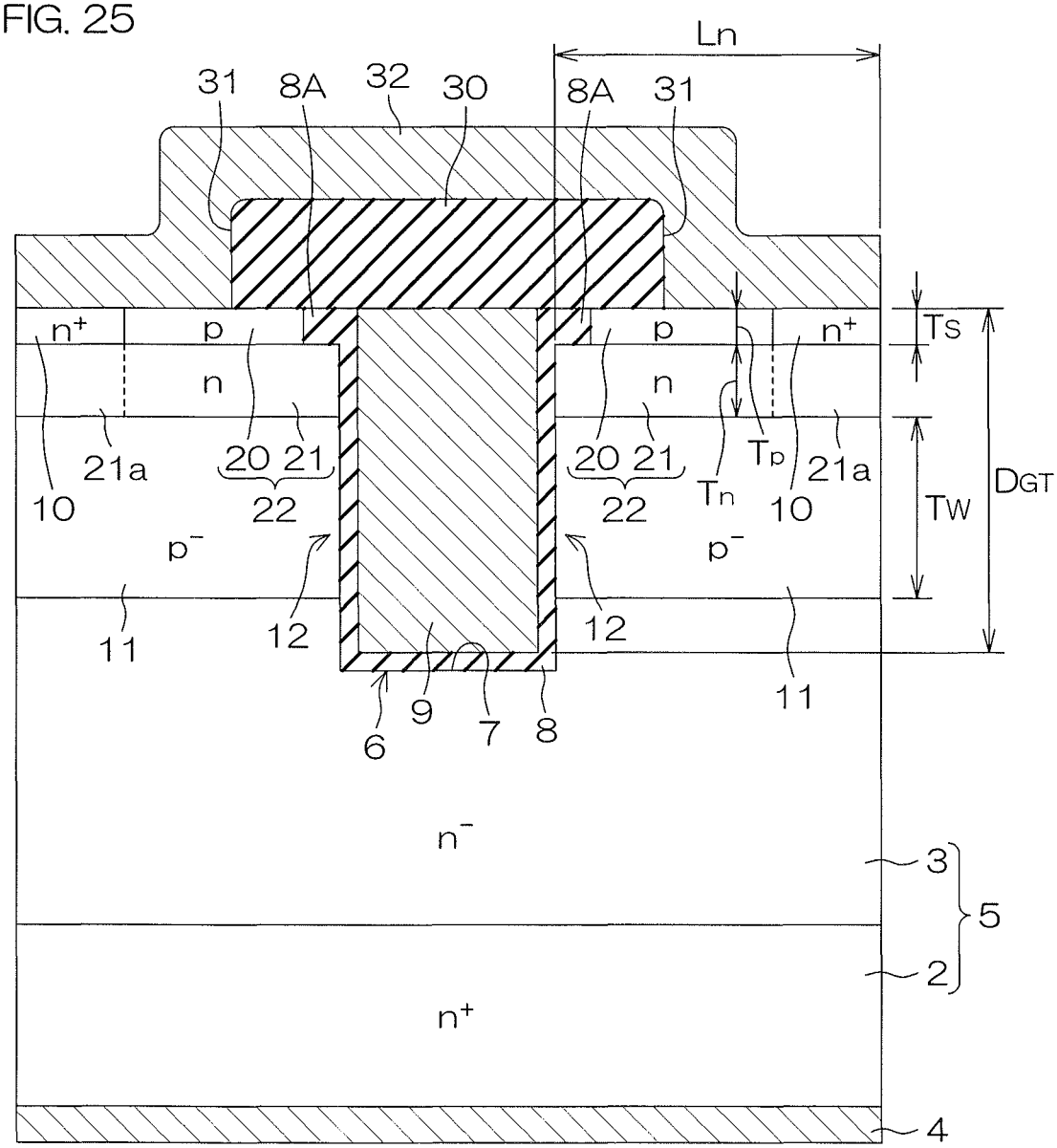
FIG. 25 is a sectional view of a semiconductor device according to an eighth preferred embodiment of the present invention.

FIG. 25 is a sectional view of a semiconductor device 93 according to the eighth preferred embodiment of the present invention. The semiconductor device 93 according to this preferred embodiment is also a modification of the semiconductor device 51 according to the second preferred embodiment described above (see FIG. 8). The same reference signs as in the second preferred embodiment described above denote the same components in FIG. 25, and a description thereof will be omitted.

The second preferred embodiment has exemplified the case in which the gate insulating film 8 is formed along the inner wall surface of the gate trench 7. In contrast to this, in the semiconductor device 93 according to this preferred embodiment, as shown in FIG. 25, the gate insulating film 8 includes a thick film portion 8A in surface layer portion of the SiC epitaxial layer 3.

The thick film portion 8A of the gate insulating film 8 is a portion where a portion of the gate insulating film 8 thickened in the lateral direction parallel to the front surface of the SiC epitaxial layer 3 at the surface layer portion of the SiC epitaxial layer 3. More specifically, the thick film portion 8A of the gate insulating film 8 is a portion where a portion of the gate insulating film 8 thickened than a thickness of the remaining portion so as to extend from the side surface of the trench gate structure 6 toward the p type impurity region 20.

The thick film portion 8A of the gate insulating film 8 has a thickness 1.5 times or more than that of the remaining portion of the gate insulating film 8. The thick film portion 8A of the gate insulating film 8 is in contact with the p type impurity region 20 in the lateral direction parallel to the front surface of the SiC epitaxial layer 3.

The thick film portion 8A of the gate insulating film 8 may be in contact with the n type impurity region 21 in the depth direction of the SiC epitaxial layer 3. The thick film portion 8A of the gate insulating film 8 may be formed across a boundary portion between the p type impurity region 20 and the n type impurity region 21 in the depth direction of the SiC epitaxial layer 3. In this case, the thick film portion 8A of the gate insulating film 8 may be in contact with the n type impurity region 21 in the lateral direction parallel to the front surface of the SiC epitaxial layer 3. The gate insulating film 8 may include silicon oxide.

The above arrangement can also obtain effects similar to those of the second preferred embodiment described above.

Ninth Preferred Embodiment

Figure 26:
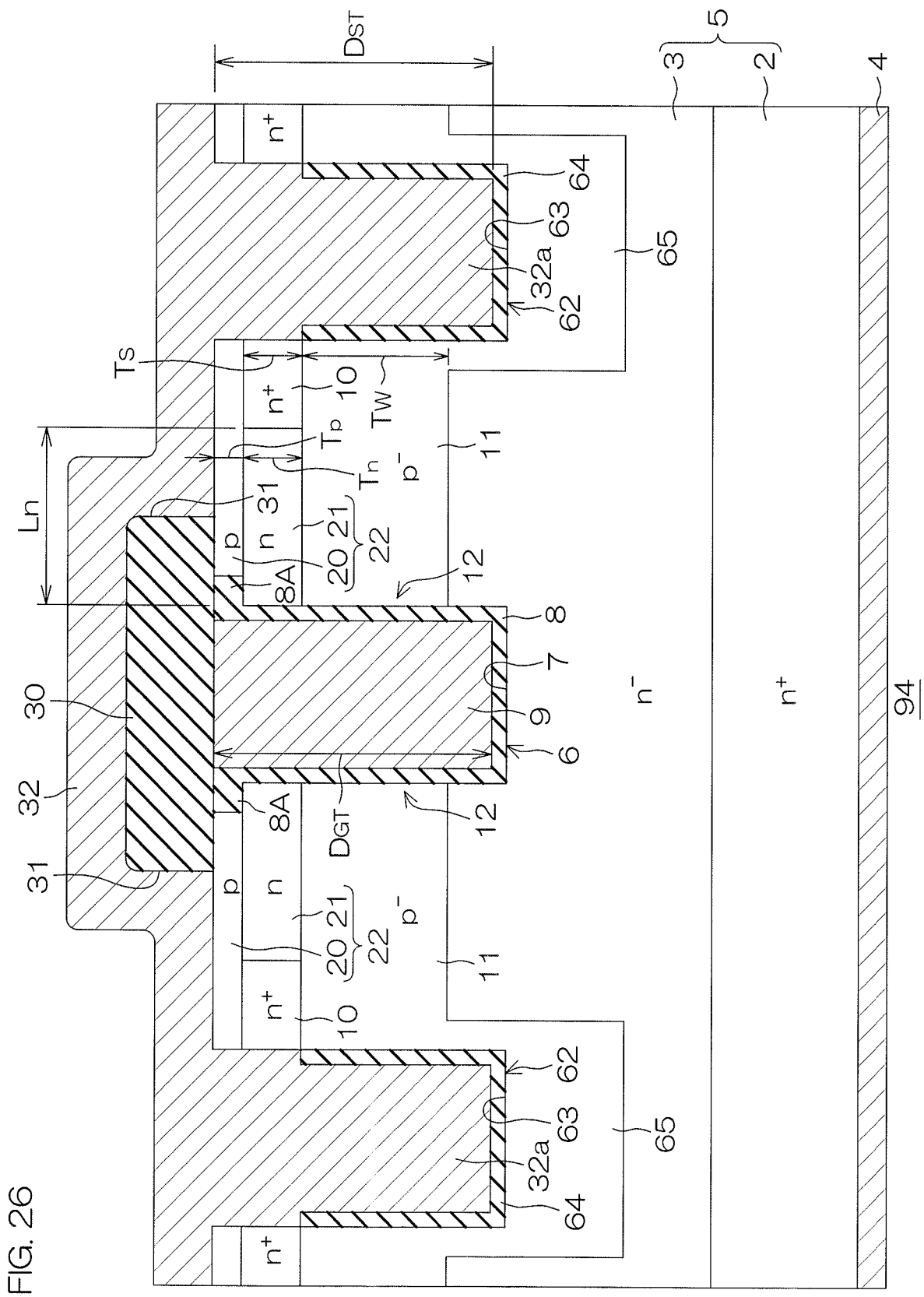
FIG. 26 is a sectional view of a semiconductor device according to a ninth preferred embodiment of the present invention.

FIG. 26 is a sectional view of a semiconductor device 94 according to the ninth preferred embodiment of the present invention. The semiconductor device 94 according to this preferred embodiment is also a modification of the semiconductor device 61 according to the third preferred embodiment (see FIG. 11A, etc.). The same reference signs as in the third preferred embodiment denote the same components in FIG. 26, and a description thereof will be omitted.

The third preferred embodiment has exemplified the case in which the gate insulating film 8 is formed along the inner wall surface of the gate trench 7. In contrast to this, in the semiconductor device 94 according to this preferred embodiment, as shown in FIG. 26, the gate insulating film 8 includes a thick film portion 8A in surface layer portion of the SiC epitaxial layer 3.

The thick film portion 8A of the gate insulating film 8 is a portion where a portion of the gate insulating film 8 thickened in the lateral direction parallel to the front surface of the SiC epitaxial layer 3 at the surface layer portion of the SiC epitaxial layer 3. More specifically, the thick film portion 8A of the gate insulating film 8 is a portion where a portion of the gate insulating film 8 thickened than a thickness of the remaining portion so as to extend from the side surface of the trench gate structure 6 toward the p type impurity region 20.

The thick film portion 8A of the gate insulating film 8 has a thickness 1.5 times or more than that of the remaining portion of the gate insulating film 8. The thick film portion 8A of the gate insulating film 8 is in contact with the p type impurity region 20 in the lateral direction parallel to the front surface of the SiC epitaxial layer 3.

The thick film portion 8A of the gate insulating film 8 may be in contact with the n type impurity region 21 in the depth direction of the SiC epitaxial layer 3. The thick film portion 8A of the gate insulating film 8 may be formed across a boundary portion between the p type impurity region 20 and the n type impurity region 21 in the depth direction of the SiC epitaxial layer 3. In this case, the thick film portion 8A of the gate insulating film 8 may be in contact with the n type impurity region 21 in the lateral direction parallel to the front surface of the SiC epitaxial layer 3. The gate insulating film 8 may include silicon oxide.

The above arrangement can also obtain effects similar to those of the third preferred embodiment described above.

Tenth Preferred Embodiment

Figure 27:
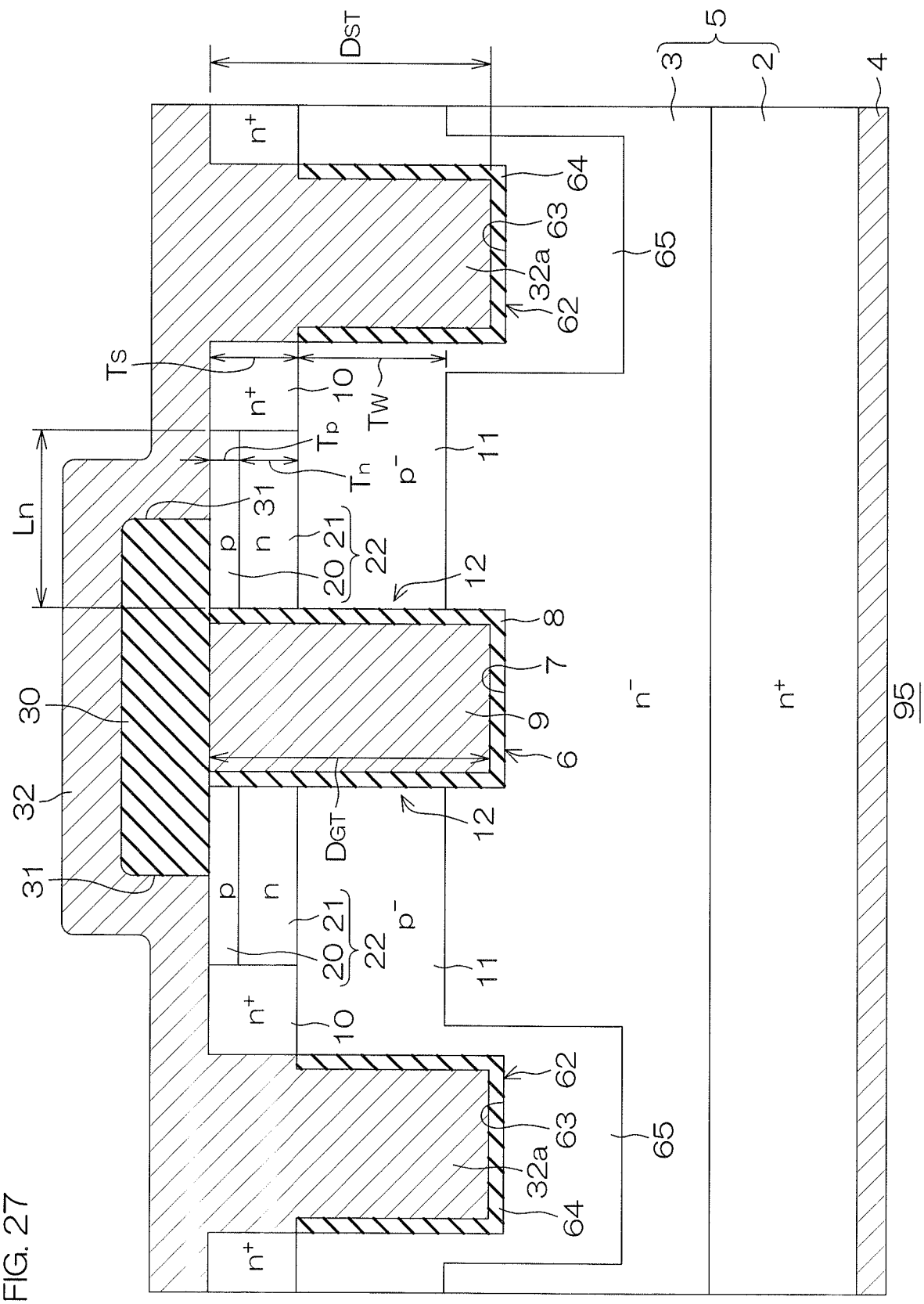
FIG. 27 is a sectional view of a semiconductor device according to a tenth preferred embodiment of the present invention.

FIG. 27 is a sectional view of a semiconductor device 95 according to the tenth preferred embodiment of the present invention. The semiconductor device 95 according to this preferred embodiment is also a modification of the semiconductor device 61 according to the third preferred embodiment described above (see FIG. 11A, etc.). The same reference signs as in the third preferred embodiment denote the same components in FIG. 27, and a description thereof will be omitted.

The third preferred embodiment has exemplified the case in which the p type impurity region 20 covers the entire source region 10. In contrast to this, in the semiconductor device 95, as shown in FIG. 27, the source region 10 is formed to be exposed from the front surface of the SiC epitaxial layer 3 and the inner surface of the source trench 63.

The source region 10 is in contact with the well region 11 in the depth direction of the SiC epitaxial layer 3. With regard to the depth direction of the SiC epitaxial layer 3, the thickness $T_s$ of the source region 10 is, for example, 0.1 µm or more and 0.2 µm or less (about 0.15 µm in this case).

The source region 10 is electrically connected to the source electrode 32 formed on the front surface of the SiC epitaxial layer 3 and the portion 32a of the source electrode 32 embedded in the source trench 63.

The multilayer region 22 (the p type impurity region 20 and the n type impurity region 21) is in contact with the source region 10 in the lateral direction parallel to the front surface of the SiC epitaxial layer 3. The p type impurity region 20 is exposed from the front surface of the SiC epitaxial layer 3 and is in contact with the entire n type impurity region 21 in the depth direction of the SiC epitaxial layer 3. The p type impurity region 20 and the n type impurity region 21 are formed to have almost equal widths $L_n$ in the lateral direction parallel to the front surface of the SiC epitaxial layer 3.

The above arrangement can also obtain effects similar to those of the third preferred embodiment described above.

According to this arrangement, it is possible to increase the contact area of the source electrode 32 with respect to the source region 10. Therefore, this can improve the switching characteristics of the MISFET 40 and the switching characteristics of the JFET 41. Obviously, it is possible to adopt the structure in which the arrangement shown in FIG. 27 is combined with the arrangement shown in FIG. 26 to make the gate insulating film 8 have the thick film portion 8A.

Eleventh Preferred Embodiment

Figure 28:
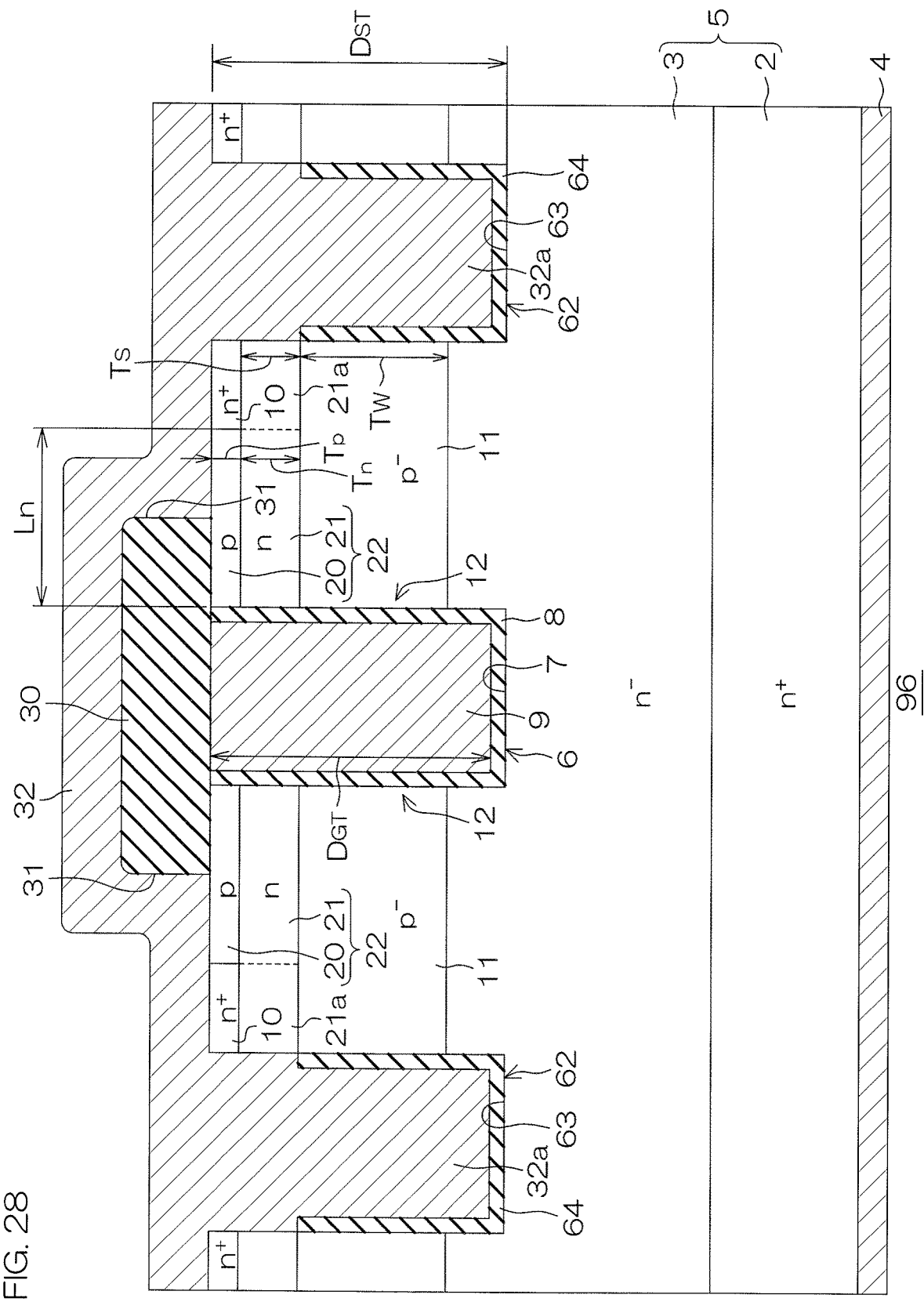
FIG. 28 is a sectional view of a semiconductor device according to an eleventh preferred embodiment of the present invention.

FIG. 28 is a sectional view of a semiconductor device 96 according to the eleventh preferred embodiment of the present invention. The semiconductor device 96 according to this preferred embodiment has a structure obtained by combining the n type impurity region 21 (see FIG. 8) of the semiconductor device 51 according to the second preferred embodiment and the semiconductor device 61 according to the third preferred embodiment described above (see FIG. 27). The same reference signs as in the second and third preferred embodiments described above denote the same components in FIG. 28, and a description thereof will be omitted.

As shown in FIG. 28, the n type impurity region 21 has the extended portion 21a extending in the region below the source region 10. The source region 10 has the portion facing the well region 11 across the extended portion 21a of the n type impurity region 21.

The extended portion 21a of the n type impurity region 21 may be formed in the entire region below the source region 10. That is, the entire source region 10 may face the well region 11 across the extended portion 21a of the n type impurity region 21. The extended portion 21a of the n type impurity region 21 may be in contact with the trench source structure 62 (the source trench 63).

As described above, this arrangement can also have effects similar to those described in the second and third preferred embodiments described above.

Twelfth Preferred Embodiment

Figure 29:
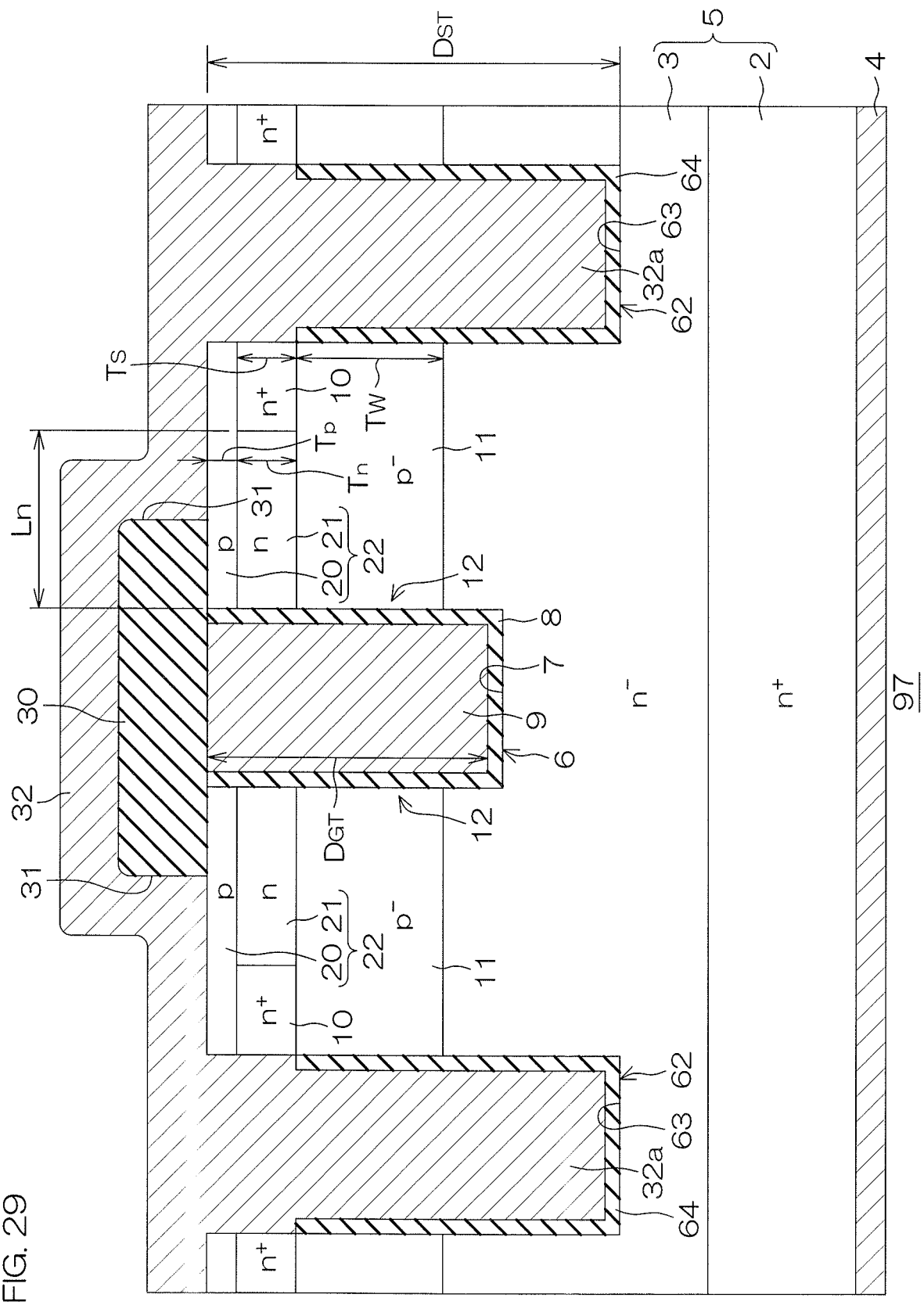
FIG. 29 is a sectional view of a semiconductor device according to a twelfth preferred embodiment of the present invention.

FIG. 29 is a sectional view of a semiconductor device 97 according to the twelfth preferred embodiment of the present invention. The semiconductor device 97 according to this preferred embodiment is a modification of the semiconductor device 61 according to the third preferred embodiment described above (see FIG. 11A, etc.). The same reference signs as in the third preferred embodiment described above denote the same components in FIG. 29, and a description thereof will be omitted.

The third preferred embodiment described above has exemplified the case in which the trench source structure 62 has the depth $D_{ST}$ equal to the depth $D_{GT}$ of the trench gate structure 6. In contrast to this, in the semiconductor device 97 according to this preferred embodiment, the trench source structure 62 has the depth $D_{ST}$ larger than the depth $D_{GT}$ of the trench gate structure 6.

In this preferred embodiment, the well region 11 does not have the source trench side region 65 described above. However, the well region 11 may have the source trench side region 65.

Figure 30:
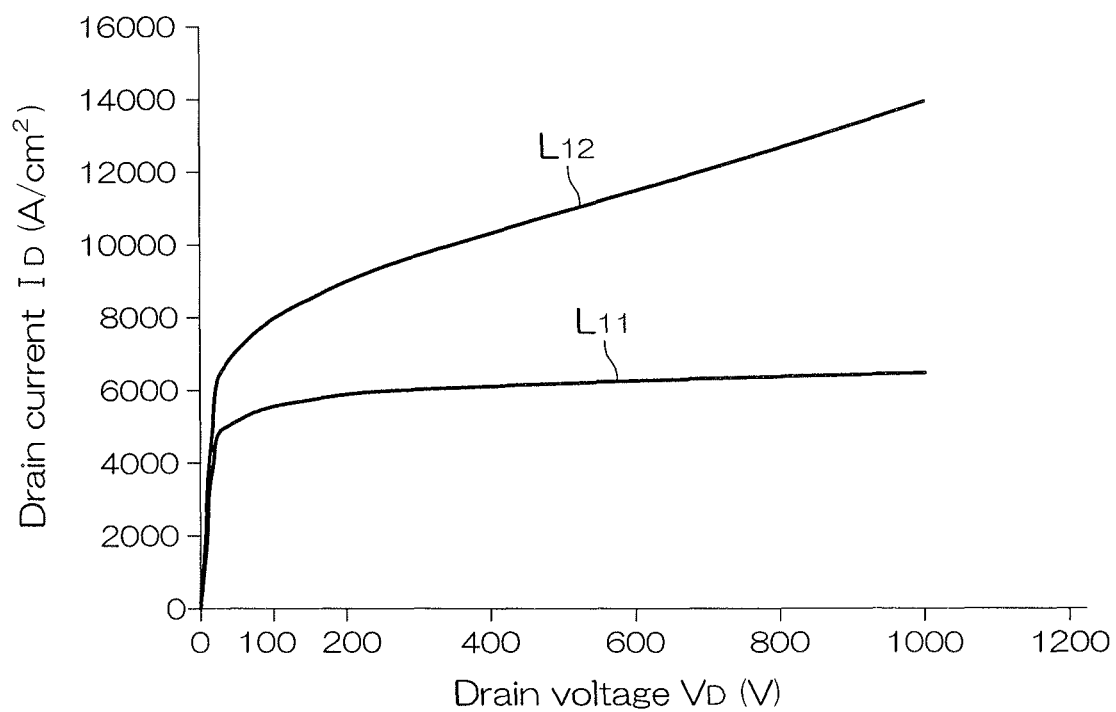
FIG. 30 is a graph showing drain current-drain voltage characteristics.

FIG. 30 shows the results obtained by simulating the drain current $I_D$ flowing between the drain electrode 4 and the source electrode 32 by applying the drain voltage $V_D$ ranging from 0 V to 1000 V to the drain electrode 4 in the semiconductor device 97 shown in FIG. 29.

Referring to FIG. 30, the ordinate represents the drain current $I_D$ [A/cm$^2$], and the abscissa represents the drain voltage $V_D$ [V].

FIG. 30 shows a curve $L_{11}$ and a curve $L_{12}$. The curve $L_{11}$ represents the drain current $I_D$—drain voltage $V_D$ characteristics of a semiconductor device (to be simply referred to as "semiconductor device according to the reference example" hereinafter) having a structure obtained by omitting the multilayer region 22 (the p type impurity region 20 and the n type impurity region 21) from the arrangement shown in FIG. 29. The curve $L_{12}$ represents the drain current $I_D$—drain voltage $V_D$ characteristics of the semiconductor device 97 according to this preferred embodiment.

Referring to the curve $L_{11}$, in the semiconductor device according to the reference example, the drain current $I_D$ increases with an increase in the drain voltage $V_D$. When the drain voltage $V_D$ exceeds 100 V, the drain current $I_D$ exceeds 8000 A/cm$^2$.

On the other hand, referring to the curve $L_{12}$, in the semiconductor device 97 according to the preferred embodiment, when the drain voltage $V_D$ exceeds 100 V, the drain current $I_D$ is saturated within the range of 6000 A/cm$^2$ or more and less than 7000 A/cm$^2$.

When the drain voltage $V_D$ is 600 V, the drain current $I_D$ in the semiconductor device 97 according to this preferred embodiment is smaller by about 45% than the drain current $I_D$ in the semiconductor device according to the reference example. Furthermore, there is hardly any increase in ON resistance in the semiconductor device 97 according to the preferred embodiment.

As described above, with this arrangement as well, it is possible to obtain effects similar to those described in the third preferred embodiment.

Thirteenth Preferred Embodiment

Figure 31:
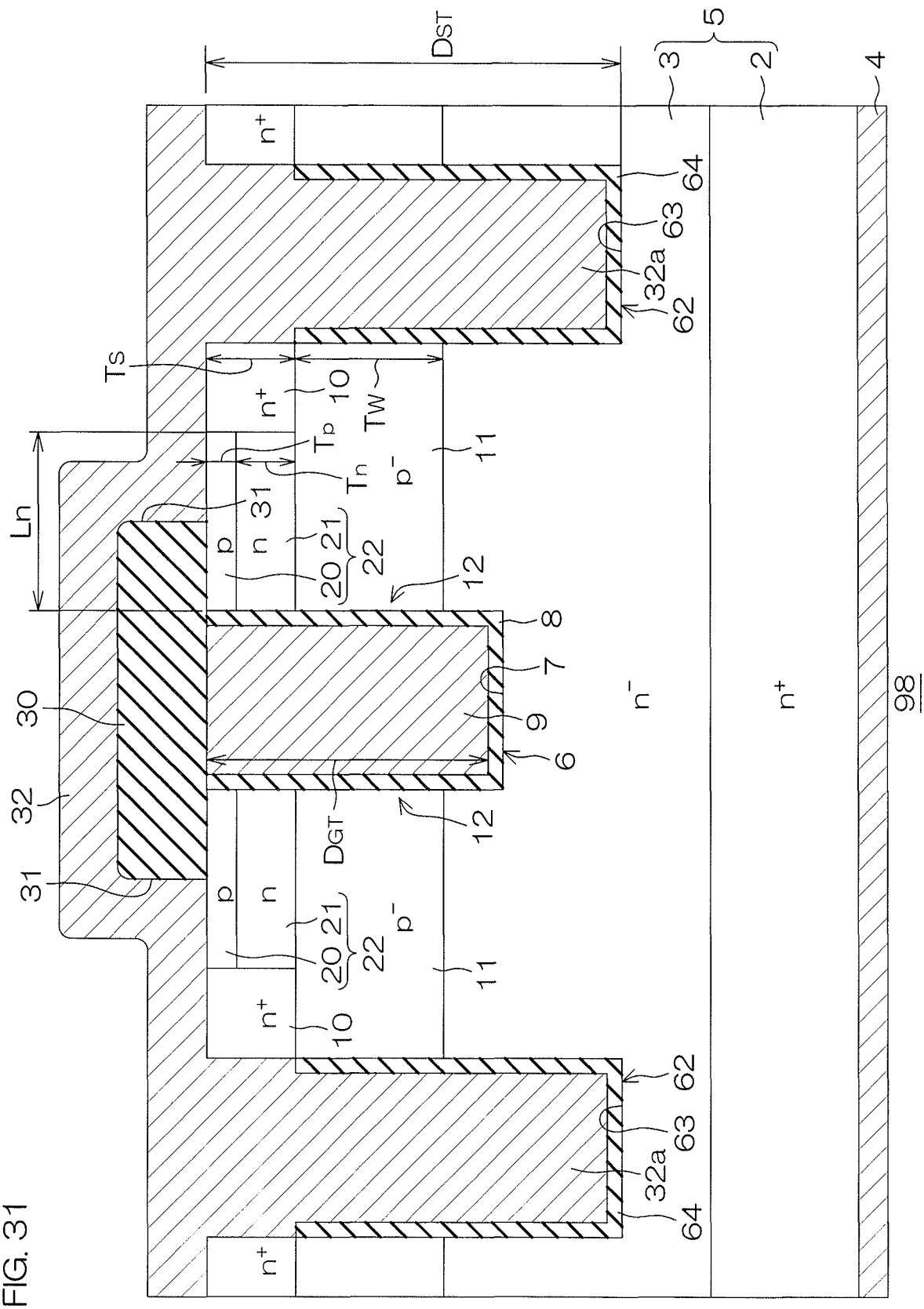
FIG. 31 is a sectional view of a semiconductor device according to a thirteenth preferred embodiment of the present invention.

FIG. 31 is a sectional view of a semiconductor device 98 according to the thirteenth preferred embodiment of the present invention. The semiconductor device 98 according to this preferred embodiment is a modification of the semiconductor device 95 according to the tenth preferred embodiment (see FIG. 27). The same reference signs as in the tenth preferred embodiment denote the same components in FIG. 31, and a description thereof will be omitted.

The tenth preferred embodiment has exemplified the case in which the trench source structure 62 has the depth $D_{ST}$ equal to the depth $D_{GT}$ of the trench gate structure 6. In contrast to this, in the semiconductor device 98 according to this preferred embodiment, the trench source structure 62 has the depth $D_{ST}$ larger than the depth $D_{GT}$ of the trench gate structure 6.

In this preferred embodiment, the well region 11 does not have the source trench side region 65 described above. The well region 11 may have the source trench side region 65 described above.

As described above, with this arrangement as well, it is possible to obtain effects similar to those described in the tenth preferred embodiment described above.

Fourteenth Preferred Embodiment

Figure 32:
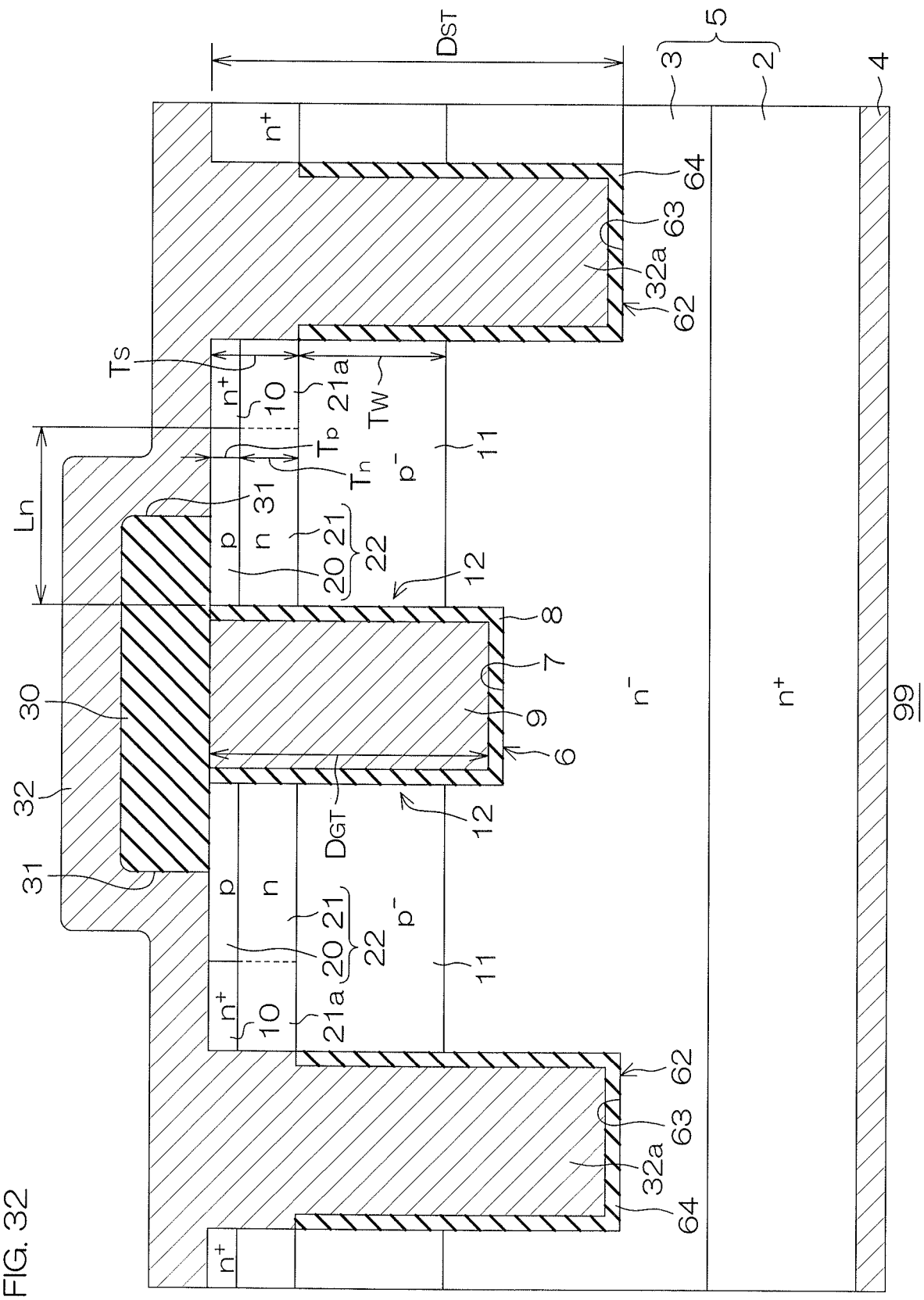
FIG. 32 is a sectional view of a semiconductor device according to a fourteenth preferred embodiment of the present invention.

FIG. 32 is a sectional view of a semiconductor device 99 according to the fourteenth preferred embodiment of the present invention. The semiconductor device 99 according to this preferred embodiment is a modification of the semiconductor device 96 according to the eleventh preferred embodiment (see FIG. 28). The same reference signs as in the eleventh preferred embodiment denote the same components in FIG. 32, and a description thereof will be omitted.

The eleventh preferred embodiment has exemplified the case in which the trench source structure 62 has the depth $D_{ST}$ equal to the depth $D_{GT}$ of the trench gate structure 6. In contrast to this, in the semiconductor device 98 according to this preferred embodiment, the trench source structure 62 has the depth $D_{ST}$ larger than the depth $D_{GT}$ of the trench gate structure 6.

In this preferred embodiment, the well region 11 does not have the source trench side region 65 described above. However, the well region 11 may have the source trench side region 65 described above.

As described above, with this arrangement as well, it is possible to obtain effects similar to those described in the eleventh preferred embodiment.

Fifteenth Preferred Embodiment

Figure 33:
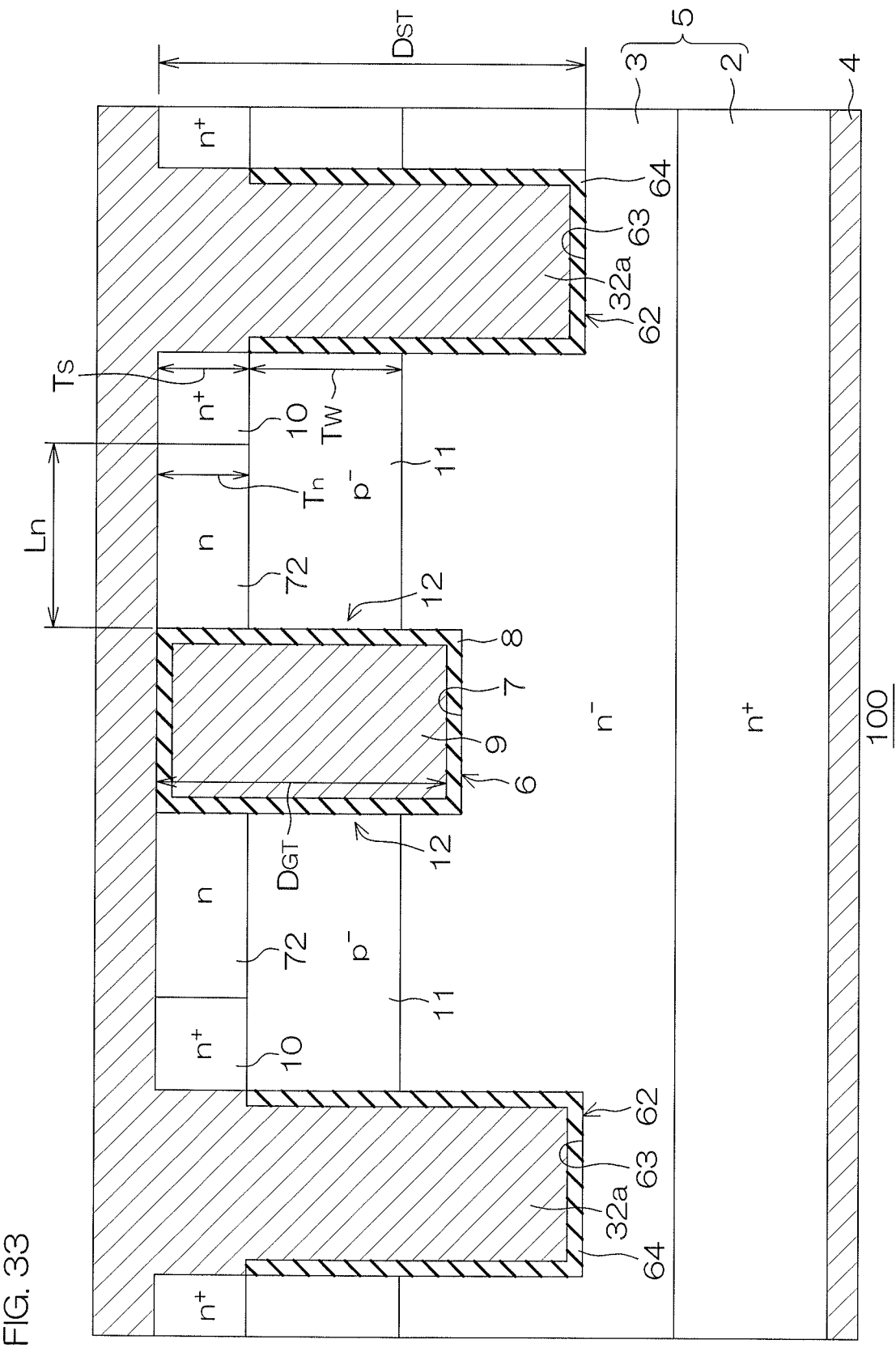
FIG. 33 is a sectional view of a semiconductor device according to a fifteenth preferred embodiment of the present invention.

FIG. 33 is a sectional view of a semiconductor device 100 according to the fifteenth preferred embodiment of the present invention. The semiconductor device 100 according to this preferred embodiment is a combination of the semiconductor device 71 (see FIG. 14) according to the fourth preferred embodiment described above and the trench source structure 62 (see FIG. 29) of the semiconductor device 97 according to the twelfth preferred embodiment described above. The same reference signs as in the fourth preferred embodiment and the twelfth preferred embodiment denote the same components in FIG. 33, and a description thereof will be omitted.

In this preferred embodiment, the trench source structure 62 has the depth $D_{ST}$ larger than the depth $D_{GT}$ of the trench gate structure 6. However, the trench source structure 62 may have the depth $D_{ST}$ equal to the depth $D_{GT}$ of the trench gate structure 6 as in the third preferred embodiment described above.

In this preferred embodiment, the well region 11 does not have the source trench side region 65 described above. However, the well region 11 may have the source trench side region 65 as in the third preferred embodiment.

As described above, with this arrangement as well, it is possible to obtain effects similar to those described in the fourth preferred embodiment and the twelfth preferred embodiment described above.

Although the preferred embodiments of the present invention have been described above, the present invention can be carried out in other modes.

In each embodiment including the trench gate structures 6, each gate trench 7 may be formed in a rectangular shape in a sectional view which is perpendicular to the front surface of the SiC epitaxial layer 3.

In each embodiment including the trench gate structures 6, each gate trench 7 may be formed in a tapered shape in a sectional view whose opening width gradually decreases along the depth direction.

In each preferred embodiment including the trench gate structures 6, the bottom portion of each gate trench 7 may be formed to be parallel to the front surface of the SiC epitaxial layer 3.

In each preferred embodiment including the trench gate structures 6, the bottom portion of each gate trench 7 may be formed to be rounded from its side surface to the outside.

In each preferred embodiment including the trench gate structures 6, the trench gate structures 6 may be formed into a lattice shape in the plan view. In this case, the plurality of trench gate structures 6 extending in band shapes along a first direction and the plurality of trench gate structures 6 extending along the second direction intersecting with the first direction are integrally formed.

In each preferred embodiment including the trench source structures 62, each source trench 63 may be formed in a rectangular shape in a sectional view which is almost perpendicular to the front surface of the SiC epitaxial layer 3.

In each preferred embodiment including the trench source structures 62, each source trench 63 may be formed in a tapered shape in a sectional view whose opening width gradually decreases along the depth direction.

In each preferred embodiment including the trench source structures 62, the bottom portion of each source trench 63 may be formed to be parallel to the front surface of the SiC epitaxial layer 3.

In each preferred embodiment including the trench source structures 62, the bottom portion of each source trench 63 may be formed to be rounded from its side surface to the outside.

In each preferred embodiment described above, the semiconductor layer may include an Si semiconductor substrate including Si and an Si epitaxial layer including Si in place of the SiC semiconductor substrate 2 and the SiC epitaxial layer 3.

Each preferred embodiment described above may adopt an arrangement in which the conductivity type of each semiconductor portion may be inverted. That is, each p type portion may be inverted into an n type portion, and each n type portion may be inverted into a p type portion.

In each preferred embodiment described above, an insulated gate bipolar transistor (an IGBT) may be used in place of the MISFET 40 by adopting a $p^+$ type SiC semiconductor substrate 2 in place of the $n^+$ type SiC semiconductor substrate 2.

In this case, "source" of the MISFET 40 is deemed to be replaced with "emitter" of the IGBT. And "drain" of the MISFET 40 is deemed to be replaced with "collector" of the IGBT. Consequently, the drain electrode 4 and the drain region 5 of the MISFET 40 are replaced with the collector electrode and the collector region of the IGBT. Furthermore, the source electrode 32 and the source region 10 of the MISFET 40 are replaced with the emitter electrode and the emitter region of the IGBT.

It is also possible to adopt an arrangement obtained by selectively combining the arrangements according to the respective preferred embodiments. For example, although the fourth embodiment has exemplified the case in which the surface insulating film 73 is formed to cover the gate electrode 9, the surface insulating film 73 may be used in place of the surface insulating film 30 described above in each of the first to third preferred embodiments.

The semiconductor devices 1, 51, 61, 71, 81, 91, 92, 93, 94, 95, 96, 97, 98, 99, and 100 according to the respective preferred embodiments described above can be incorporated into power modules used for, for example, inverter circuits for driving electric motors used as power sources of vehicles (including electric vehicles), electric trains, industrial robots, air conditioners, air compressors, electric fans, vacuum cleaners, drying machines, refrigerators, etc.

The semiconductor devices 1, 51, 61, 71, 81, 91, 92, 93, 94, 95, 96, 97, 98, 99, and 100 according to the respective preferred embodiments described above can also be incorporated into circuit modules as components of analog control power supplies, digital control power supplies, etc., as well as power modules used for the inverter circuits of power generating equipment such as solar cells and wind power generators.

Furthermore, various design changes can be made within the scope of the matters described in claims.

The present application corresponds to Japanese Patent Application No. 2016-008834 filed in the Japan Patent Office on Jan. 20, 2016, and the entire disclosure of the application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

REFERENCE SIGNS LIST

1: Semiconductor device
2: SiC semiconductor substrate
3: SiC epitaxial layer
6: Trench gate structure
7: Gate trench
8: Gate insulating film
9: Gate electrode
10: Source region
11: Well region
12: Channel formation region
20: P type impurity region
21: N type impurity region
21a: Extended portion
22: Multilayer region
32: Source electrode
40: MISFET
41: JFET
51: Semiconductor device
61: Semiconductor device
62: Trench source structure
63: Source trench
71: Semiconductor device
72: N type impurity region
81: Semiconductor device
82: N type impurity region
82a: Extended portion
83: P type impurity region
84: Multilayer region
91: Semiconductor device
92: Semiconductor device
93: Semiconductor device
94: Semiconductor device
95: Semiconductor device
96: Semiconductor device
97: Semiconductor device
98: Semiconductor device
99: Semiconductor device
100: Semiconductor device

What is claimed is:

1. A semiconductor device comprising:
a semiconductor layer of a first conductivity type having a first principal surface and a second principal surface;
a trench gate structure including a gate trench formed in the surface layer portion of the first principal surface of the semiconductor layer and a gate electrode embedded in the gate trench with an insulating film interposed between the gate trench and the gate electrode;
a source region of the first conductivity type formed in the surface layer portion of the first principal surface of the semiconductor layer at a side of the trench gate structure;
a well region of a second conductivity type formed in a region at a side of the second principal surface of the semiconductor layer with respect to the source region along the trench gate structure at a side of the trench gate structure and including a channel formed in a portion along the trench gate structure; and
a multilayer region formed in a region between the trench gate structure and the source region in the semiconductor layer, the multilayer region including a second conductivity type impurity region formed in the surface layer portion of the first principal surface of the semiconductor layer and a first conductivity type impurity region formed in a side of the second principal surface of the semiconductor layer with respect to the second conductivity type impurity region.

2. The semiconductor device according to claim 1, wherein the second conductivity type impurity region is in contact with the trench gate structure.

3. The semiconductor device according to claim 1 or 2, wherein the source region is connected to the well region, the second conductivity type impurity region is connected to the source region in a lateral direction parallel to the first principal surface of the semiconductor layer, and the first conductivity type impurity region is connected to the source region in the lateral direction parallel to the first principal surface of the semiconductor layer.

4. The semiconductor device according to claim 1, wherein the first conductivity type impurity region has an extended portion extending in a region below the source region.

5. The semiconductor device according to claim 1, further comprising a source electrode formed at the first principal surface of the semiconductor layer and electrically connected to the source region and the second conductivity type impurity region.

6. The semiconductor device according to claim 1, wherein the source region is exposed from the first principal surface of the semiconductor layer, and
the second conductivity type impurity region is exposed from the first principal surface of the semiconductor layer.

7. The semiconductor device according to claim 1, further comprising a trench source structure including a source trench formed in the surface layer portion of the first principal surface of the semiconductor layer spaced from the trench gate structure and a source electrode embedded in the source trench, wherein
the source region is in contact with the trench source structure.

8. The semiconductor device according to claim 7, wherein the second conductivity type impurity region covers the source region.

9. The semiconductor device according to claim 1, wherein a metal insulator semiconductor field effect transistor (MISFET) including the semiconductor layer, the trench gate structure, and the multilayer region is formed, and
a junction gate field-effect transistor (JFET) including the source region, the well region, and the multilayer region is formed.

10. The semiconductor device according to claim 9, wherein the second conductivity type impurity region forms a gate of the JFET and is set at the same potential as a potential of the well region.

11. The semiconductor device according to claim 1, wherein the trench gate structure extends in a band shape.

12. The semiconductor device according to claim 1, wherein the plurality of trench gate structures extend in band shapes along the same direction and are formed at intervals.

13. The semiconductor device according to claim 1, wherein the multilayer region selectively includes a portion without the first conductivity type impurity region.

14. The semiconductor device according to claim 1, wherein the multilayer region includes a portion with the first conductivity type impurity region and a portion without the first conductivity type impurity region.

15. The semiconductor device according to claim 1, further comprising a drain electrode connected to the second principal surface of the semiconductor layer.

16. The semiconductor device according to claim 1, wherein the semiconductor layer includes a semiconductor substrate and an epitaxial layer formed on the semiconductor substrate.

17. The semiconductor device according to claim 1, wherein the semiconductor layer includes an SiC semiconductor substrate and an SiC epitaxial layer formed on the SiC semiconductor substrate.

* * * * *